(12) United States Patent
Yamazaki et al.

(10) Patent No.: US 9,812,217 B2
(45) Date of Patent: Nov. 7, 2017

(54) DRIVER CIRCUIT, SIGNAL PROCESSING UNIT HAVING THE DRIVER CIRCUIT, METHOD FOR MANUFACTURING THE SIGNAL PROCESSING UNIT, AND DISPLAY DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hideto Ohnuma, Kanagawa (JP); Kei Takahashi, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/091,762

(22) Filed: Apr. 6, 2016

(65) Prior Publication Data

US 2016/0225463 A1 Aug. 4, 2016

Related U.S. Application Data

(63) Continuation of application No. 13/804,945, filed on Mar. 14, 2013, now Pat. No. 9,324,449.

(30) Foreign Application Priority Data

Mar. 28, 2012 (JP) ................................. 2012-074335

(51) Int. Cl.
*H01L 27/108* (2006.01)
*G11C 19/28* (2006.01)
(Continued)

(52) U.S. Cl.
CPC .............. *G11C 19/28* (2013.01); *G09G 3/20* (2013.01); *G09G 5/00* (2013.01); *H01L 21/77* (2013.01);
(Continued)

(58) Field of Classification Search
CPC ......... H01L 21/00; H01L 21/20; H01L 21/84; H01L 21/36; H01L 21/336; H01L 27/108
See application file for complete search history.

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

(Continued)

*Primary Examiner* — Kyoung Lee
(74) *Attorney, Agent, or Firm* — Nixon Peabody LLP; Jeffrey L. Costellia

(57) ABSTRACT

Disclosed is a driver circuit including a latch circuit, a shift register circuit, and a switching circuit, where the latch circuit is provided over the shift register circuit and the switching circuit. The shift register circuit and the switching circuit may have a silicon-based semiconductor, while the latch circuit may have an oxide semiconductor. The latch circuit includes a first transistor and a second transistor connected in series. The latch circuit may further include a first capacitor and a second capacitor which are electrically connected to the first transistor and the second transistor. A display device using the driver circuit as well as a method for preparing the driver circuit is also disclosed.

18 Claims, 24 Drawing Sheets

(51) Int. Cl.
  *G09G 3/20* (2006.01)
  *G09G 5/00* (2006.01)
  *H01L 21/77* (2017.01)
  *H01L 27/12* (2006.01)

(52) U.S. Cl.
  CPC ...... *H01L 27/1203* (2013.01); *H01L 27/1225* (2013.01); *H01L 27/1259* (2013.01); *H01L 27/1266* (2013.01); *G09G 2310/0248* (2013.01); *G09G 2310/0286* (2013.01); *G09G 2310/0289* (2013.01); *G09G 2330/021* (2013.01); *G09G 2380/02* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,123 B2 | 4/2009 | Shirasaki |
| 7,674,650 B2 | 3/2010 | Akimoto et al. |
| 7,732,819 B2 | 6/2010 | Akimoto et al. |
| 7,755,113 B2 | 7/2010 | Yamazaki et al. |
| 7,897,483 B2 | 3/2011 | Yamazaki et al. |
| 7,951,689 B2 | 5/2011 | Akimoto et al. |
| 7,999,800 B2 | 8/2011 | Iwabuchi et al. |
| 8,399,337 B2 | 3/2013 | Akimoto et al. |
| 8,432,187 B2 | 4/2013 | Kato et al. |
| 8,803,781 B2 | 8/2014 | Kimura et al. |
| 8,994,400 B2 | 3/2015 | Kato et al. |
| 9,047,822 B2 | 6/2015 | Iwabuchi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063959 A1* | 3/2007 | Iwabuchi ............ G09G 3/2074 345/100 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0248629 A1 | 10/2008 | Yamazaki |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0175087 A1 | 7/2011 | Yamazaki et al. |
| 2011/0279419 A1 | 11/2011 | Takemura |
| 2013/0045554 A1 | 2/2013 | Yamazaki |
| 2013/0153890 A1 | 6/2013 | Yoneda |
| 2014/0334596 A1 | 11/2014 | Kimura et al. |
| 2015/0200657 A1 | 7/2015 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-287653 A | 10/2002 |
| JP | 2002-289859 A | 10/2002 |
| JP | 2003-086000 A | 3/2003 |
| JP | 2003-086808 A | 3/2003 |
| JP | 2003-255386 A | 9/2003 |
| JP | 2004-103957 A | 4/2004 |

(56) References Cited

FOREIGN PATENT DOCUMENTS

| | | |
|---|---|---|
| JP | 2004-273614 A | 9/2004 |
| JP | 2004-273732 A | 9/2004 |
| JP | 2005-017917 A | 1/2005 |
| JP | 2006-098496 A | 4/2006 |
| JP | 2007-058202 A | 3/2007 |
| JP | 2007-220749 A | 8/2007 |
| JP | 2008-026612 A | 2/2008 |
| JP | 2008-180848 A | 8/2008 |
| JP | 2009-004757 A | 1/2009 |
| JP | 2009-053630 A | 3/2009 |
| JP | 2009-088498 A | 4/2009 |
| JP | 2009-117688 A | 5/2009 |
| JP | 2011-142621 A | 7/2011 |
| WO | WO-2000/008517 | 2/2000 |
| WO | WO-2004/114391 | 12/2004 |
| WO | WO-2007/013646 | 2/2007 |
| WO | WO-2011/070905 | 6/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Techncial Papers, Jul. 2, 2008, pp. 275-278.

Park.S et al., "Challenge to Future Displays: Transparent AM-OLED Driven by Peald Grown ZNO TFT", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Tecnical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID DIGEST '09 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID DIGEST '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW'08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

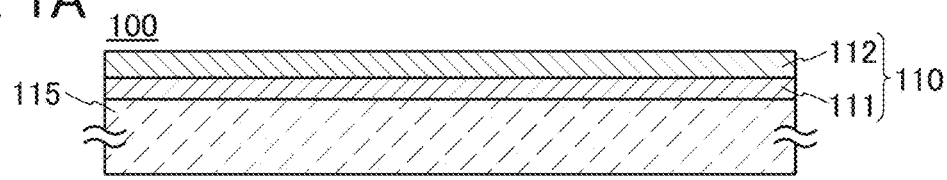
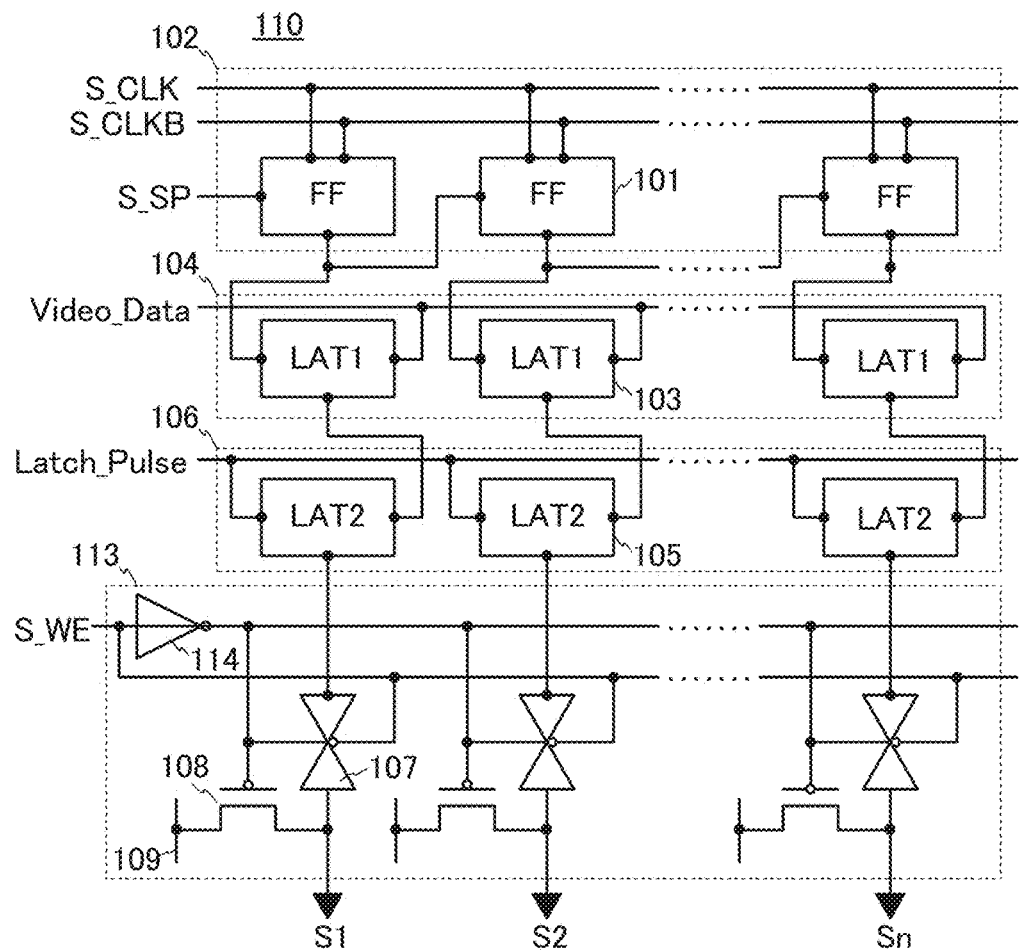
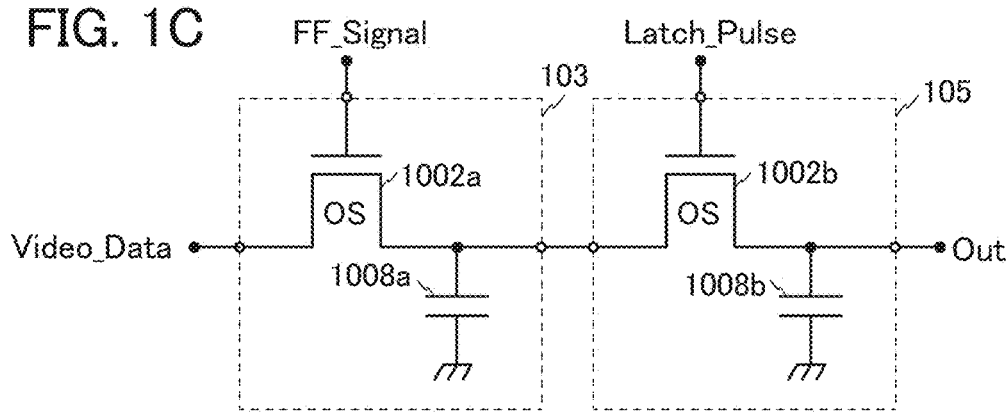

DRIVER CIRCUIT, SIGNAL PROCESSING UNIT HAVING THE DRIVER CIRCUIT, METHOD FOR MANUFACTURING THE SIGNAL PROCESSING UNIT, AND DISPLAY DEVICE

BACKGROUND OF THE INVENTION

1. Field of the Invention

The present invention relates to a semiconductor device, a display device, a light-emitting device, a driving method thereof, or a manufacturing method thereof. The present invention also relates to a driver circuit, a signal processing unit having the driver circuit, a method of manufacturing the signal processing unit, and a display device.

2. Description of the Related Art

Driving methods of display devices such as liquid crystal display devices and electroluminescent (EL) display devices can be broadly classified into a passive matrix method and an active matrix method. An active matrix method has been widely employed for pixel portions of television receivers, cellular phones, and the like because it can achieve low power consumption, high definition, enlargement of substrates, and the like as compared with a passive matrix method.

Along with the increase in size and definition of panels employing active matrix driving, development of performance of driver circuits for controlling driving of pixel portions has been required. For example, a technique has been employed in which a high-performance semiconductor integrated circuit manufactured using a material having very high mobility, such as a single crystal silicon substrate, is mounted, as a driver circuit, on a display device by a chip on glass (COG) method or a tape automated bonding (TAB) method (e.g., see Patent Document 1 for the COG method).

A semiconductor integrated circuit used as a driver circuit is referred to as a signal processing unit, a display signal processing unit, a display driver, or the like in general, but in this specification, referred to as a signal processing unit. Further, a circuit t in the signal processing unit, which relates to driving of a display device, is referred to as a driver circuit.

REFERENCE

Patent Document 1: Japanese Published Patent Application No. 2003-255386

SUMMARY OF THE INVENTION

In recent years, with the widespread use of tablet computers, smartphones, and the like, the definition of pixel portions has been significantly increased and accordingly the power consumption of signal processing units has also been increased. It is known that an important factor for comparing the performances of tablet computers and smartphones is how long they can operate after a single charge (also referred to as operation time, driving time, or the like). Thus, driver circuits included in a signal processing unit have been expected to have lower power consumption.

Further, there have been heavy demands for a display device that can be provided on a curved surface, a display device that can be freely deformed by a stress applied in bending or twisting, and the like, which have motivated intensive research on flexible display devices. However, since the flexibility of a signal processing unit using a single crystal silicon substrate or the like as described above is low, when a stress such as a bend or a twist is applied to the display device, a problem such as peeling of the mounted signal processing unit or a breakdown thereof due to a shock might be caused.

In view of the above problem, an object of the present invention is to provide a driver circuit having low power consumption.

Another object of the present invention is to provide a signal processing unit which includes the above driver circuit, has low power consumption, and hardly causes a breakdown or a separation due to application of a stress.

Another object of the present invention is to provide a method of manufacturing the above signal processing unit.

Another object of the present invention is to provide a display device including the above signal processing unit.

Note that all of the embodiments of the present invention do not need to achieve all the objects. Other objects can be derived from the description of the specification, the drawings, and the claims.

A driver circuit included in a signal processing unit usually includes a shift register circuit, a latch circuit, and a switching circuit. In general, operations of the driver circuit are successively performed for each output line (also referred to as each output stage) as follows: (1) A signal (pulse signal) which determines, among a plurality of output lines connected to the driver circuit, an output line to which data is output is output from a shift register circuit. (2) When the signal from the shift register circuit is input to the latch circuit to which an image signal (also referred to as a video signal, video data, or the like) is input, analog data representing the gray level of the video signal is output. (3) The analog data output from the latch circuit is output to the output line via the switching circuit. Note that the switching circuit may precharge data (also can be referred to as charge) accumulated in the latch circuit.

The latch circuit successively outputs the same data to the switching circuit until a different signal is input from the shift register circuit. Thus, even when sequential output signals are the same as each other without change in the video signal input to the latch circuit (for example, when a still image is displayed), the operation state continues and electric power is consumed.

In view of the above, an embodiment of the present invention is a driver circuit including at least a shift register circuit, a latch circuit, and a switching circuit, where the latch circuit has either of the following structures: (1) a structure including a first input terminal, a second input terminal, an output terminal, a capacitor, and a transistor including an oxide semiconductor film as an active layer (hereinafter, referred to as an OS transistor in some cases); and (2) a structure including a first input terminal, a second input terminal, an output terminal, a transmission gate, an inverter, a clocked inverter, and an OS transistor.

The energy gap of an oxide semiconductor used for a semiconductor layer of the OS transistor is greater than or equal to 3.0 eV, which is much larger than the band gap of silicon (1.1 eV).

The off-resistance of the transistor (resistance between source and drain when the transistor is in an off-state) is inversely proportional to the concentration of carriers thermally excited in the semiconductor layer where a channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1 \times 10^{11}$ cm$^{-3}$.

In contrast, in the case of a semiconductor whose band gap is 3.2 eV (an oxide semiconductor, here), the concentration of thermally excited carriers is approximately $1 \times 10^{-7}$ cm$^{-3}$. When the electron mobility is the same, the resistivity is inversely proportional to the carrier concentration, so that the resistivity of the semiconductor whose band gap is 3.2 eV is 18 orders of magnitude higher than that of silicon.

Such an OS transistor in which an oxide semiconductor having a wide band gap is used for the semiconductor layer can achieve an extremely low off-state current. Accordingly, in the above structures (1) and (2), data (image data) input to the latch circuit can be held even when the latch circuit is off. Thus, particularly when the same data (image data) is successively input to the latch circuit, for example, when a still image or a slow moving image is displayed, the power consumption of the driver circuit can be reduced.

Note that as the latch circuit of an embodiment of the invention, a latch circuit having a configuration illustrated in FIG. 17A, for example, can be formed.

A latch circuit 1000 illustrated in FIG. 17A includes an OS transistor 1002. One of a source and a drain of the transistor 1002 is electrically connected to a first input side (In_1), a gate is electrically connected to a second input side (In_2), and the other of the source and drain is electrically connected to an output side (Out). Note that the following explanation is given assuming that the output side (Out) is in a floating state.

In the latch circuit 1000, when the transistor 1002 is turned off by a signal input from the second input side (In_2), data is held in a node 1003 electrically connected to the other of the source and drain of the transistor 1002 and to the output side (Out).

The OS transistor features an extremely low off-state current (a current flowing between the source and the drain when the transistor is off) in an off state (i.e., the state where the gate voltage is lower than the threshold voltage in the case of an n-channel transistor, or the state where the gate voltage is higher than the threshold voltage in the case of a p-channel transistor). Accordingly, there is no possibility or an extremely small possibility of leakage of the data held in the node 1003 to the one of the source and drain from the other of the source and drain (in FIG. 17A, the heavy line arrow indicates the concept and the x mark indicates no leakage of the data). The data can thus be held in the node 1003.

Hence, in the case where a signal is input to the latch circuit and accumulated in the node 1003 and then a signal next input to the latch circuit is the same as the previously input signal, the previously input signal is held in the node 1003 and output from the latch circuit 1000 even when the transistor 1002 is off (the transistor 1002 is in an non-operation state). Therefore a signal does not necessarily need to be input to the first input side (In_1) or the second input side (In_2). Accordingly, power consumption in the latch circuit can be reduced and low power consumption of the driver circuit can be achieved.

Although one latch circuit is given for easier understanding in the above explanation, a structure using two latch circuits (the latch circuit 1000a and the latch circuit 1000b) connected in series as illustrated in FIG. 17B can be employed.

In this structure, first, a transistor 1002a is turned on by application of a voltage from the second input side (In_2) and data input from the first input side (In_1) is accumulated in a node 1003a. Then, the transistor 1002a is turned off, so that the data is held in the node 1003a.

Next, a transistor 1002b is turned on by application of a voltage from a third output side (In_3) of the transistor 1002b and the data (also referred to as charge) in the node 1003a is accumulated in a node 1003b. Then, the transistor 1002b is turned off, so that the data is held in the node 1003b.

Since the transistors 1002a and 1002b are both OS transistors, leakage of the data held in the node 1003b does not occur as long as the output side (Out) is in a floating state. In addition, because the node 1003a is electrically connected to the other of a source and a drain of the transistor 1002a and one of a source and a drain of the transistor 1002b, leakage of the data held in the node 1003a does not occur. Thus, even when the transistors 1002a and 1002b are turned off, the data held in the node 1003b is output from the output side (Out).

However, in the case of a general latch circuit (i.e., a latch circuit not including an OS transistor as a component), when the same signal is successively input to the latch circuit, an unexpected signal might be output from an output side unless the latch circuit is constantly on (i.e., a transistor included in the latch circuit is constantly on).

In the case of a latch circuit having the above-described structure using an OS transistor, when the same signal is successively input to the latch circuit from the first input side (In_1), once a signal first input is held in the nodes 1003a and 1003b, data output from the output side does not vary even if the latch circuit is off (that is, the transistors 1002a and 1002b are off). Thus, particularly when the same signal is successively input to the latch circuit, power consumption in the latch circuit can be reduced and low power consumption of the driver circuit can be achieved.

Note that the expression "the same signal is successively input" means that the same signal is input successively twice or more.

Further, for transistors included in the shift register circuit and the switching circuit, the use of a single crystal semiconductor film as an active layer enables high-speed operation. In the driver circuit, while a single crystal semiconductor film is used as an active layer in the transistor included in a component that needs to perform high-speed operation, an oxide semiconductor film is used as an active layer at least in a transistor included in the latch circuit, so that the power consumption of the latch circuit can be reduced and the driver circuit can achieve low power consumption particularly when the same signal is successively input to the latch circuit.

In an embodiment of the present invention, the OS transistor included in the latch circuit is provided in a layer different from a layer in which the transistors (transistors each including a single crystal semiconductor film as an active layer) included in the shift register circuit and the switching circuit are provided. Note that hereinafter, a layer including a transistor including a single crystal semiconductor film as an active layer is referred to as a first layer and a layer including an OS transistor is referred to as a second layer. Further, the driver circuit is formed by the first layer and the second layer, and a layer which collectively includes the first layer and the second layer is referred to as a circuit layer.

With the driver circuit having the above structure, low power consumption of the driver circuit can be achieved.

With a structure in which the above-described driver circuit is provided over a flexible substrate, it is possible to provide a signal processing unit which hardly causes a breakdown or a peeling due to a shock or application of a stress in bending or twisting. Note that, in the specification, a flexible substrate is a substrate which can be deformed in accordance with a form of an object to be bonded, and an insulating resin material, a metal material with an insulating surface, and the like can be used as the flexible substrate.

The above signal processing unit included in a circuit layer is bonded to (mounted on) a substrate including a pixel portion, and the driver circuit and the pixel portion are electrically connected to each other to operate the pixel portion (i.e., the driver circuit in the signal processing unit is used as a scan line driver circuit or a signal line driver circuit). Thus a display device having low power consumption can be achieved. In addition, a flexible substrate can be used in the signal processing unit, and accordingly the thickness or weight of the display device can be reduced.

In addition, the substrate including the pixel portion may have flexibility. If a flexible substrate is also used for the signal processing unit, a problem such as a peeling of the mounted signal processing unit or a breakdown of the signal processing unit itself can be prevented.

That is, one embodiment of the present invention is a driver circuit including a latch circuit configured to hold data, a shift register circuit configured to output a signal capable of determining an operation state of the latch circuit, and a switching circuit configured to determine whether a signal output from the latch circuit is output to the outside or not. The latch circuit includes a first input terminal, a second input terminal, an output terminal, and a transistor including an oxide semiconductor film as an active layer. A gate of the transistor is electrically connected to the first input terminal. One of a source and a drain of the transistor is electrically connected to the second input terminal. The other of the source and the drain of the transistor is electrically connected to the output terminal. Data is held in a node electrically connected to the other of the source and the drain of the transistor and to the output terminal, when the transistor is off. A transistor included in the shift register circuit and a transistor included in the switching circuit are each a transistor including a single crystal semiconductor film as an active layer. Note that the latch circuit may further include a capacitor. In this case, the other of the source and the drain of the transistor is electrically connected to one of electrodes of the capacitor, and the other of the electrodes of the capacitor is electrically connected to a wiring to which a fixed potential is supplied.

With the driver circuit having the above structure, the driver circuit can achieve low power consumption.

The structure of the above latch circuit may be as follows. The latch circuit includes a first input terminal, a second input terminal, an output terminal, a transmission gate, an inverter, a clocked inverter, and a transistor including an oxide semiconductor film as an active layer. An input terminal of the transmission gate is electrically connected to the first input terminal, and an output terminal of the transmission gate is electrically connected to an input terminal of the inverter and an output terminal of the clocked inverter. An output terminal of the inverter is electrically connected to one of a source and a drain of the transistor and to the output terminal. The other of the source and the drain of the transistor is electrically connected to an input terminal of the clocked inverter. Data is held in a node electrically connected to the output terminal of the inverter, the one of the source and the drain of the transistor, and the output terminal, when the transistor is turned off. A transistor included in the transmission gate, a transistor included in the inverter, and a transistor included in the clocked inverter may include a single crystal semiconductor film as an active layer.

Another embodiment of the present invention is a signal processing unit including a base substrate and a circuit layer including the above driver circuit over the base substrate. The circuit layer includes at least a first layer in which the transistor including a single crystal semiconductor film as an active layer is formed and a second layer in which the transistor including an oxide semiconductor film as an active layer is formed. Note that, as the base substrate, a flexible substrate can be used.

With the signal processing unit having the above structure, the signal processing unit can achieve low power consumption and hardly causes a breakdown or a peeling due to application of a stress.

As the single crystal semiconductor film included as the active layer of the above transistor, a film obtained by separation of part of a single crystal semiconductor substrate is preferably used. The separation of the film can be performed at a relatively low temperature (e.g., a temperature lower than or equal to 600° C.) and enables a single crystal semiconductor film to be formed even over a large area substrate, which leads to an improvement in the productivity or a cost reduction of the driver circuit and the signal processing unit.

Another embodiment of the present invention is a display device including a substrate, the aforementioned signal processing unit over the substrate, a counter substrate bonded to the substrate with a sealing material, and a display element layer between the substrate and the counter substrate. The driver circuit in the signal processing unit is electrically connected to the pixel portion. The signal processing unit functions as one or both of a scan line driver circuit and a signal line driver circuit.

With the display device having the above structure, the display device can achieve low power consumption. In addition, since the base substrate included in the signal processing unit can be a flexible substrate, the thickness and weight of the display device can be reduced.

By using a flexible substrate for the substrate in the above display device, the display device can achieve low power consumption and hardly causes a breakdown or a peeling due to application of a stress.

When the substrate partly has a depressed portion, the signal processing unit is provided in the depressed portion, and the driver circuit is electrically connected to the pixel portion, so that the display device can be resistant to a shock from the outside and hardly causes a breakdown or a peeling due to application of a stress in bending or twisting. In addition, when the signal processing unit is provided in the depressed portion so that the base substrate covers the driver circuit and that a bottom surface of the base substrate (a surface over which the circuit layer is not formed) is positioned in the same plan as a top surface of the substrate, the display device can be further resistant to a shock from the outside and a breakdown or a peeling due to application of a stress such in bending or twisting.

When the base substrate has a larger area than the circuit layer and the pixel portion is covered with the base substrate, the counter substrate can be eliminated and the manufacturing process of the display device can be simplified.

Another embodiment of the present invention is a method of manufacturing a signal processing unit including a driver circuit including a latch circuit, a shift register circuit, and a switching circuit, which includes the steps of: forming an embrittled region at a predetermined depth of a single crystal semiconductor substrate having an insulating surface by irradiation of one side of the single crystal semiconductor substrate with one or both of a hydrogen ion and a rare gas ion; forming a separation layer over the side of the single crystal semiconductor substrate; bonding a first temporary fixing substrate to the single crystal semiconductor substrate with the separation layer interposed therebetween; subjecting the single crystal semiconductor substrate to heat treatment; providing, over the first temporary fixing substrate, a single crystal semiconductor thin film separated from the single crystal semiconductor substrate along the embrittled region by separating the single crystal semiconductor substrate from the first temporary fixing substrate; forming a transistor by using the single crystal semiconductor film as an active layer to form a first circuit layer including a shift register circuit and a switching circuit; forming the driver circuit over the separation layer over the temporary fixing substrate by forming, over the first circuit layer, a second circuit layer including a latch circuit having a transistor including an oxide semiconductor film as an active layer; bonding a second temporary fixing substrate onto the second circuit layer with use of a temporary fixing material; providing, over the second temporary fixing substrate, the first circuit layer and the second circuit layer separated from the first temporary fixing substrate at the separation layer by separating the second temporary fixing substrate from the first temporary fixing substrate; bonding, with use of a bond material, a flexible base substrate to a side of the first circuit layer where the second temporary fixing substrate is not formed; and providing the driver circuit over the base substrate by separating the second temporary fixing substrate from the base substrate at the temporary fixing material. Note that a boding layer may be formed over the separation layer.

By the above manufacturing method, a signal processing unit which has low power consumption and hardly causes a breakdown or a peeling due to application of a stress can be manufactured.

In the above manufacturing method, the separation layer may be formed over the first temporary fixing substrate. Specifically, an embrittled region may be formed in a single crystal semiconductor substrate having an insulating surface by irradiation of one side of the single crystal semiconductor substrate with one or both of a hydrogen ion and a rare gas ion, and a first temporary fixing substrate whose surface is provided with a separation layer may be bonded to the one side of the single crystal semiconductor substrate so that the one side of the single crystal semiconductor substrate is in contact with the separation layer of the first temporary fixing substrate. By using this method, formation of the insulating film on the surface of the semiconductor substrate, formation of the embrittled region in the semiconductor substrate, and formation of the separation layer over the first temporary fixing substrate can be performed at the same time with different apparatuses, which can shorten the time for manufacturing the signal processing unit.

In the above method of manufacturing a signal processing unit, by using a silicon substrate, a germanium substrate, a silicon germanium substrate, a silicon carbide substrate, a gallium arsenide substrate, or an indium phosphide substrate as the first temporary fixing substrate, electrical characteristics (e.g., mobility) of a semiconductor element including the transistor including a single crystal semiconductor film as an active layer can be improved, which leads to higher performance of the signal processing unit.

In the above method of manufacturing a signal processing unit, by subjecting the separation layer to planarization treatment, it is possible to prevent a problem in which a part of or the whole of the single crystal semiconductor thin film cannot be transferred to the first temporary fixing substrate due to a defect in bonding between the separation layer and the first temporary fixing substrate.

Another embodiment of the present invention is a method of manufacturing a display device, which includes the steps of forming a signal processing unit by the above method and electrically connecting, with a conductive material, the signal processing unit to a pixel portion provided between a substrate and a counter substrate that are bonded to each other with a sealing material.

By the above manufacturing method, a display device that can achieve low power consumption can be manufactured.

In the above method of manufacturing a display device, a substrate whose surface is provided with a depressed portion can be used. When and the driver circuit and the pixel portion are electrically connected in the depressed portion with the use of the conductive material, a display device that can be resistant to a shock from the outside and hardly causes a breakdown or a peeling due to application of a stress in bending or twisting can be manufactured.

The base substrate may be allowed to serve as the counter substrate in addition to as the base substrate included in the signal processing unit, by which the manufacturing process of the display device can be simplified, so that time and cost for manufacturing the display device can be reduced. In the above method of manufacturing a display device, by using a flexible substrate for the substrate included in the display device, a display device that can achieve low power consumption and hardly causes a breakdown or a peeling due to application of a stress can be manufactured.

In an embodiment of the invention, the circuit layer which forms the driver circuit has a stacked layer structure including at least two layers, a first layer including a transistor including a single crystal semiconductor film as an active layer and a second layer including a transistor including an oxide semiconductor film as an active layer. The circuit layer includes a shift register circuit, a latch circuit, and a switching circuit, in which the latch circuit includes the transistor including an oxide semiconductor film as an active layer as a component.

Accordingly, a video signal input to the driver circuit can be held in the latch circuit. When the same signal is successively input to the latch circuit (for example, a still image is displayed), power consumption in the latch circuit can be reduced and the power consumption of the signal processing unit can be reduced particularly effectively.

Note that high-speed driving performance can also be ensured by using the transistor including a single crystal semiconductor film as an active layer as a component included in the circuit layer other than the latch circuit.

Further, when the signal processing unit is formed by using a flexible substrate, a breakdown or a peeling hardly occurs even if the signal processing unit is provided in a portion having a curved surface or even if a stress is applied in a bending or twisting.

BRIEF DESCRIPTION OF THE DRAWINGS

In the accompanying drawings:

FIGS. 1A to 1C illustrate a configuration of a driver circuit included in a circuit layer;

DETAILED DESCRIPTION OF THE INVENTION

Figure 2A:
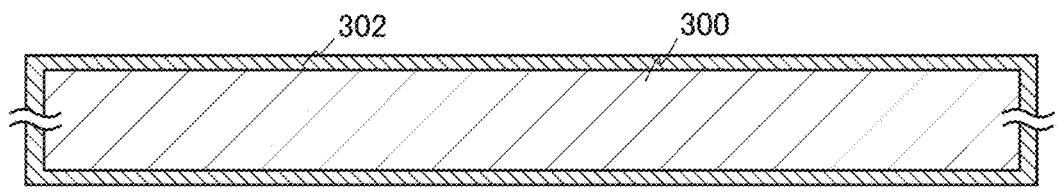
FIGS. 2A to 2D illustrate a method of manufacturing a signal processing unit.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Thus, the present invention should not be construed as being limited to the description in the following embodiments.

In the following embodiments, the same portions or portions having similar functions are denoted by the same reference numerals in different drawings, and explanation thereof will not be repeated.

Note that the position, size, range, and the like of each component illustrated in the drawings and the like are not accurately represented for easy understanding in some cases. Thus, the disclosed invention is not necessarily limited to the position, size, range, and the like in the drawings and the like.

In this specification and the like, ordinal numbers such as "first", "second", and "third" are used in order to avoid confusion among components, and the terms do not limit the components numerically.

In this specification and the like, the term such as "over" or "below" does not necessarily mean that a component is placed "directly on" or "directly under" another component. For example, the expression "B over A" can mean the case where there is an additional component between A and B.

Further, in this specification and the like, the step of moving a film formed over a substrate or part of a substrate to another substrate (i.e., the step of putting part of a film or a substrate formed over a substrate in another place) is referred to as "transfer" or "a transfer step".

Embodiment 1

In this embodiment, a configuration example of a signal processing unit, a circuit configuration example of a driver circuit provided in a circuit layer of the signal processing unit, and a configuration example of a latch circuit included in the driver circuit are described using FIG. 1A, FIG. 1B, and FIG. 1C, respectively. Further, an example of a method of manufacturing the signal processing unit is described using FIGS. 2A to 2D, FIGS. 3A to 3D, FIGS. 4A to 4D, FIGS. 5A and 5B, FIGS. 6A and 6B, FIG. 7, and FIGS. 8A to 8C.

<Structure Example of Driver Circuit>

As illustrated in FIG. 1A, a signal processing unit 100 has a structure in which a circuit layer 110 is formed over a base substrate 115. The circuit layer 110 includes a first layer 111 including a transistor including a single crystal semiconductor film as an active layer and a second layer 112 including a transistor including an oxide semiconductor film as an active layer.

<Configuration Example of Circuit Layer>

FIG. 1B illustrates a circuit configuration example of a driver circuit provided in the circuit layer 110 of the signal processing unit 100. As illustrated in FIG. 1B, the driver circuit provided in the circuit layer 110 includes a shift register circuit 102 including a plurality of (also referred to as plural stages of) flip flops 101, a first latch circuit group 104 including a plurality of (also referred to as plural stages of) first latch circuits 103, a second latch circuit group 106 including a plurality of (also referred to as plural stages of) second latch circuits 105, and a switching circuit 113.

The switching circuit 113 includes an analog switch 107 and a transistor 108 at each stage. The analog switches 107 are connected so that output sides of the stages of the second latch circuit group 106 are connected or disconnected to signal lines S1 to Sn. Further, the transistors 108 electrically connected to the analog switches 107 at the stages are connected so that wirings 109 are connected or disconnected to the signal lines S1 to Sn. Note that a potential to be a non-display signal (e.g., ground potential) input to each pixel is applied to the wiring 109.

Note that the configuration of the switching circuit 113 is not limited to the configuration illustrated in FIG. 1B and may be any configuration as long as either a display signal or a non-display signal is output to the signal lines S1 to Sn.

Figure 17A:
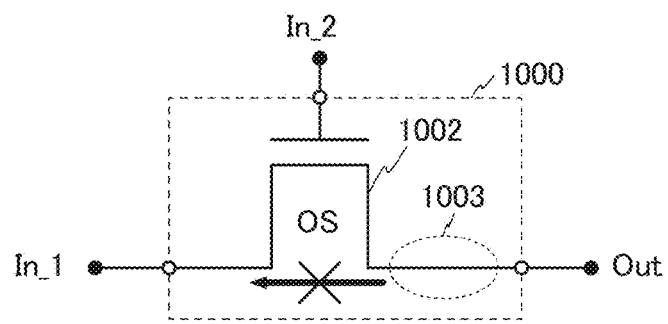
FIGS. 17A and 17B illustrate a configuration and operation concept of a latch circuit.
Figure 17B:
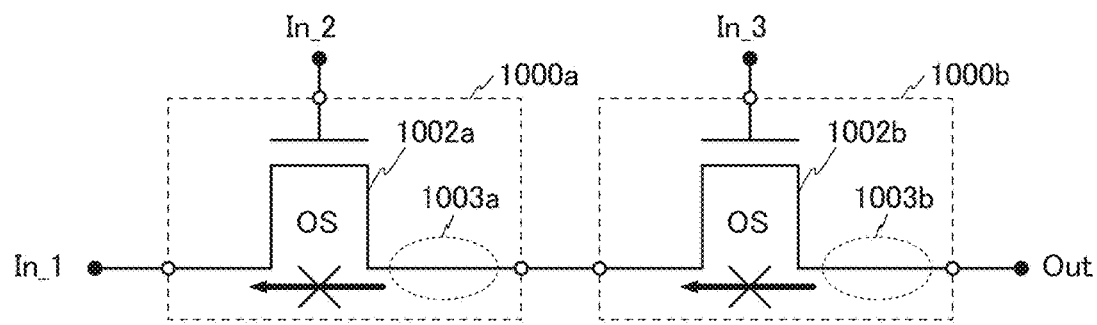

In the above-described driver circuit, for example, a configuration illustrated in FIG. 1C can be employed for the first latch circuit 103 and the second latch circuit 105. This configuration corresponds to a structure in which a capacitor 1008a and a capacitor 1008b are connected to the node 1003a and the node 1008b of FIG. 17B, respectively. One of electrodes of the capacitor 1008a is electrically connected to the other of the source and drain of the transistor 1002*a* and one of the source and drain of the transistor 1002*b*, and the other of the electrodes is connected to a fixed potential (e.g., ground potential). One of electrodes of the capacitor 1008*b* is electrically connected to the other of the source and drain of the transistor 1002*b* and to the output side, and the other of the electrodes is connected to a fixed potential (e.g., ground potential). Note that video data (Video_Data) is input to one of the source and drain of the transistor 1002*a*, and a signal (FF_Signal) from the flip flop 101 is input to a gate of the transistor 1002*a*. A latch pulse (Latch_Pulse) is input to a gate of the transistor 1002*b*, and the output side (Out) of the transistor 1002*b* is electrically connected to the switching circuit 113. Note that the first latch circuit 103 and the second latch circuit 105 can have a structure in which one or both of the capacitors 1008*a* and 1008*b* is not provided.

<Explanation of Operation of Circuit Layer 110>

Next, operation of the driver circuit included in the circuit layer 110 is described using FIG. 1B.

A clock signal (S_CLK), an inverted clock signal (S_CLKB), and a start pulse signal (S_SP) are input to the shift register circuit 102. In accordance with these signals, sampling pulses are sequentially output from the shift register circuit 102.

The sampling pulses output from the shift register circuit 102 are input to the first latch circuit 103, and video signals (Video Data) are held in the first latch circuit 103 in accordance with the timing of the sampling pulse.

After holding of the video signals is completed up to the last stage in the first latch circuit 103, latch pulses are input to the second latch circuit 105 and the video signals held in the first latch circuit 103 in a horizontal retrace period are simultaneously transmitted to the second latch circuit 105.

The video signals transmitted to the second latch circuit 105 are input to the switching circuit 113. A control signal (S_WE) is input to the switching circuit 113. The control signal controls whether the signals held in the second latch circuit 105 or the signal which puts a pixel in a non-displaying state is supplied to the signal lines S1 to Sn. That is, when the control signal (S_WE) is at an H level, a non-display signal is output from the switching circuit 113 to a pixel, whereas when the control signal (S_WE) is at an L level, a video signal is output from the switching circuit 113 to a pixel.

The circuit layer 110 has two latch circuits (the first latch circuit 103 and the second latch circuit 105) at each stage in this embodiment but is not limited to this structure and may have two or more latch circuits at each stage.

The latch circuits described in this embodiment feature the transistor including an oxide semiconductor film as an active layer which is formed in the second layer 112.

<Explanation of Operation of First and Second Latch Circuits>

Operation flow of the first latch circuit 103 and the second latch circuit 105 illustrated in FIG. 1C is briefly described.

First, a signal (FF_Signal) from the flip flop is input to the gate of the transistor 1002*a* included in the first latch circuit 103, and the transistor 1002*a* is turned on by the signal. Accordingly, video data (Video_Data) is accumulated in the capacitor 1008*a* and then the transistor 1002*a* is turned off.

Although the one of the electrodes of the capacitor 1008*a* is connected to the other of the source and drain of the transistor 1002*a* and to the one of the source and drain of the transistor 1002*b*, since the transistors 1002*a* and 1002*b* are OS transistors and feature an extremely low off-state current, there is no possibility or an extremely small possibility of leakage of the data accumulated in the capacitor 1008*a* (leakage through the transistor 1002*a* or the transistor 1002*b*). Thus, the data accumulated in the capacitor 1008*a* continues to be held for a long time; therefore, in the case where, for example, the same signal is successively input to the first latch circuit 103, the transistor 1002*a* can be off once data is held in the capacitor 1008*a*.

Next, a latch pulse (Latch_Pulse) is input to the gate of the transistor 1002*b* in the second latch circuit 105, and the transistor 1002*b* is turned on by the signal. Accordingly, the data held in the capacitor 1008*a* is accumulated in the capacitor 1008*b*, and then the transistor 1002*b* is turned off.

One of the electrodes of the capacitor 1008*b* is connected to the other of the source and drain of the transistor 1002*b* and to the output side. Therefore, by putting the output side in a floating state, leakage of the data accumulated in the capacitor 1008*b* (leakage through the transistor 1002*b* or leakage to the output side) can be suppressed. Accordingly, in the case where, for example, the same signal is successively input to the second latch circuit 105, the transistor 1002*b* can be off once data is held in the capacitor 1008*b*.

Since a general latch circuit itself does not have a function of holding data for a long time, even when the same video data is successively input to the latch circuit, data output from the output side changes unless the latch circuit is on. In contrast, by using the latch circuit having the above-described structure, when the same video data is successively input to the latch circuit, once the data first input is held in the capacitor 1008*a* and the capacitor 1008*b*, data output from the output side does not change even if the first latch circuit 103 and the second latch circuit 105 are turned off (i.e., the signal input from the flip flop 101 or the latch pulse (Latch_Pulse) input to the second latch circuit 105 is stopped). In particular, when the same video data is successively input to the latch circuit, power consumption in the latch circuit can be reduced, and low power consumption of the driver circuit can be achieved.

<Measurements of Off-State Current of OS Transistor>

To demonstrate an "extremely low off-state current" of the OS transistor, measurement results of the off-state current of a transistor including a highly purified oxide semiconductor are described below.

Figure 18:
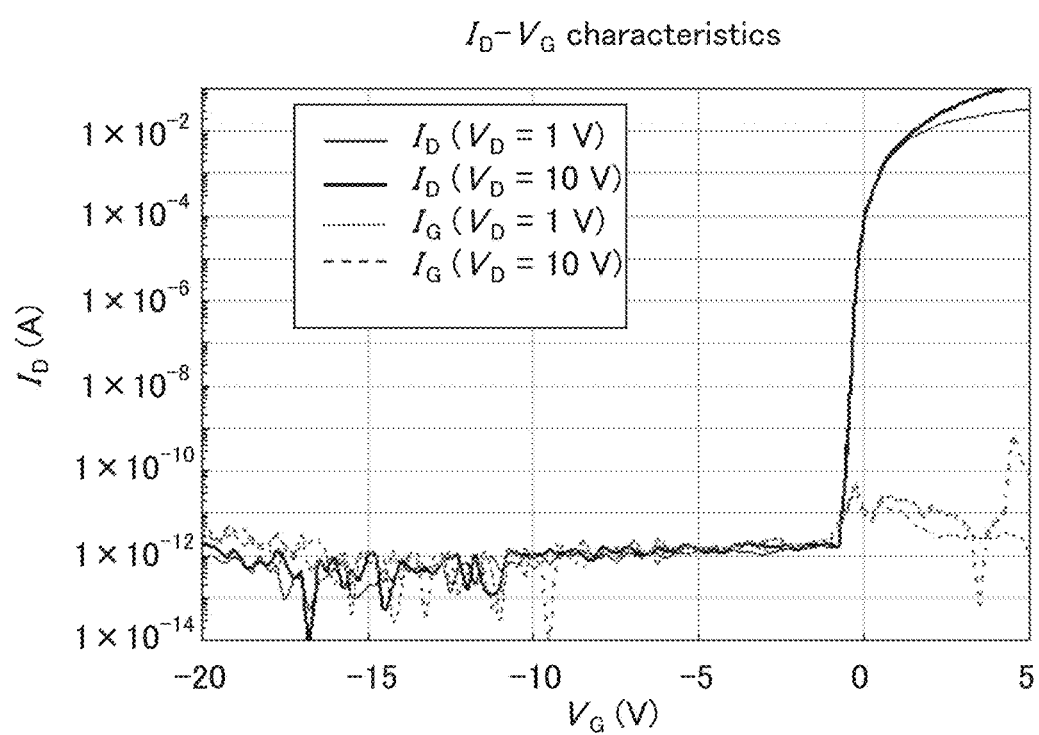
FIG. 18 shows characteristics of a transistor including an oxide semiconductor.

First, in consideration of the very low off-state current of the transistor including a highly purified oxide semiconductor, a transistor with a channel width W of 1 m, which is sufficiently wide, was prepared, and its off-state current was measured. Results are shown in FIG. 18. In FIG. 18, the horizontal axis represents gate voltage $V_G$ and the vertical axis represents drain current $I_D$. In the case where the drain voltage $V_D$ is +1 V or +10 V and the gate voltage $V_G$ is in a range of −5 V to −20 V, the off-state current of the transistor was found to be less than or equal to $1\times10^{-12}$ A, which is the detection limit. Moreover, the off-state current per unit channel width (1 μm) was found to be less than or equal to 1 aA ($1\times10^{-18}$ A).

Next, results obtained by more accurate measurements of the off-state current of the transistor including a highly purified oxide semiconductor are described. As described above, the off-state current of the transistor including a highly purified oxide semiconductor is found to be less than or equal to $1\times10^{-12}$ A, which is the detection limit of the measurement equipment. Hence, an element for evaluation of characteristics was fabricated, and the results obtained by more accurate measurements of its off-state current (the value less than or equal to the detection limit of measurement equipment in the above measurements) are described.

First, the element for evaluation of characteristics which was used in current measurement is described with reference to FIG. 19.

Figure 19:
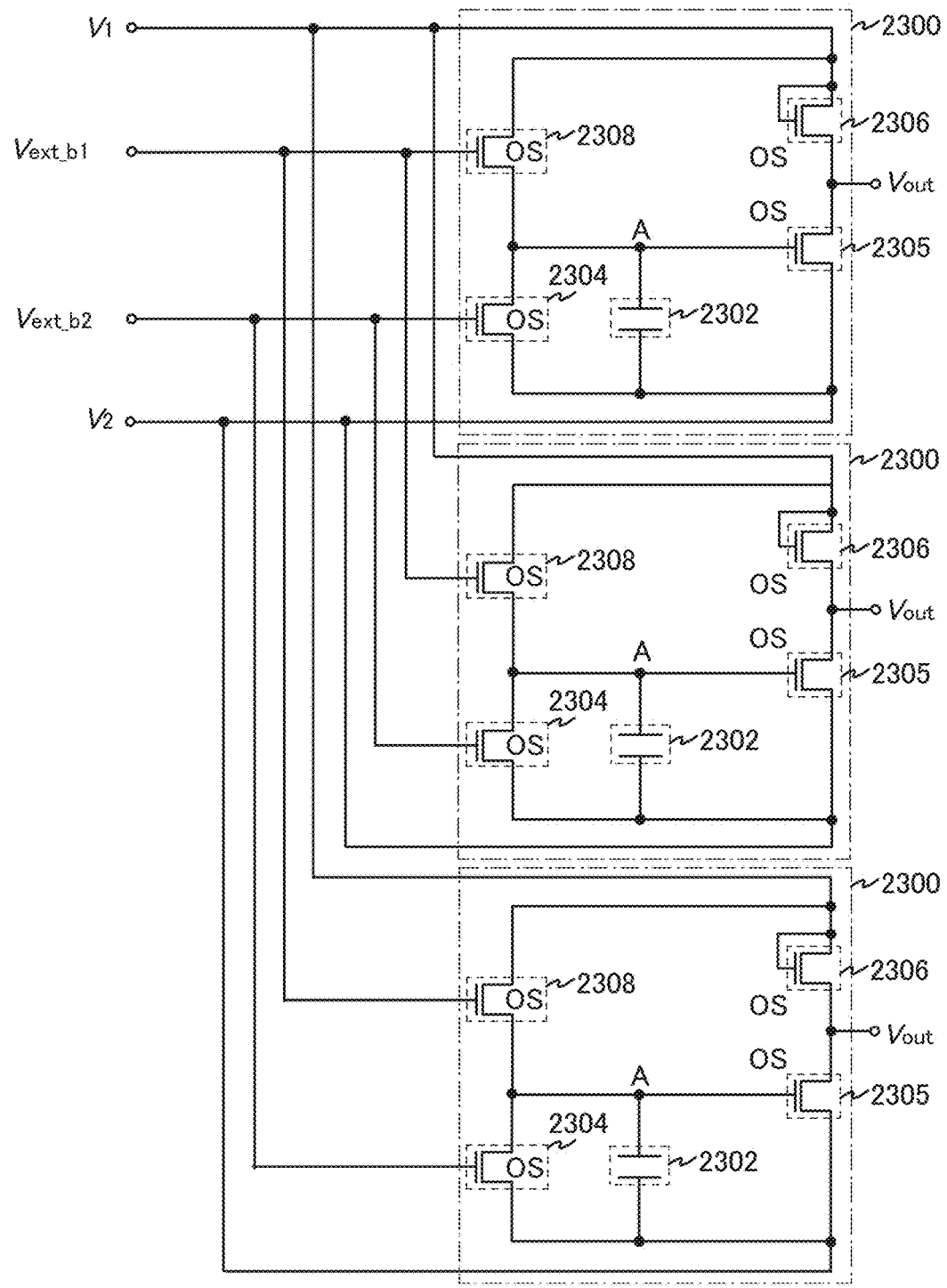
FIG. 19 is a diagram of a circuit for evaluation of characteristics of a transistor including an oxide semiconductor.

In the element for evaluation of characteristics in FIG. 19, three measurement systems 2300 are connected in parallel. The measurement system 2300 includes a capacitor 2302, a transistor 2304, a transistor 2305, a transistor 2306, and a transistor 2308. As the transistor 2304, the transistor 2305, the transistor 2306, and the transistor 2308, transistors including a highly purified oxide semiconductor are employed.

In the measurement system 2300, one of a source terminal and a drain terminal of the transistor 2304, one of terminals of the capacitor 2302, and one of a source terminal and a drain terminal of the transistor 2305 are electrically connected to a power source (for supplying $V_2$). The other of the source terminal and drain terminal of the transistor 2304, one of a source terminal and a drain terminal of the transistor 2308, the other of the terminals of the capacitor 2302, and a gate terminal of the transistor 2305 are electrically connected to one another. The other of the source terminal and drain terminal of the transistor 2308, one of a source terminal and a drain terminal of the transistor 2306, and a gate terminal of the transistor 2306 are electrically connected to a power source (for supplying $V_1$). The other of the source terminal and drain terminal of the transistor 2305 and the other of the source terminal and drain terminal of the transistor 2306 are electrically connected to each other and electrically connected to an output terminal.

A potential $V_{ext\_b2}$ for controlling an on state and an off state of the transistor 2304 is supplied to the gate terminal of the transistor 2304. A potential $V_{ext\_b1}$ for controlling an on state and an off state of the transistor 2308 is supplied to the gate terminal of the transistor 2308. A potential $V_{out}$ is output from the output terminal.

Next, a method of current measurement with the use of the element for evaluation of characteristics is described.

First, an initial period in which a potential difference is applied to measure the off-state current is described briefly. In the initial period, the potential $V_{ext\_b1}$ for turning on the transistor 2308 is input to the gate terminal of the transistor 2308. Accordingly, a potential $V_1$ is supplied to a node A that is electrically connected to the other of the source terminal and drain terminal of the transistor 2304 (that is, the node electrically connected to the one of the source terminal and the drain terminal of the transistor 2308, the other of the terminals of the capacitor 2302, and the gate terminal of the transistor 2305). Here, the potential $V_1$ is, for example, a high potential. The transistor 2304 is off.

After that, a potential $V_{ext\_b1}$ for turning off the transistor 2308 is input to the gate terminal of the transistor 2308 so that the transistor 2308 is turned off. After the transistor 2308 is turned off, the potential $V_1$ is set low. Still, the transistor 2304 is off. The potential $V_2$ is the same potential as $V_1$.

Consequently, the initial period ends. In a state where the initial period ends, a potential difference is generated between the node A and one of the source terminal and the drain terminal of the transistor 2304, and also, a potential difference is generated between the node A and the other of the source terminal and drain terminal of the transistor 2308. Consequently, charge flows slightly through the transistor 2304 and the transistor 2308. That is, the off-state current is generated.

Next, a measurement period of the off-state current is briefly described. In the measurement period, the potential (that is, $V_2$) of the one of the source terminal and the drain terminal of the transistor 2304 and the potential (that is, $V_1$) of the other of the source terminal and drain terminal of the transistor 2308 are kept low. The potential of the node A is not fixed (the node A is in a floating state) in the measurement period. Accordingly, charge flows through the transistor 2304, and the amount of charge stored in the node A changes as time passes. The potential of the node A changes depending on the change in the amount of charge stored in the node A. That is to say, the output potential $V_{out}$ of the output terminal also changes.

Figure 20:
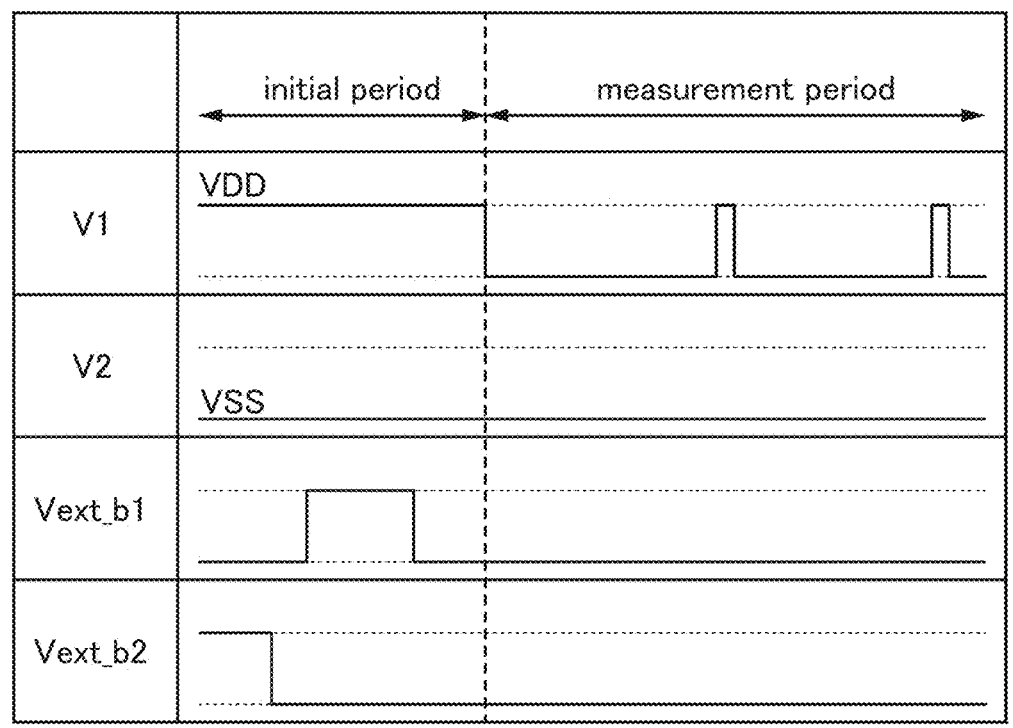
FIG. 20 is a timing chart for evaluation of characteristics of a transistor including an oxide semiconductor.

FIG. 20 shows details (a timing chart) of the relationship among potentials in the initial period in which the potential difference is generated and those in the subsequent measurement period.

In the initial period, first, the potential $V_{ext\_b2}$ is set to a potential (high potential) at which the transistor 2304 is turned on. Accordingly, the potential of the node A comes to be $V_2$, that is, a low potential ($V_{SS}$). Note that a low potential ($V_{SS}$) is not necessarily supplied to the node A. After that, the potential $V_{ext\_b2}$ is set to a potential (low potential) at which the transistor 2304 is turned off, whereby the transistor 2304 is turned off. Next, the potential $V_{ext\_b1}$ is set to a potential (a high potential) with which the transistor 2308 is turned on. Accordingly, the potential of the node A comes to be $V_1$, that is, a high potential ($V_{DD}$). After that, the potential $V_{ext\_b1}$ is set to a potential at which the transistor 2308 is turned off. Accordingly, the node A is brought into a floating state and the initial period ends.

In the following measurement period, the potential $V_1$ and the potential $V_2$ are individually set to potentials at which charge flows to or from the node A. Here, the potential $V_1$ and the potential $V_2$ are low potentials ($V_{SS}$). Note that at the timing of measuring the output potential $V_{out}$, it is necessary to operate an output circuit; therefore, $V_1$ is set to a high potential ($V_{DD}$) temporarily in some cases. The period in which $V_1$ is a high potential ($V_{DD}$) is set short such that the measurements are not affected.

When the potential difference is generated and the measurement period is started as described above, the amount of charge stored in the node A changes as time passes, which causes a change in the potential of the node A. This means that the potential of a gate terminal of the transistor 2305 changes and accordingly, the output potential $V_{out}$ of the output terminal also changes over time.

A method of calculating the off-state current on the basis of the obtained output potential $V_{out}$ is described below.

The relationship between the potential $V_A$ of the node A and the output potential $V_{out}$ is obtained in advance before the off-state current is calculated so that the potential $V_A$ of the node A can be obtained using the output potential $V_{out}$. With the above relationship, the potential $V_A$ of the node A can be expressed as a function of the output potential $V_{out}$ by the following Equation (1).

$$V_A = F(V_{out}) \tag{1}$$

Charge $Q_A$ of the node A can be expressed by the following Equation (2) with the use of the potential $V_A$ of the node A, capacitance $C_A$ connected to the node A, and a constant (const). Here, the capacitance $C_A$ connected to the node A is the sum of the capacitance of the capacitor 2302 and other capacitance.

$$Q_A = C_A V_A + \text{const} \tag{2}$$

Since a current $I_A$ of the node A is obtained by differentiating charge flowing to the node A (or charge flowing from the node A) with respect to time, the current $I_A$ of the node A is expressed by the following Equation (3).

$$I_A = \frac{\Delta Q_A}{\Delta t} = \frac{C_A \cdot \Delta F(V_{out})}{\Delta t} \quad (3)$$

In this manner, the current $I_A$ of the node A can be obtained from the capacitance $C_A$ connected to the node A and the output potential $V_{out}$ of the output terminal.

By the above method, it is possible to measure leakage current (off-state current) which flows between a source and a drain of a transistor in an off state.

The transistor 2304, the transistor 2305, the transistor 2306, and the transistor 2308 each of which has a channel length L of 10 μm and a channel width W of 50 μm were fabricated using a highly purified oxide semiconductor. In the measurement systems 2300 which are arranged in parallel, the capacitances of the capacitors 2302 were set to 100 fF, 1 pF, and 3 pF.

In the measurements in this embodiment, $V_{DD}$ was set to 5 V and $V_{SS}$ was 0 V. In the measurement period, $V_{out}$ was measured while the potential $V_1$ was basically set to $V_{SS}$ and changed to $V_{DD}$ for 100 msec at intervals of 10 sec to 300 sec. Δt which was used in calculation of current I which flows through the element was about 30000 sec.

Figure 21:
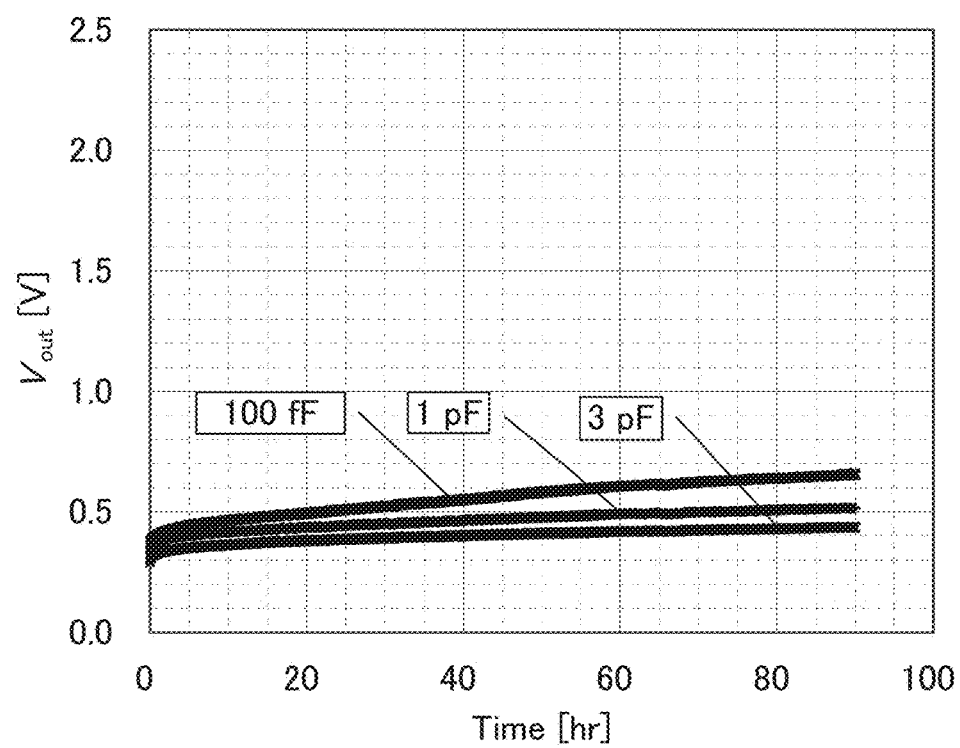
FIG. 21 shows characteristics of a transistor including an oxide semiconductor.

FIG. 21 shows the relationship between the output potential $V_{out}$ and elapsed time Time in the current measurements. As is seen in FIG. 21, the output potential $V_{out}$ changes over time.

Figure 22:
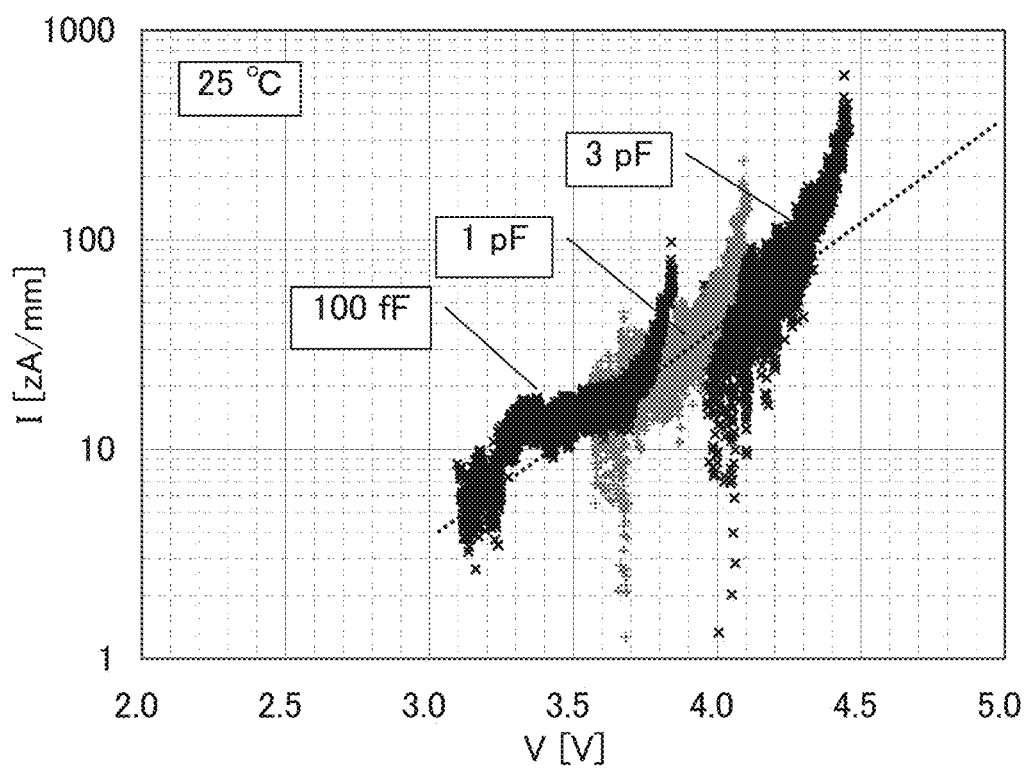
FIG. 22 shows characteristics of a transistor including an oxide semiconductor.

The off-state current at room temperature (25° C.) calculated in the above current measurements is shown in FIG. 22. Note that FIG. 22 shows the relationship between source-drain voltage V and off-state current I. FIG. 22 demonstrates that the off-state current is approximately 40 zA/μm under the condition where the source-drain voltage is 4 V. In addition, the off-state current is less than or equal to 10 zA/μm under the condition where the source-drain voltage is 3.1 V. Note that 1 zA represents $1\times10^{-21}$ A.

Figure 23:
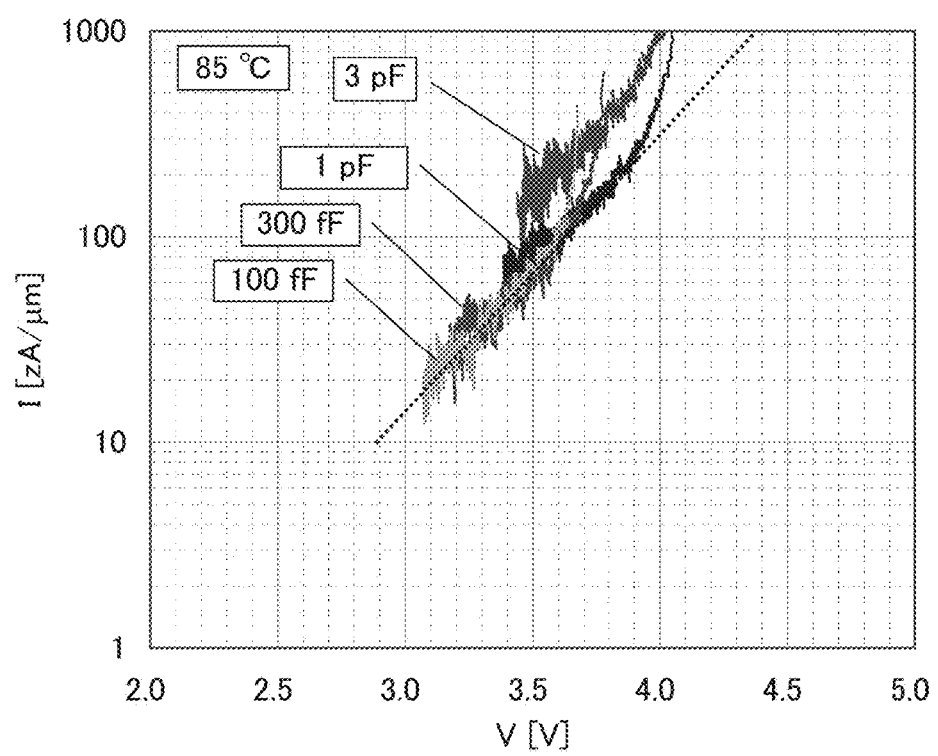
FIG. 23 shows characteristics of a transistor including an oxide semiconductor.

Further, the off-state current at the time when the temperature is 85° C. calculated in the above current measurements is shown in FIG. 23. FIG. 23 shows the relationship between the source-drain voltage V and the off-state current I at the time when the temperature is 85° C. FIG. 23 demonstrates that the off-state current is less than or equal to 100 zA/μm when the source-drain voltage is 3.1 V.

The above results also demonstrate an extremely low off-state current of the transistor including an oxide semiconductor film as an active layer.

<Method of Manufacturing Driver Circuit>

Next, an example of a manufacturing process of the signal processing unit 100 illustrated in FIGS. 1A to 1C is described with reference to FIGS. 2A to 2D, FIGS. 3A to 3D, FIGS. 4A to 4D, FIGS. 5A and 5B, FIGS. 6A and 6B, FIG. 7, and FIGS. 8A to 8C. Note that hereinbelow, a method of forming the circuit layer 110 in the signal processing unit 100 is described and then a method in which the circuit layer is provided over a flexible substrate to fabricate the signal processing unit 100 is described.

<Method of Forming Circuit Layer 110>

First, an example of a formation process of the circuit layer 110 illustrated in FIGS. 1A to 1C is described using FIGS. 2A to 2D, FIGS. 3A to 3D, FIGS. 4A to 4D, FIGS. 5A and 5B, FIGS. 6A and 6B, and FIG. 7. Note that although a variety of elements (e.g., a transistor) are actually formed in the first layer 111 and the second layer 112 in the circuit layer 110, for easier understanding of the formation process in this embodiment, a method of forming the transistor including a single crystal semiconductor film as an active layer is mainly described as a method of forming the first layer and a method of manufacturing the OS transistor is mainly described as a method of manufacturing the second layer. It is needless to say that elements other than such transistors are present in the first layer and the second layer.

<Method of Manufacturing First Layer 111>

First, a semiconductor substrate 300 is prepared and an insulating film 302 is formed on a surface of the substrate (see FIG. 2A).

As the semiconductor substrate 300, it is possible to use a substrate formed of a Group 14 element, such as a single crystal silicon substrate, a single crystal germanium substrate, or a single crystal silicon germanium substrate, for example. Further, a compound semiconductor substrate using gallium nitride, gallium arsenide, indium phosphide, or the like can be used. A commercially-available silicon substrate is typically a circular substrate having a size of 5 inches (125 mm) in diameter, 6 inches (150 mm) in diameter, 8 inches (100 mm) in diameter, 12 inches (300 mm) in diameter, and 16 inches (700 mm) in diameter. The shape of the semiconductor substrate 300 is not limited to a circular shape, and the semiconductor substrate 300 may be a substrate that is processed into a rectangular shape, a square shape, or the like, for example. The semiconductor substrate 300 can be formed by the Czochralski (CZ) method or the floating zone (FZ) method.

In this embodiment, a single crystal silicon substrate is used as the semiconductor substrate 300.

The insulating film 302 may be formed with a single layer of a silicon oxide film, a silicon oxynitride film, or the like, or a stacked layer of any of these films, for example. As a method of forming the film, a thermal oxidation method, a CVD method, a sputtering method, or the like can be used. When the insulating film 302 is formed by a CVD method, a silicon oxide film is preferably formed using an organosilane such as tetraethoxysilane (abbreviation: TEOS, chemical equation: $Si(OC_2H_5)_4$) in order to obtain favorable bonding to another substrate performed later.

Note that in the case where the insulating film 302 is formed by thermal oxidation treatment, the thermal oxidation treatment is preferably performed in an oxidizing atmosphere to which halogen is added. For example, by performing a thermal oxidation treatment on the semiconductor substrate 300 in an oxidizing atmosphere to which chlorine (Cl) is added, the insulating film 302 can be formed through chlorine oxidation. In this case, the insulating film 302 is a film containing chlorine atoms. Such chlorine oxidation prevents impurities such as Na from entering the semiconductor substrate 300 from the first temporary fixing substrate 314 which is bonded to the semiconductor substrate 300 in a later process, by which contamination of the semiconductor substrate 300 can be prevented. Note that the halogen atoms contained in the insulating film 302 are not limited to chlorine atoms. The insulating film 302 may contain fluorine atoms.

It is preferable that the surface of the semiconductor substrate 300 be cleaned with hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, ozone water, and pure water (FPM), or the like before forming the insulating film 302.

Figure 2B:
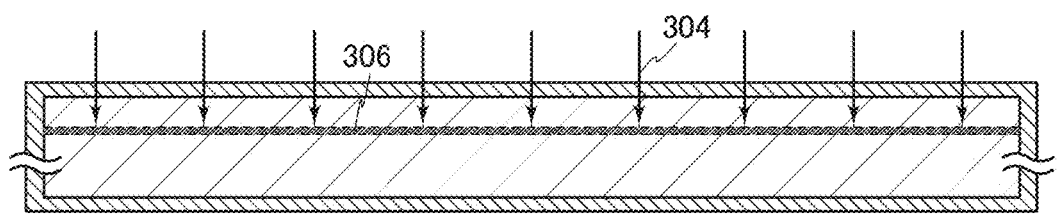

Then, an ion irradiation treatment 304 is performed from a surface of the semiconductor substrate 300, so that an embrittled region 306 is formed in the semiconductor substrate 300 (see FIG. 2B).

Hydrogen ions can be used for ion species for the irradiation. The hydrogen ions refer to a mixture of one or more kinds of ions selected from $H^+$, $H_2^+$, and $H_3^+$. When irradiation with accelerated hydrogen ions is performed, the proportion of $H_3^+$ is preferably set high. Specifically, it is preferable that the proportion of $H_3^+$ in the total amount of $H^+$, $H_2^+$, and $H_3^+$ is set 50% or higher (more preferably, 80% or higher). With a high proportion of $H_3^+$, the efficiency of ion irradiation can be improved. Further, rare gas ions can be used as well as hydrogen ions. Specifically, He ions, Ne ions, Ar ions, Kr ions, and Xe ions can be used.

The depth at which the embrittled region 306 is formed can be controlled by the kinetic energy, mass, charge, or incidence angle of the ions for the irradiation, or the like. The embrittled region 306 is formed at approximately the same depth as the average penetration depth of the ions. Thus, by adjusting the kind of ion species for the irradiation and the condition of the irradiation, the thickness of a semiconductor thin film 316 to be separated from the semiconductor substrate 300 in a later process can be adjusted.

The thickness of the semiconductor thin film 316 is not particularly limited, but is preferably greater than or equal to 1 nm and less than or equal to 200 nm, more preferably greater than or equal to 3 nm and less than or equal to 100 nm because in the case where the separated semiconductor thin film 316 having too large thickness is used for forming a high performance semiconductor integrated circuit, the transistor might cause an increase in S value or might be normally on, for example. Accordingly, the average penetration depth of the ions for the irradiation is preferably adjusted so that the depth at which the embrittled region 306 is formed in the semiconductor substrate 300 is greater than or equal to 1 nm and less than or equal to 200 nm, more preferably greater than or equal to 3 nm and less than or equal to 100 nm.

The ion irradiation treatment 304 can be performed with an ion doping apparatus or an ion implantation apparatus. With an ion implantation apparatus, ion species in plasma are subjected to mass separation, and a semiconductor substrate can be irradiated with only ion species having a certain mass, so that entry of impurities which affect the characteristics of a transistor can be reduced. Thus, an ion implantation apparatus is especially preferable.

However, even when the ion irradiation treatment 304 is performed with the use of an ion doping apparatus, substances which affect the characteristics of a transistor (e.g., heavy metal) can be trapped by performing the ion irradiation treatment 304 through the insulating film 302.

Figure 2C:
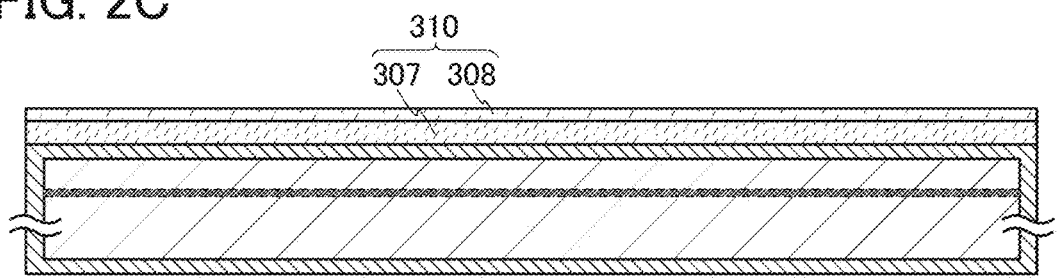

Next, a separation layer 310 is formed over the insulating film 302 close to the side on which the embrittled region 306 is formed (see FIG. 2C). The separation layer 310 may be a single layer or stacked layers. Note that the separation layer 310 illustrated in FIG. 2C has a stacked layer structure including a first separation layer 307 and a second separation layer 308.

The separation layer is formed to have a single-layer structure or a stacked layer structure by using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); or an alloy or a compound containing any of the elements as its main component by a sputtering method, a plasma CVD method, a coating method, a printing method, or the like.

When the separation layer 310 has a single-layer structure, a tungsten film, a molybdenum film, or a film containing a mixture of tungsten and molybdenum is preferably formed. A film containing an oxide of tungsten or a film containing an oxynitride of tungsten may be formed. A film containing an oxide of molybdenum or a film containing an oxynitride of molybdenum may be formed. A film containing an oxide or oxynitride of a mixture of tungsten and molybdenum may be formed. Note that the mixture of tungsten and molybdenum corresponds to an alloy of tungsten and molybdenum.

When the separation layer 310 has a stacked layer structure, preferably, a metal film is formed as the first separation layer 307 and a metal oxide film is formed as the second separation layer 308. Typically, a film including tungsten, a film including molybdenum, or a film including a mixture of tungsten and molybdenum is formed as the first separation layer 307 and an oxide film or an oxynitride film of a film including tungsten, a film including molybdenum, or a film including a mixture of tungsten and molybdenum is formed as the second separation layer 308.

Figure 2D:
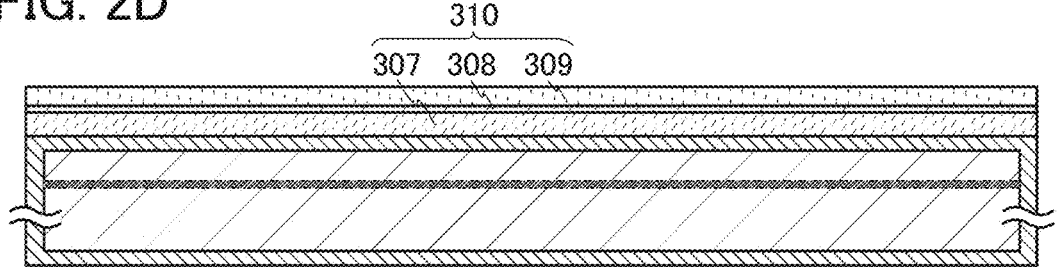

The second separation layer 308 may be formed as follows: the first separation layer 307 is formed as a metal film, and an oxide film 309 is formed over the first separation layer 307, by which a surface of the first separation layer 307 is oxidized to result in the second separation layer 308 as a metal oxide layer. In this case, the separation layer 310 has a stacked layer structure of the first separation layer 307, the second separation layer 308, and the oxide film 309 as illustrated in FIG. 2D. For example, in the case where a tungsten film is formed as the first separation layer 307 and, over the film, a silicon oxide film is formed as the oxide film 309, the tungsten film is oxidized in the vicinity of an interface with the silicon oxide film and a film including tungsten oxide is formed as the second separation layer 308.

The second separation layer 308 which is a metal oxide film may be formed by subjecting a surface of the first separation layer 307 to thermal oxidation treatment, oxygen plasma treatment, $N_2O$ plasma treatment, UV ozone treatment, treatment with a solution having strong oxidizing power such as ozone water, or the like.

Alternatively, as the separation layer 310, a metal film and a metal oxynitride film may be formed as the first separation layer 307 and the second separation layer 308, respectively. Typically, a film including tungsten is formed as the first separation layer 307 and a tungsten oxynitride film is formed as the second separation layer 308. The metal oxynitride film is more easily separated with a higher proportion of oxygen, while the metal oxynitride film has more difficulty in being separated with a higher proportion of nitrogen. Hence, the proportion of oxygen and nitrogen in the film can be determined as appropriate considering a stress (e.g., stress application or heating) applied to the separation layer 310 in a later process.

In this embodiment, a 30-nm-thick tungsten film formed by a sputtering method is used as the first separation layer 307 and, over the film, a 100-nm-thick silicon oxide film is formed by a sputtering method and used as the oxide film 309. Consequently, as illustrated in FIG. 2D, the separation layer 310 has a structure in which tungsten oxide serving as the second separation layer 308 is formed in the vicinity of a surface of the first separation layer 307 which faces the oxide film 309. Note that in FIG. 2D and the subsequent figures, a layer including the first separation layer 307, the second separation layer 308, and the oxide film 309 is referred to as the separation layer 310.

Note that a bonding layer may be formed over the separation layer 310 in order to increase the adhesion with a first temporary fixing substrate 314 to be bonded to the separation layer 310 in a later process. The bonding layer preferably has a highly flat surface and uses a material capable of forming a hydrophilic surface. As the bonding layer, a silicon oxide film is suitable. In particular, a silicon oxide film formed by a chemical vapor deposition method using a silane-based gas such as a silane gas, a disilane gas, a trisilane gas, or an organosilane gas, is preferable. When the silane gas is used, a gas which is mixed with nitrogen dioxide or dinitrogen monoxide is preferably used. Examples of the organosilane gas include silicon-containing compounds, such as tetraethyl orthosilicate (TEOS, chemical equation: $Si(OC_2H_5)_4$), trimethylsilane (TMS, chemical equation: $(CH_3)_3SiH$), tetramethylcyclotetrasiloxane (TMCTS), octamethylcyclotetrasiloxane (OMCTS), hexamethyldisilazane (HMDS), triethoxysilane (chemical equation: $SiH(OC_2H_5)_3$), or trisdimethylaminosilane (chemical equation: $SiH(N(CH_3)_2)_3$). As a chemical vapor deposition method, plasma CVD, thermal CVD, or photo CVD may be used.

Regarding the above-given term "hydrophilic", when a liquid (e.g., water) dropped onto a surface gives a contact angle between the dropped liquid and the surface of less than or equal to 30°, the surface is a hydrophilic surface. The contact angle is preferably less than 10° (in this case, the term superhydrophilic or the like is used).

The bonding layer having a highly flat surface with hydrophilicity is provided to a thickness of from 5 nm to 500 nm. The bonding layer having such a thickness can reduce the influence caused by the rough surface of the separation layer. In addition, it is possible to reduce distortion between the first temporary fixing substrate to be bonded later and the substrate.

After the bonding layer is formed, the surface of the bonding layer is preferably subjected to planarization treatment. As the planarization treatment, reverse sputtering treatment, dry etching treatment, chemical mechanical polishing (CMP) treatment, or the like can be used. The "reverse sputtering treatment" here refers to a method in which, without application of a voltage to a target side, RF power is applied to a substrate side in an argon atmosphere to generate plasma in the vicinity of the substrate and modify and planarize a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

Figure 3A:
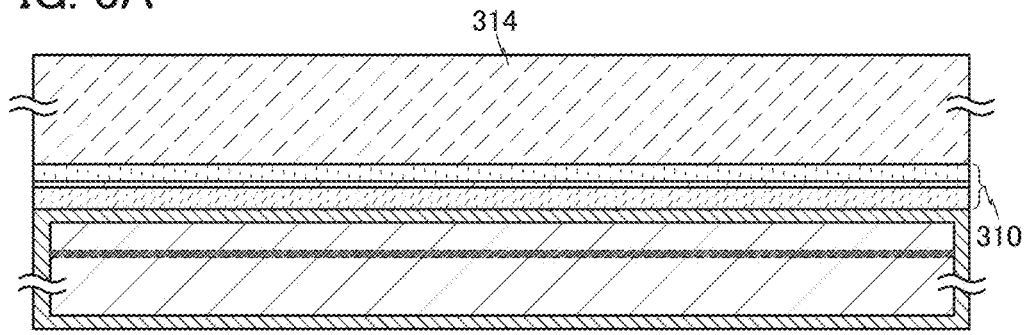
FIGS. 3A to 3D illustrate a method of manufacturing a signal processing unit.
Figure 3B:
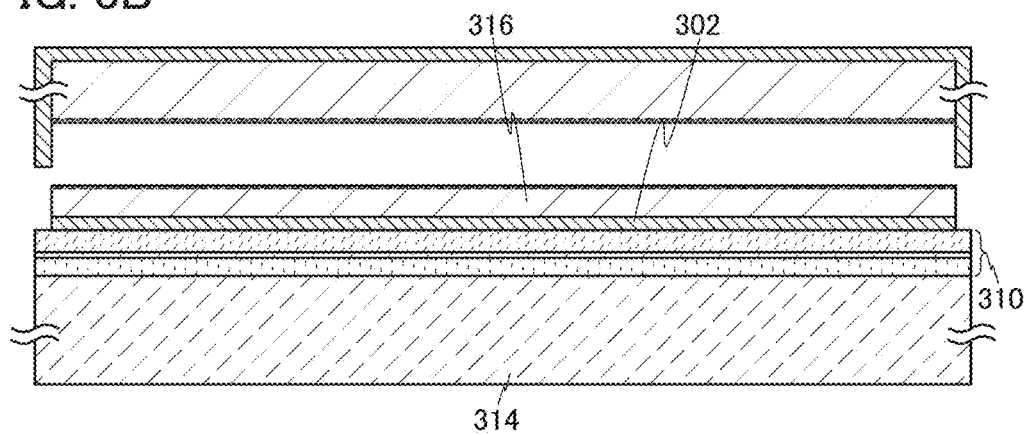
Figure 3C:
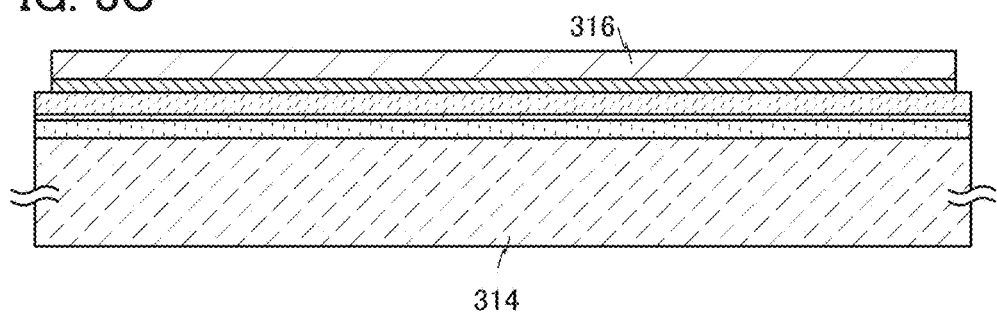
Figure 3D:
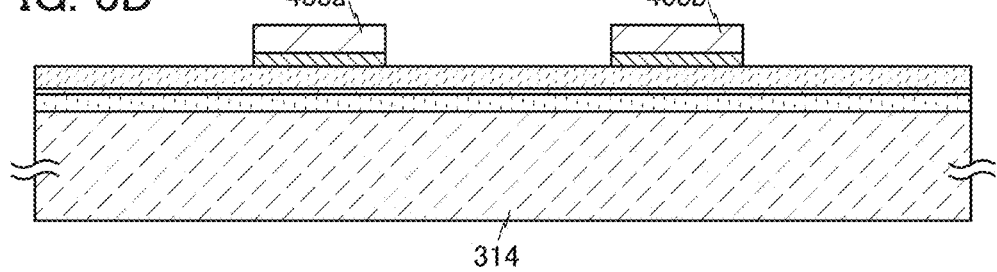

Next, the first temporary fixing substrate 314 is prepared and bonded to the side of the semiconductor substrate 300 where the separation layer 310 is formed (see FIG. 3A).

As the first temporary fixing substrate 314, a polycrystalline semiconductor substrate or a single crystal semiconductor substrate can be used. As the polycrystalline semiconductor substrate or the single crystal semiconductor substrate, for example, a semiconductor substrate that is formed of an element which belongs to the Group 14, such as a polycrystalline or single crystal silicon substrate, a polycrystalline or single crystal germanium substrate, a polycrystalline or single crystal silicon germanium substrate, or a polycrystalline or single crystal silicon carbide substrate, a polycrystalline or single crystal compound semiconductor substrate using gallium arsenide, indium phosphide, or the like can be given. Typical examples of silicon substrates are circular silicon substrates which are 5 inches (125 mm) in diameter, 6 inches (150 mm) in diameter, 8 inches (200 mm) in diameter, and 12 inches (300 mm) in diameter. Note that the shape is not limited to the circular shape, and a substrate processed into a rectangular shape or the like can also be used. In this embodiment, a silicon substrate processed into a square shape is used as the first temporary fixing substrate 314.

As the first temporary fixing substrate 314, a substrate formed of an insulator can also be used. For example, a variety of glass substrates for electronic industry such as aluminosilicate glass, aluminoborosilicate glass, and barium borosilicate glass, a natural quartz substrate, a synthetic quartz substrate, or the like can be used. A metal substrate can also be used as the first temporary fixing substrate 314.

Because the circuit layer 110 functioning as the driver circuit is formed over the first temporary fixing substrate 314 in a later process, a substrate that can be tolerant to a patterning process at submicrometer levels is preferably used as the first temporary fixing substrate 314. Among the above-mentioned materials for the first temporary fixing substrate, for example, a single crystal silicon substrate is more flat and less undulated over a wide range than a substrate formed of an insulator or a metal substrate.

Note that a surface of the first temporary fixing substrate 314 is preferably cleaned in advance by the cleaning methods similar to those for the semiconductor substrate 300. Such cleaning treatment can improve the flatness of the surface of the first temporary fixing substrate 314 and remove particles or organic materials on the surface of the first temporary fixing substrate 314. This can increase adhesion between the separation layer 310 and the first temporary fixing substrate 314 (adhesion between the bonding layer and the first temporary fixing substrate 314 when the bonding layer is formed over the separation layer 310) and prevent a failure in transfer (e.g., the semiconductor thin film cannot be separated from the semiconductor substrate 300 or the separated semiconductor thin film does not adhere to the first temporary fixing substrate 314).

Before the semiconductor substrate 300 and the first temporary fixing substrate 314 are bonded to each other, surfaces to be bonded are preferably subjected to cleaning treatment. As the cleaning treatment, wet treatment, dry treatment, or a combination of wet treatment and dry treatment can be used. Alternatively, wet treatment may be used in combination with different wet treatment or dry treatment may be used in combination with different dry treatment.

The intensity of bonding between the separation layer 310 and the first temporary fixing substrate 314 (between the bonding layer and the first temporary fixing substrate 314 when the bonding layer is formed over the separation layer 310) largely depends on surface attractive force (so-called van der Waals force); therefore, the intensity of the bonding can be increased by making the surfaces to be bonded hydrophilic by forming hydroxyl groups thereon. As hydrophilicity treatment, for example, any one of or a combination of two or more of oxygen plasma treatment, $N_2$ plasma treatment, Ar plasma treatment, ozone treatment, UV ozone treatment, and ozone water treatment can be performed.

Before and after the bonding, heat treatment may be performed in order to increase the intensity of bonding between the separation layer 310 (the bonding layer when the bonding layer is formed over the separation layer 310) and the first temporary fixing substrate 314. In the heat treatment performed before the bonding, the semiconductor substrate 300 and the first temporary fixing substrate 314 are bonded to each other while the semiconductor substrate 300 is heated at a temperature greater than or equal to 50° C. and less than 150° C. In the heat treatment performed after the bonding, the semiconductor substrate 300 may be heated at a temperature at which separation (also referred to as a cleavage phenomenon) does not occur at the embrittled region 306; for example, the semiconductor substrate 300 is heated at a temperature greater than or equal to 100° C. and less than 400° C. The above heat treatment can be performed using as a resistance heating furnace, a rapid thermal annealing (RTA) apparatus, a microwave heating apparatus, or the like.

Next, the semiconductor substrate 300 to which the first temporary fixing substrate 314 is bonded is subjected to heat treatment in order to perform the transfer process. The heat treatment leads to a volume change of the embrittled region 306 (e.g., voltage change of the ions (either or both of hydrogen ions or rare gas ions) or molecules of the ions in the embrittled region 306, which are added to the semiconductor substrate 300 by the ion irradiation treatment 304), which results in cleavage in the embrittled region 306. Note that the heat treatment is preferably performed at a temperature from 400° C. to the upper temperature limit of the substrate whose upper temperature limit is lower (the semiconductor substrate 300 or the first temporary fixing substrate 314), for example, at a temperature from 400° C. to 600° C. After that, the semiconductor substrate 300 is separated from the first temporary fixing substrate 314, so that the semiconductor thin film 316, which is separated from the semiconductor substrate 300 at the embrittled region 306 as the cleavage plane, is transferred onto the first temporary fixing substrate 314 through the insulating film 302 and the separation layer 310 (see FIG. 3B).

Note that a method different from the method in this embodiment is described in Embodiment 2.

The above heat treatment for separating the semiconductor thin film 316 is not necessarily needed. For example, the following method may be used: a stress is applied to the embrittled region 306 (e.g., by cutting the embrittled region 306 with a thin edged tool in the direction parallel to the embrittled region 306 is formed) so that the semiconductor thin film 316 is mechanically separated from the semiconductor substrate 300. The above mechanical separation method performed at the same time as the heat treatment allows the semiconductor thin film 316 to be separated from the semiconductor substrate 300 even at a temperature less than 400° C.

The semiconductor thin film 316 provided over the first temporary fixing substrate 314 by the above process may include part of the embrittled region 306 in its surface. The embrittled region 306 may include more defect regions than the semiconductor substrate 300. In addition, since the surface of the semiconductor thin film 316 corresponds to the embrittled region 306 which is subjected to ion irradiation, the surface flatness may be low. For these reasons, the semiconductor thin film 316 separated from the semiconductor substrate 300 is preferably subjected to treatment for removing the embrittled region 306 and planarizing the surface. As a method of the treatment, chemical mechanical polishing (CMP) treatment, a dry etching method, reverse sputtering treatment, or the like can be used. This leads to the structure illustrated in FIG. 3C, in which the embrittled region 306 is removed. Alternatively, the surface of the semiconductor thin film 316 may be planarized by being irradiated with laser light so that the surface of the semiconductor thin film 316 is melted.

Next, a semiconductor element is formed using the semiconductor thin film 316. Note that in this embodiment, as an example, a method of manufacturing an n-channel transistor and a p-channel transistor each using the semiconductor thin film 316 as an active layer is described. It is needless to say that the semiconductor element using the semiconductor thin film 316 is not limited to the pair of n-channel transistor and p-channel transistor.

First, a resist mask is formed over the semiconductor thin film 316 by a photolithography method, a printing method, an inkjet method, or the like, and part of the semiconductor thin film 316 and part of the insulating film 302 are selectively removed using the resist mask, whereby an island-shaped semiconductor film 400a and an island-shaped semiconductor film 400b are formed, and then the resist mask is removed. Then, if necessary, a minute amount of an impurity is added to the island-shaped semiconductor films to control the threshold voltage (so-called channel doping). In order to obtain the desired threshold voltage, an impurity imparting n-type or p-type conductivity (such as phosphorus or boron) is added by an ion doping method or the like. Note that in the description in this embodiment, the semiconductor film 400a is used for the n-channel transistor and the semiconductor film 400b is used for the p-channel transistor.

An element that belongs to the Group 15, such as phosphorus (P) or arsenic (As), can be used as the impurity element imparting n-type conductivity, and the element can be added to the semiconductor film 400a by an ion implantation method, an ion doping method, a plasma immersion ion implantation method, or the like. An element that belongs to the Group 13, such as boron (B), aluminum (Al), or gallium (Ga), can be used as the impurity element imparting p-type conductivity, and the element can be added to the semiconductor film 400b by any of the above methods. Note that a suitable condition can be selected as appropriate to determine the amount of the impurity elements to be added considering necessary properties of the transistors.

Figure 4A:
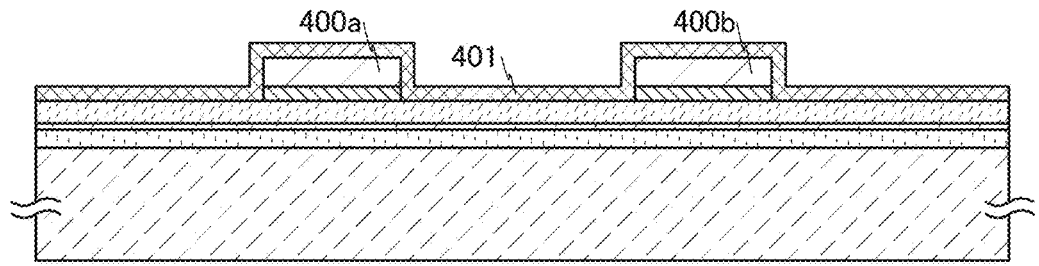
FIGS. 4A to 4D illustrate a method of manufacturing a signal processing unit.
Figure 4B:
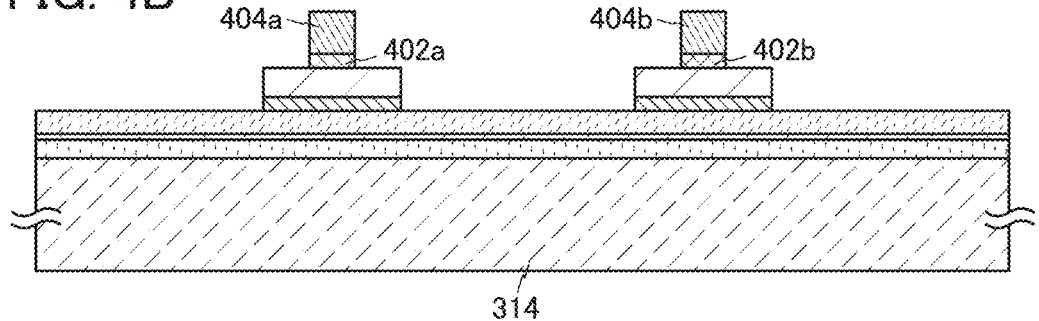

Next, an insulating film 401 covering the semiconductor film 400a and the semiconductor film 400b is formed (see FIG. 4A). Since the semiconductor film 400a and the semiconductor film 400b in this embodiment are highly flat, even when the insulating film 401 is a thin film, a defect due to the unevenness of the semiconductor films (i.e., the roughness of a surface or a side of the semiconductor films) is not generated. Thus, a property defect due to insufficient coverage with the insulating film 401 can be prevented, which enables high-yield manufacture of a highly reliable semiconductor element. Note that as the insulating film 401 is thinner, the transistor can be driven at higher speed with lower voltage.

The insulating film 401 can be formed by a physical vapor deposition (PVD) method such as a vacuum deposition method or a sputtering method, or a chemical vapor deposition (CVD) method such as a plasma CVD method to have a single-layer structure or a stacked layer structure of a silicon oxide film, a silicon oxynitride film, a silicon nitride film, a silicon nitride oxide film, an aluminum oxide film, an aluminum oxynitride film, an aluminum nitride oxide film, an aluminum nitride film, or the like. Note that in this specification, a "silicon oxynitride film" refers to a film that includes more oxygen than nitrogen, and a "silicon nitride oxide film" refers to a film that includes more nitrogen than oxygen. In this embodiment, the insulating film 401 is formed by plasma treatment because a film formed by plasma treatment is dense and has high withstand voltage and excellent reliability.

Alternatively, the insulating film 401 may be formed by oxidation or nitridation of the surfaces of the semiconductor films 400a and 400b. For example, the oxidation or nitridation is carried out by using nitrous oxide ($N_2O$) diluted with Ar by 1 time to 3 times (flow rate ratio) while generating plasma by application of a microwave (2.45 GHz) power of 3 kW to 5 kW to an electrode at a pressure of 10 Pa to 30 Pa. By this treatment, an insulating film having a thickness of 1 nm to 30 nm (preferably 2 nm to 20 nm) is formed. Further, this process may be followed by the formation of a silicon oxynitride film with a vapor deposition method which is conducted in nitrous oxide ($N_2O$) and silane ($SiH_4$) under application of a microwave (2.45 GHz) power of 3 kW to 5 kW to an electrode at a pressure of 10 Pa to 30 Pa. With a combination of solid-phase reaction and vapor deposition, the insulating film 401 is able to have low interface state density and high withstand voltage can be formed. Note that the insulating film 401 functions as a gate insulating film.

As a material for the insulating film 401, a high dielectric constant material (also referred to as a high-k material, for example) such as zirconium dioxide, hafnium oxide, titanium dioxide, or tantalum pentoxide may be used. The use of a high dielectric constant material for the insulating film 401 enables a reduction in the gate leakage current of a gate insulating film 402a and a gate insulating film 402b formed in a later process.

In this embodiment, a 15-nm-thick silicon oxide film is formed using plasma generated by the above microwave and used as the insulating film 401.

Next, after a conductive film is formed over the insulating film 401, a resist mask is formed over the conductive film by a photolithography method, a printing method, an inkjet method, or the like. Part of the conductive film and the insulating film 401 is selectively removed with the resist mask, whereby a gate electrode 404a, a gate electrode 404b, the gate insulating film 402a, and the gate insulating film 402b are formed, and then the resist mask is removed (see FIG. 4B).

The conductive film serving as the gate electrode 404a and the gate electrode 404b may be formed of a film including an element selected from tantalum (Ta), tungsten (W), titanium (Ti), molybdenum (Mo), aluminum (Al), copper (Cu), chromium (Cr), and neodymium (Nd), or an alloy material such as AgPdCu or compound material mainly containing any of the elements by a physical vapor deposition (PVD) method such as a vacuum evaporation method or a sputtering method or a chemical vapor deposition (CVD) method such as a plasma CVD method. Further, as the conductive film serving as the gate electrodes, a semiconductor film typified by a polycrystalline silicon film doped with an impurity element such as phosphorus may be used.

In this embodiment, as the conductive film serving as the gate electrode 404a and the gate electrode 404b, a stacked layer film of a 30-nm-thick tantalum nitride film and a 170-nm-thick tungsten film is formed.

Next, a mask covering the semiconductor film 400b is formed, the semiconductor film 400a is subjected to treatment for adding an impurity element imparting n-type conductivity, and then the mask is removed. Consequently, portions of the semiconductor film 400a which do not overlap with the gate electrode 404a serve as an n-type impurity region 410a and an n-type impurity region 410b, and a portion of the semiconductor film 400a which overlaps with the gate electrode 404a functions as a channel formation region 410c. After that, a mask covering the semiconductor film 400a is formed, the semiconductor film 400b is subjected to treatment for adding an impurity element imparting p-type conductivity, and the mask is removed. Consequently, portions of the semiconductor film 400b which do not overlap with the gate electrode 404b serve as a p-type impurity region 416a and a p-type impurity region 416b, and a portion of the semiconductor film 400b which overlaps with the gate electrode 404b functions as a channel formation region 416c (see FIG. 4C). Note that there is no limitation on the order of addition of the impurity element imparting n-type conductivity and addition of the impurity element imparting p-type conductivity.

Any of the elements given in the description of channel doping can be used as the impurity element imparting n-type conductivity and the impurity element imparting p-type conductivity, and a suitable condition can be selected as appropriate to determine the amount of the impurity elements to be added considering necessary properties of the transistor.

Figure 4C:
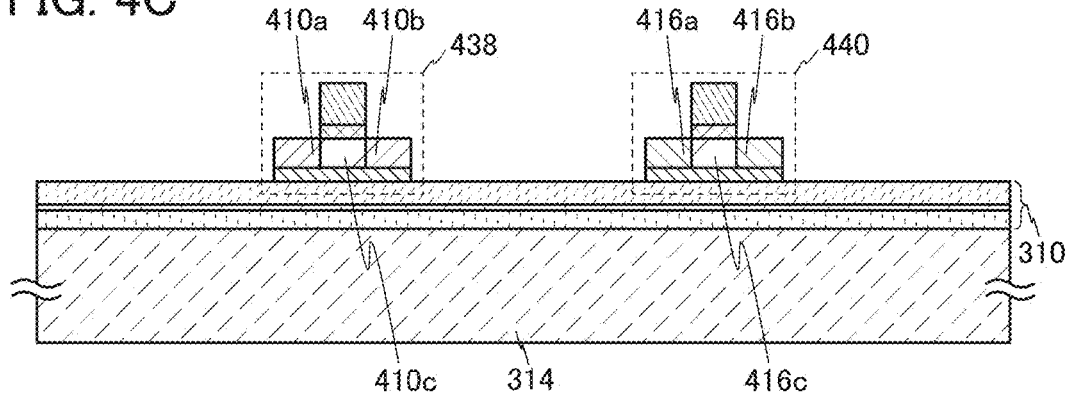

By the above-described process, an n-channel transistor 438 and a p-channel transistor 440 using the semiconductor thin film 316 as an active layer are formed (see FIG. 4C). The structure of the transistor described in this embodiment is merely an example and does not limit the present invention. A semiconductor element other than a transistor may be included. In addition to a semiconductor element, an element using various films used for forming the semiconductor element (e.g., a capacitor including an insulating film, a conductive film, or the like) may be formed.

Next, an interlayer insulating layer 450 which is a single layer or has a stacked layer structure is formed to cover the n-channel transistor 438 and the p-channel transistor 440 described above. Thus, the first layer 111 having the n-channel transistor and the p-channel transistor including the semiconductor thin film 316 as an active layer is formed (see FIG. 4D).

The interlayer insulating layer 450 may be formed in such a manner that an organic material having an insulating property is applied by a spin coating method, a printing method, a dispensing method, an ink-jet method, or the like, and cure treatment (e.g., heat treatment or light irradiation treatment) is performed depending on the applied material. As the organic material having an insulating property, for example, an organic resin such as an acrylic resin, a polyimide resin, a polyamide resin, a polyamide-imide resin, or an epoxy resin can be used. In addition to organic materials, an inorganic material can be used. It is also possible to use a low-dielectric constant material (low-k material), a siloxane-based resin, phosphosilicate glass (PSG), borophosphosilicate glass (BPSG), or the like.

In this embodiment, a 500-nm-thick silicon oxynitride film is formed and used as the interlayer insulating layer 450.

Figure 4D:
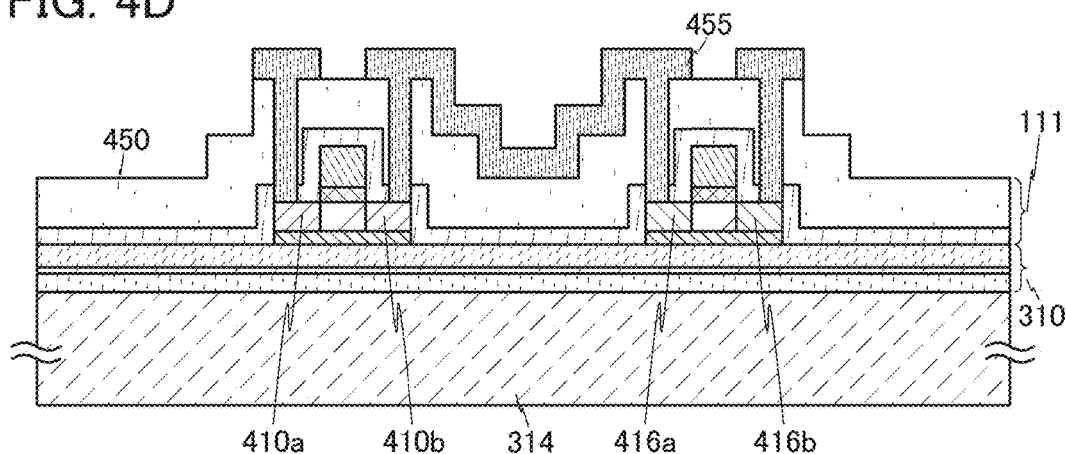

In order that the second layer including the OS transistor be formed in a later process, a wiring layer 455, which is electrically connected to the n-channel transistor 438 and the p-channel transistor 440 through an opening provided in the interlayer insulating layer 450, is formed over the first layer 111 (see FIG. 4D).

The wiring layer 455 can be formed using a method and a material similar to those of the gate electrode 404a. The gate electrodes 404a and 404b are not directly connected to the wiring layer 455 in FIG. 4D, but this structure does not limit the present invention.

In this embodiment, a 150-nm-thick tungsten film is formed and used as the wiring layer 455.

Figure 5A:
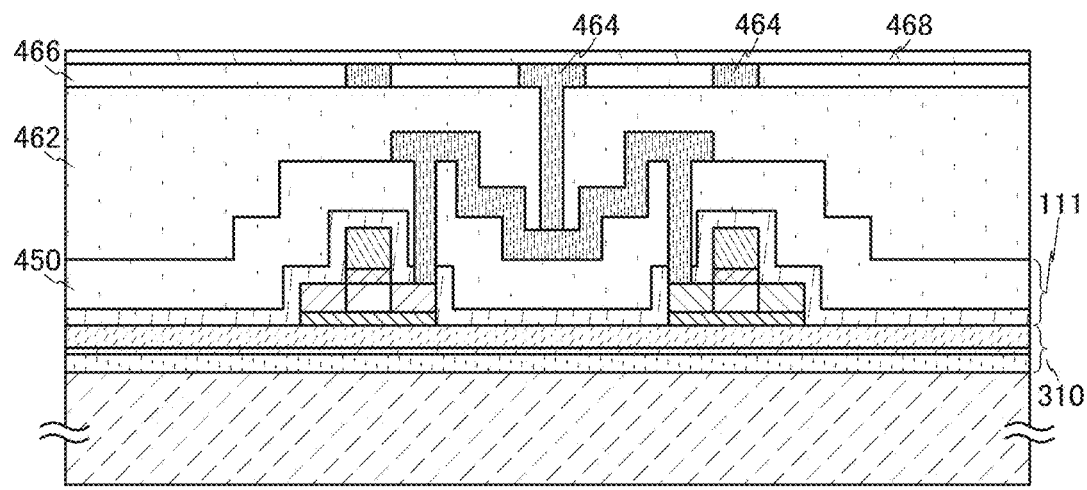
FIGS. 5A and 5B illustrate a method of manufacturing a signal processing unit.

After the wiring layer 455 is formed, an interlayer insulating layer 462 which is a single layer or has a stacked layer structure is further formed over the interlayer insulating layer 450 and the wiring layer 455 (see FIG. 5A). The interlayer insulating layer is preferably planarized. With this layer, when another circuit layer (the second layer 112 in this embodiment) is formed over the first layer 111, it is possible to prevent, for example, disconnection of a film formed over the first layer 111, resulting in fewer defects in the circuit layer 110 which is caused by roughness generated due to a component of the first layer 111 (e.g., the n-channel transistor 438 or the p-channel transistor 440).

For the interlayer insulating layer 462, the method and material of the insulating film 302 or the interlayer insulating layer 450 can be used. As the planarization treatment, a method similar to that for the bonding layer can be used.

In this embodiment, as the interlayer insulating layer 462, a 400-nm-thick silicon oxide film formed with a TEOS and subjected to CMP treatment as the planarization treatment is used.

Over the interlayer insulating layer 462, a wiring layer 464 electrically connected to one or more components formed in the first layer 111 (the n-channel transistor 438 and the p-channel transistor 440 in this embodiment) and an interlayer insulating layer 466 which is a single layer or has a stacked layer structure are formed.

The wiring layer 464 is used to electrically connect the components formed in the first layer 111 in the above process (the n-channel transistor 438 and the p-channel transistor 440 in this embodiment) to components formed in the second layer formed in a later process.

Figure 6A:
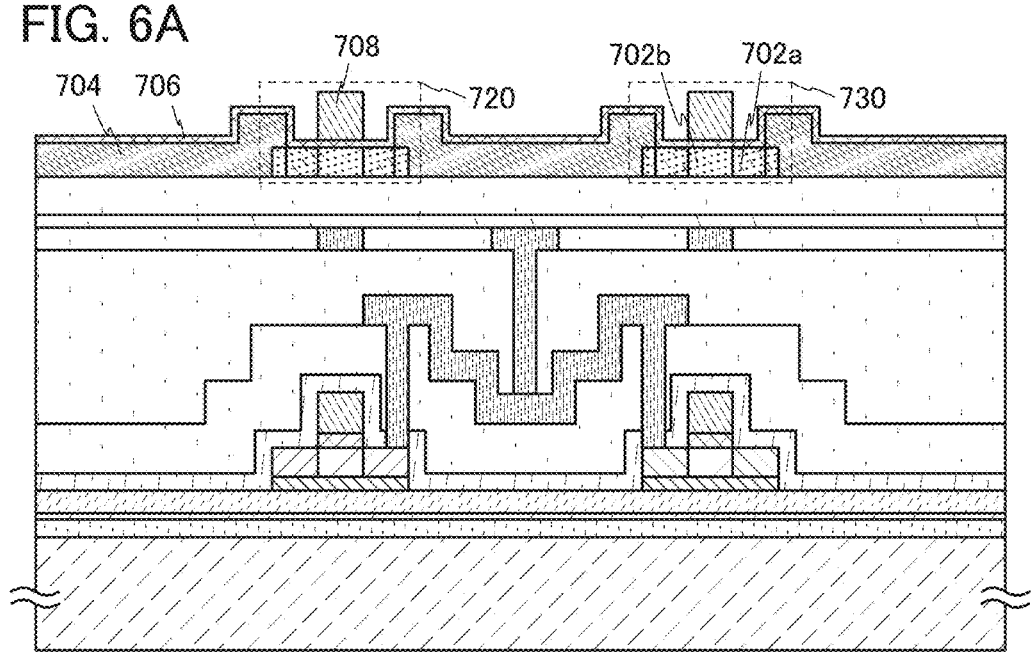
FIGS. 6A and 6B illustrate a method of manufacturing a signal processing unit.
Figure 6B:
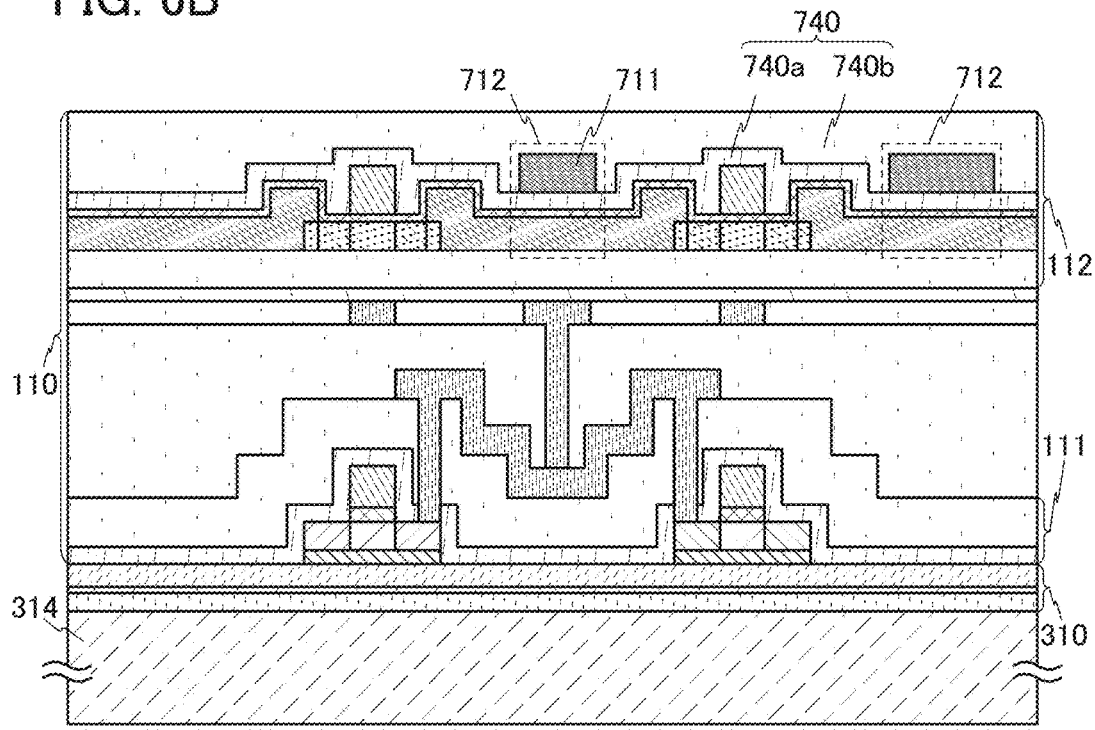

Owing to electrical connection between the n-channel transistor 438 and the p-channel transistor 440 through the wiring layer 464 as in FIG. 5A, for example, an analog switch (or part of an analog switch) capable of being driven at high speed in which the active layer is formed with the single crystal semiconductor film can be formed (see FIG. 6B).

In the step of forming the wiring layer 464, a back gate electrode of the OS transistor formed in a later process may be formed. This is preferable because application of a voltage to the back gate electrode surely enables the transistor to be a normally-off transistor.

For the wiring layer 464, the method and material of the gate electrodes 404a and 404b can be used. Note that in this embodiment, like the wiring layer 455, a 150-nm-thick tungsten film is formed and used.

Preferably, the interlayer insulating layer 466 is formed using the method and material of the insulating film 302 and subjected to planarization treatment so that roughness generated in the formation of the wiring layer 464 is reduced. In this embodiment, a silicon nitride oxide film is formed over the interlayer insulating layer 462 and the wiring layer 464 and subjected to planarization treatment by CMP, for use as the interlayer insulating layer 466.

An interlayer insulating layer 468 is preferably formed between the second layer 112 formed in a later process and the above-described first layer 111 (over the wiring layer 464 and the interlayer insulating layer 466 in this embodiment).

The interlayer insulating layer 468 is provided in order to suppress dispersion of impurities, which adversely affect electric characteristics of the transistors, between the first layer 111 and the second layer 112.

With respect to the OS transistor formed in a later process, if a large amount of hydrogen is contained in the oxide semiconductor film, hydrogen is bonded to the oxide semiconductor and partly becomes a donor to generate electrons serving as carriers. This might cause problems such as a shift of the threshold voltage of the transistors in the negative direction, greater variations in initial characteristics of the transistors, an increase in the channel length dependence of electrical characteristics of the transistors, and larger degradation of the electric characteristics in BT stress tests. Therefore the hydrogen concentration in the oxide semiconductor film is preferably less than $7.2 \times 10^{20}$ atoms/cm$^3$. Alternatively, the hydrogen concentration in the oxide semiconductor film is preferably less than or equal to $5 \times 10^{19}$ atoms/cm$^3$.

Thus, it is encouraged to suppress dispersion of hydrogen from the first layer 111 including the transistor including a single crystal semiconductor film (a single crystal silicon film in this embodiment) as an active layer into the second layer 112 including the OS transistor. In this embodiment, a 50-nm-thick aluminum oxide film having such a function is formed by a sputtering method and used as the interlayer insulating layer 468. The aluminum oxide film preferably has a high density (film density greater than or equal to 3.2 g/cm$^3$, preferably greater than or equal to 3.6 g/cm$^3$).

In this embodiment, a 50-nm-thick aluminum oxide film is formed by a sputtering method and used as the interlayer insulating layer 468.

<Method of Forming Second Layer 112>

Next, a method of forming the second layer 112 including the semiconductor element using the oxide semiconductor thin film over the first layer 111 is described.

Figure 5B:
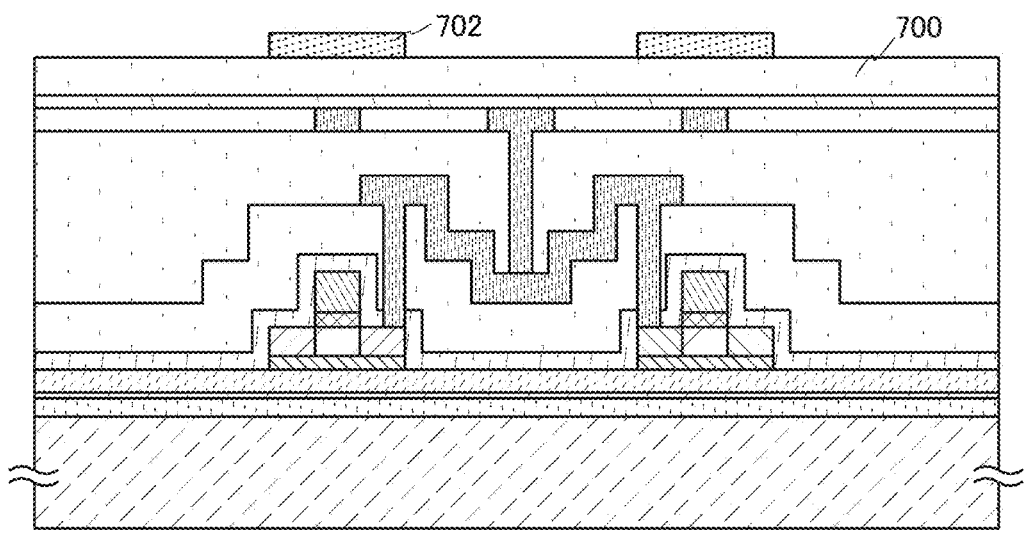

First, an insulating film 700 is formed over the interlayer insulating layer 468 and an island-shaped oxide semiconductor film 702 is formed over the insulating film 700 (see FIG. 5B). The insulating film 700 can be formed using a method and a material similar to those of the insulating film 302.

As the insulating film 700 (an insulating film on the outmost surface when the insulating film 700 has a stacked layer structure), a film from which oxygen can be released by heat treatment (hereinafter referred to as an oxygen supply film) is preferably formed. The reason is described below.

The oxide semiconductor film is formed over the insulating film 700. When an oxygen vacancy exists in the channel formation region of the OS transistors, charge is generated due to the oxygen vacancy in some cases. Part of the oxygen vacancy in an oxide semiconductor film serves as a donor to release an electron which is a carrier. As a result, the threshold voltage of the transistor shifts in the negative direction.

When the insulating film 700 (an insulating film on the outmost surface when the insulating film 700 has a stacked layer structure) functions as an oxygen supply film, part of oxygen in the oxygen supply film can be released by heat treatment. Accordingly, after the oxide semiconductor film is formed, the oxygen supply film is heated to supply oxygen to the oxide semiconductor film, so that the oxygen vacancy in the oxide semiconductor film can be filled. This can suppress a shift of the threshold voltage of the OS transistor in the negative direction. In particular, the oxygen supply film preferably contains oxygen which exceeds the stoichiometric composition. For example, in the case where silicon oxide is used for the oxygen supply film, a film of silicon oxide represented by $SiO_{2+\alpha}$ ($\alpha > 0$) is preferably used. Note that it is acceptable as long as a region containing a larger amount of oxygen than the stoichiometric composition (hereinafter referred to as "an oxygen-excessive region" in some cases) exists in at least part of the oxygen supply film.

Note that the "film from which oxygen can be released by heat treatment" described above refers to a film whose amount of oxygen released when converted into oxygen atoms in thermal desorption spectroscopy (TDS) analysis is greater than or equal to $1.0 \times 10^{19}$ atoms/cm$^3$, greater than or equal to $3.0\times10^{19}$ atoms/cm$^3$, greater than or equal to $1.0\times70^{20}$ atoms/cm$^3$, or greater than or equal to $3.0\times70^{20}$ atoms/cm$^3$.

Here, a method in which the amount of released oxygen is measured by being converted into oxygen atoms using the TDS analysis is described.

The amount of released gas in the TDS analysis is proportional to the integral value of a spectrum. Thus, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be obtained according to Equation (4) with the TDS analysis of a silicon wafer containing hydrogen at a predetermined density which is the standard sample and the TDS analysis of the insulating film. Here, all spectra having a mass-to-charge ratio (M/z) of 32 which are obtained by the TDS analysis are assumed to originate from an oxygen molecule. Note that CH$_3$OH, where M/z=32, is not taken into consideration on the assumption that it is unlikely to be present. Further, an oxygen molecule including an isotope oxygen atom of M/z=17 or M/z=18 is not taken into consideration either because the proportion of such a molecule in the natural world is minimal.

$$N_{O_2} = \frac{N_{H_2}}{S_{H_2}} \times S_{O_2} \times \alpha \qquad (4)$$

The value $N_{H2}$ is obtained by conversion of the number of hydrogen molecules desorbed from the standard sample into densities. The integral value of a spectrum when the standard sample is subjected to the TDS analysis is denoted by $S_{H2}$. Here, the reference value of the standard sample is set to $N_{H2}/S_{H2}$. The integral value of a spectrum when the insulating film is subjected to the TDS analysis is denoted by $S_{O2}$. Further, $\alpha$ is a coefficient which influences spectrum intensity in the TDS analysis. Refer to Japanese Published Patent Application No. H06-275697 for details of Equation 4. Note that the amount of released oxygen from the above insulating film can be measured, for example, with a thermal desorption spectrometer produced by ESCO Ltd., EMD-WA1000S/W, using a silicon wafer containing hydrogen atoms at $1\times10^{16}$ atoms/cm$^2$ as the standard sample.

In the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of oxygen released when converted into oxygen atoms is twice the number of the released oxygen molecules.

For the introduction of oxygen into the oxide semiconductor layer, heat treatment performed under an oxygen atmosphere, an ion implantation method, an ion doping method, a plasma immersion ion implantation method, plasma treatment performed under an atmosphere containing oxygen, or the like can be employed.

Note that in the case where oxygen is supplied from the oxygen supply film to the oxide semiconductor film by heat treatment, it is preferable that a film having a low oxygen or water vapor permeability (also referred to as a low moisture permeability) be formed under the oxygen supply film (that is, on a surface of the oxygen supply film which is opposite to its surface in contact with the oxide semiconductor film (or a surface close to the oxide semiconductor film)) so that oxygen released from the oxygen supply film can be supplied to the oxide semiconductor film efficiently. For example, the insulating film 700 may have a stacked layer structure in which a barrier film such as an aluminum oxide film, an aluminum oxynitride film, or an aluminum nitride oxide film is formed under the above-described oxygen supply film. In the case of using an aluminum oxide film, the aluminum oxide film preferably has a high density (film density of greater than or equal to 3.2 g/cm$^3$, preferably greater than or equal to 3.6 g/cm$^3$).

In this embodiment, a silicon oxide film is formed to a thickness of 300 nm by a sputtering method and used as the insulating film 700.

Although the insulating film 700 is formed over the interlayer insulating layer 468 in this embodiment, the insulating film 700 is not necessarily formed as long as the above-described problem is solved without the insulating film 700.

The oxide semiconductor film 702 can be formed as follows: after an oxide semiconductor film is formed by a sputtering method, a molecular beam epitaxy (MBE) method, a CVD method, a pulse laser deposition method, an atomic layer deposition (ALD) method, or the like, a resist mask is formed over the oxide semiconductor film by a photolithography method, and part of the oxide semiconductor film is selectively etched using the resist mask. Note that the resist mask is removed after the oxide semiconductor film 702 is formed. The thickness of the oxide semiconductor film is greater than 5 nm and less than or equal to 200 nm, preferably greater than or equal to 10 nm and less than or equal to 30 nm.

The oxygen vacancy in the oxide semiconductor film 702 is preferably reduced as much as possible as described above. To reduce the oxygen vacancy in the oxide semiconductor film 702 as much as possible, it is preferable that the oxide semiconductor film be formed in a deposition atmosphere in which an oxygen gas accounts for a large proportion. Therefore it can be said that an apparatus into which oxygen can be introduced and in which the gas flow rate can be adjusted, such as a sputtering apparatus, is preferably used. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as close to 100% as possible.

As described above, the oxide semiconductor film 702 preferably contains hydrogen as little as possible. Therefore the hydrogen concentration in the oxide semiconductor film 702 is preferably less than $5\times10^{18}$ atoms/cm$^3$, more preferably less than or equal to $1\times10^{18}$ atoms/cm$^3$, still more preferably less than or equal to $5\times10^{17}$ atoms/cm$^3$, further more preferably less than or equal to $1\times10^{16}$ atoms/cm$^3$. Note that the above hydrogen concentration in the oxide semiconductor film is measured by secondary ion mass spectrometry (SIMS).

For the above-described reason, it is preferable that the gas used for the formation of the oxide semiconductor film 702 do not contain an impurity such as water, hydrogen, a compound having a hydroxyl group, or a hydride. Alternatively, it is preferable to use a gas having a purity greater than or equal to 6N, preferably greater than or equal to 7N (i.e., the impurity concentration in the gas is less than or equal to 1 ppm, preferably less than or equal to 0.1 ppm).

In the formation of the oxide semiconductor film 702, in order to remove moisture (including water, hydrogen, a compound having a hydroxyl group, or a hydroxide) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of an impurity such as hydrogen or moisture in the oxide semiconductor film formed in the deposition chamber can be reduced.

The oxide semiconductor film is formed in the state where the substrate (i.e., the first temporary fixing substrate 314) is held in a deposition chamber kept under reduced pressure. At this time, film formation may be performed while the substrate is heated at a temperature greater than or equal to 100° C. and lower than or equal to the strain point of the substrate. By heating the substrate during the film formation, the concentration of impurities such as hydrogen and moisture in the formed oxide semiconductor film can be reduced (this can also be referred to as dehydration treatment or dehydrogenation treatment). In addition, embrittlement due to the sputtering can be reduced, which is preferable.

Further, by subjecting the substrate to heat treatment in the deposition chamber before the oxide semiconductor film is formed on the substrate, the impurities adsorbed in the substrate can be removed. In the heat treatment, for example, the temperature of the substrate (i.e., the first temporary fixing substrate 314) is set greater than or equal to room temperature and less than or equal to 450° C., preferably greater than or equal to 100° C. and less than or equal to 450° C. Note that by evacuation of the deposition chamber to a high vacuum, impurities can be efficiently removed in a short time.

On the other hand, when the oxide semiconductor film 702 contains an alkali metal or an alkaline earth metal, the alkali metal or the alkaline earth metal and an oxide semiconductor are bonded to each other, so that carriers are generated in some cases, which causes an increase in the off-state current of a transistor. Accordingly, the concentration of an alkali metal or an alkaline earth metal in the oxide semiconductor film 702 is less than or equal to $1\times10^{18}$ atoms/$cm^3$, preferably less than or equal to $2\times10^{16}$ atoms/$cm^3$.

A target used in the sputtering apparatus preferably has a relative density of greater than or equal to 90%, preferably greater than or equal to 95%, further preferably greater than or equal to 99%. With the use of a target having a high relative density, the formed oxide semiconductor film can be a dense film.

An oxide semiconductor material used for the oxide semiconductor film contains indium (In). In particular, In and zinc (Zn) are preferably contained. In addition, as a stabilizer for reducing variations in electric characteristics of an OS transistor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (HO), erbium (Er), thulium (Tm), ytterbium (Yb), or lutetium (Lu) may be contained.

As the oxide semiconductor, for example, any of the following can be used: indium oxide; tin oxide; zinc oxide, an In—Zn-based oxide, an In—Mg-based oxide, or an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—HO—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide and an In—Hf—Al—Zn-based oxide.

Note that here, for example, an "In—Ga—Zn-based oxide" means an oxide containing In, Ga, and Zn as its main components and there is no limitation on the ratio of In to Ga and Zn. Further, a metal element other than the In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$ (n>0, n is an integer) may be used.

The formed oxide semiconductor film 702 is in a single crystal state, a polycrystalline (also referred to as polycrystal) state, an amorphous state, or the like.

The oxide semiconductor film 702 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film 702 may include a CAAC-OS. In the CAAC-OS, for example, c-axes are aligned, and a-axes and/or b-axes are not macroscopically aligned.

For example, the oxide semiconductor film 702 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, the oxide semiconductor film 702 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 702 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that, as mentioned above, the oxide semiconductor film 702 may have a single-crystal, for example.

The oxide semiconductor film 702 preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100° or from 85° to 95°. In addition, a term "parallel" includes a range from −10° to 10° or from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film formation is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS film, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor is preferably formed over a surface with an average surface roughness ($R_a$) less than or equal to 1 nm, more preferably less than or equal to 0.3 nm, still more preferably less than or equal to 0.1 nm. Thus, planarization treatment is preferably performed on a surface over which the oxide semiconductor is to be formed. As the planarization treatment, chemical mechanical polishing (CMP) treatment, a dry etching method, or the like may be used. As the planarization treatment, for example, reverse sputtering, a dry etching method, chemical mechanical polishing (CMP) treatment, or the like can be used. The "reverse sputtering" here refers to a method in which, without application of a voltage to a target side, high frequency power is applied to a substrate side in an atmosphere of argon, nitrogen, helium, oxygen, or the like to generate plasma in the vicinity of the substrate and modify a surface (here, the oxide semiconductor film).

In the case where CMP treatment is employed as the above planarization treatment, it may be performed only once or more than once. When the CMP treatment is performed more than once, first polishing is preferably performed with a high polishing rate followed by final polishing with a low polishing rate. By performing polishing steps with different polishing rates in combination, the planarity of the surface over which the oxide semiconductor is to be formed can be further improved.

Note that "average surface roughness ($R_a$)" described above is obtained by expanding arithmetic mean surface roughness, which is defined by JIS B0601:2001 (ISO4287:1997), into three dimensions so as to be applied to a surface. In addition, $R_a$ can be expressed as an "average value of the absolute values of deviations from a reference surface to a specific surface" and is defined by the following equation.

$$R_a = \frac{1}{S_0} \int_{y_1}^{y_2} \int_{x_1}^{x_2} |f(x, y) - Z_0| \, dx \, dy \tag{5}$$

Here, the specific surface is a surface which is a target of roughness measurements, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Further, $S_0$ represents the area of a rectangle which is obtained by projecting the specific surface on the x-y plane, and $Z_0$ represents the height of the reference surface (the average height of the specific surface). Note that $R_a$ can be measured using an atomic force microscope (AFM).

In the case where the CAAC-OS film is formed as the oxide semiconductor film, any of the following three methods may be employed. The first method is the one in which the oxide semiconductor film is formed at a temperature higher than or equal to 200° C. and lower than or equal to 450° C., so that the oxide semiconductor film 702 serves as the CAAC-OS film. The second method is the one in which the oxide semiconductor film 702 is formed and then subjected to heat treatment at a temperature higher than or equal to 200° C. and lower than or equal to 700° C., so that the oxide semiconductor film 702 serves as the CAAC-OS film. The third method is the one in which two layers are formed for formation of an oxide semiconductor film. That is, after a first oxide semiconductor film with a small thickness is formed, heat treatment is performed at a temperature higher than or equal to 200° C. and lower than or equal to 700° C., so that the first oxide semiconductor film serves as a CAAC-OS film. Then, a second oxide semiconductor film is formed over the first oxide semiconductor film using a crystal in the first oxide semiconductor film as a seed crystal, whereby the CAAC-OS film is obtained.

Over the oxide semiconductor film (preferably a CAAC-OS film) formed by any of the above methods, a resist mask is formed by a photolithography method, and selective etching is performed using the resist mask. Thus, the island-shaped oxide semiconductor film 702 is formed.

Note that after the oxide semiconductor film is formed or after the island-shaped oxide semiconductor film 702 is formed, "dehydration treatment (dehydrogenation treatment)" and "peroxidation treatment" described below may be performed on the oxide semiconductor film (or the oxide semiconductor film 702).

<Dehydration (Dehydrogenation) Treatment>

As dehydration treatment (dehydrogenation treatment), a substrate is simply heated at a temperature greater than or equal to 300° C. and lower than or equal to 700° C., or less than the strain point of the substrate. By the heat treatment, excess hydrogen (including water and a hydroxyl group) can be removed.

As a heat treatment apparatus, it is possible to use an apparatus for heating an object to be processed using thermal conduction or thermal radiation generated from a medium such as a heated gas. For example, an electric furnace and a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA process may be performed as follows. The object to be processed is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas containing oxygen during the process.

Note that as the inert gas atmosphere, an atmosphere that contains nitrogen or a rare gas (e.g., helium, neon, or argon) and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

<Peroxidation Treatment>

The dehydration or dehydrogenation treatment may be accompanied by elimination of oxygen which is a component for an oxide semiconductor film to lead to a reduction in oxygen. Thus, in the case where the dehydration or dehydrogenation treatment is performed, oxygen is preferably supplied to the oxide semiconductor film. That is, it is preferred to perform the peroxidation treatment.

The oxygen vacancy in the oxide semiconductor film may be compensated in the following manner, for example: after the oxide semiconductor film is subjected to the dehydration treatment (dehydrogenation treatment), a high-purity oxygen gas, a high-purity dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb estimated by the use of a dew-point instrument of a cavity ring down laser spectroscopy (CRDS) system) may be introduced into the same furnace. It is preferable that the oxygen gas or the dinitrogen monoxide gas do not contain water, hydrogen, and the like. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). Note that the pressure in the apparatus is set high in the heat treatment, whereby oxygen can be efficiently added to the oxide semiconductor film.

Alternatively, the oxygen vacancy in the oxide semiconductor film (or the oxide semiconductor film 702) can be compensated in the following manner, for example: oxygen (including at least one of an oxygen radical, an oxygen atom, and an oxygen ion) is added to the oxide semiconductor film by an ion implantation method, an ion doping method, a plasma immersion ion implantation method, plasma treatment, or the like.

As described above, the formed oxide semiconductor film is subjected to the dehydration treatment (dehydrogenation treatment), whereby hydrogen or moisture is removed from the oxide semiconductor film so that the oxide semiconductor film is purified so as to contain impurities as little as possible. Then, oxygen which is simultaneously reduced is supplied, whereby the oxygen vacancy can be repaired.

In this embodiment, a 15-nm-thick IGZO film is formed using the above-mentioned gas including less hydrogen by a sputtering method while the substrate temperature is held at a temperature of 200° C., so that a CAAC-OS film is formed. After dehydrogenation of the film under a nitrogen gas atmosphere at 350° C. for one hour, the film is subjected to treatment for making an oxygen-excess state under a mixed gas atmosphere of nitrogen and oxygen at 350° C. for one hour and processed to have an island shape. This film is used as the oxide semiconductor film 702.

Next, over the oxide semiconductor film 702, a conductive film 704 electrically connected to the oxide semiconductor film 702, a gate insulating film 706 covering part of the oxide semiconductor film 702, and a gate electrode 708 overlapping with the oxide semiconductor film 702 with the gate insulating film 706 interposed therebetween are formed. Then, an impurity ion having the function of reducing the resistance of the oxide semiconductor film 702 is added to the oxide semiconductor film 702 with use of the gate electrode 708 as a mask, so that a low-resistance region 702a and a channel formation region 702b are formed in the oxide semiconductor film 702. Thus, a transistor 720 and a transistor 730 including the oxide semiconductor film as an active layer are formed (see FIG. 6A).

The conductive film 704, the gate insulating film 706, and the gate electrode 708 can be formed using a method and a material similar to those of the gate electrode 404a, the insulating film 401, and the gate electrode 404a, respectively.

For the conductive film 704 in contact with the oxide semiconductor film 702, it is preferable to use a single film structure or a stacked film structure containing a tungsten film, a titanium film, or a molybdenum film, for example; in particular, a tungsten film is preferably used.

For example, a stacked film containing a tungsten film and a titanium film over the tungsten film can be use as the conductive film 704.

One or more selected from the following can be used as the impurity ion added to the above oxide semiconductor film 702: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). Note that the addition of the impurity ion is not necessarily performed.

In this embodiment, a 100-nm-thick tungsten film formed by a sputtering method is used as the conductive film 704. A 20-nm-thick silicon oxide film formed with plasma generated by a microwave is used as the gate insulating film 706. A stacked layer film including a 30-nm-thick tantalum nitride film and a 135-nm-thick tungsten film which are formed by a sputtering method is used as the gate electrode 708.

Then, an interlayer insulating layer 740 including an interlayer insulating film 740a and an interlayer insulating film 740b is formed over the transistor 720 and the transistor 730, so that the second layer 112 is formed (see FIG. 6B).

The interlayer insulating layer 740 can be formed using a method and a material similar to those of the interlayer insulating layer 450, the insulating film 401, or the like.

Further, before the interlayer insulating layer 740 is formed, for example, a conductive film 711 can be formed in part of a region over the conductive film 704 with the gate insulating film 706 interposed therebetween to form a capacitor 712, so that the second layer 112 including the latch circuits illustrated in FIG. 1B can be formed (see FIG. 6B).

In this embodiment, a 70-nm-thick aluminum oxide film formed by a sputtering method is used as the interlayer insulating film 740a and a 300-nm-thick silicon oxide film formed by a sputtering method is used as the interlayer insulating film 740b.

By the above-described process, the circuit layer 110 having the first layer 111 including the transistor including a single crystal semiconductor film as an active layer and the second layer 112 including the OS transistor is formed over the first temporary fixing substrate 314 with the separation layer 310 interposed between the first temporary fixing substrate 314 and the circuit layer 110 (see FIG. 6B).

Figure 7:
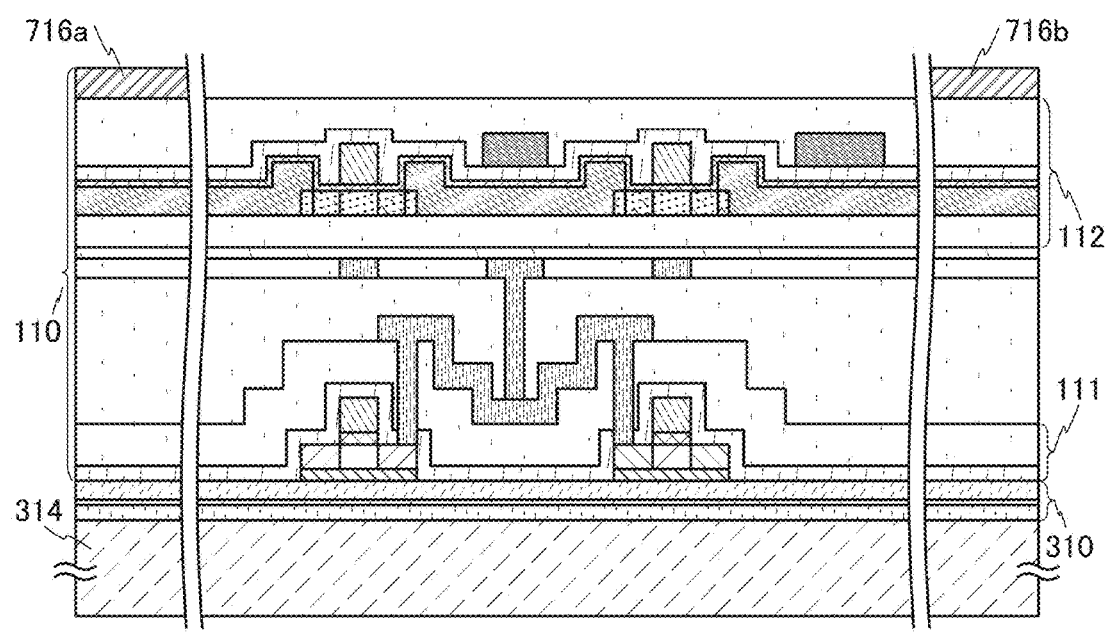
FIG. 7 illustrates a method of manufacturing a signal processing unit.

Over the second layer 112, it is preferable to form a conductive layer 716a, which is electrically connected to a component (e.g., transistor) included in the second layer 112, and a conductive layer 716b, which is not in direct contact with the conductive layer 716a (see FIG. 7). With this structure, the signal processing unit 100 including the circuit layer 110 and formed in a later process can be easily mounted on another device (e.g., a display device) by electrically connecting the conductive layers 716a and 716b to a conductive layer (e.g., a lead wiring) exposed over a surface of the device using a conductive material. Note that the conductive layers 716a and 716b may be construed as being included in the circuit layer 110 as illustrated in FIG. 7.

Any of the materials that can be used for the gate electrode 404a can be used for the conductive layers 716a and 716b. In this embodiment, as the conductive layers 716a and 716b, a stacked layer film including a 50-nm-thick titanium film, a 200-nm-thick aluminum film, and a 50-nm-thick titanium film which are formed in this order by a sputtering method is used. The conductive layers 716a and 716b may be formed to a thickness from 1 µm to 20 µm. In this case, the conductive layers 716a and 716b may be formed with Cu or an alloy containing Cu by a gold impregnation method or may be formed in such a way that a paste containing Ag is printed by a screen printing method and then hardened.

<Method of Manufacturing Signal Processing Unit 100>

Figure 8A:
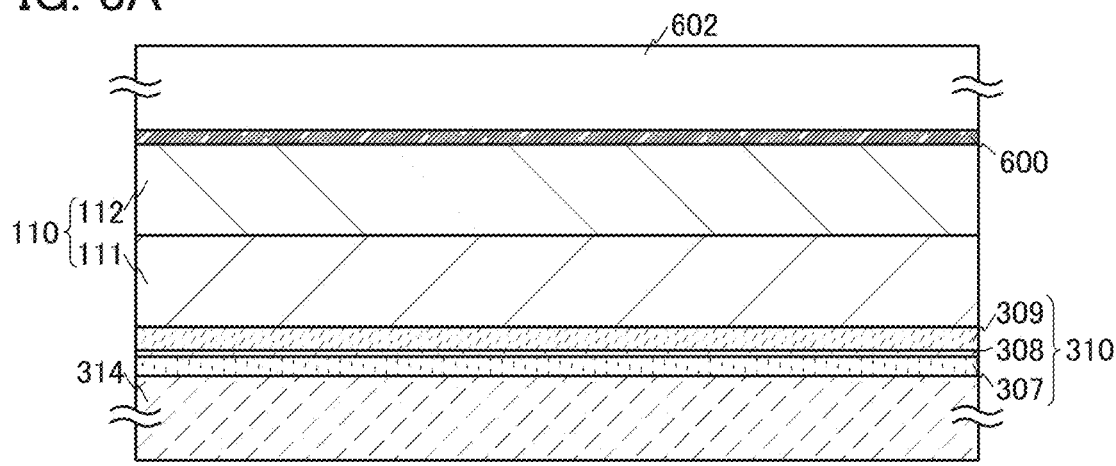
FIGS. 8A to 8C illustrate a method of manufacturing a signal processing unit.
Figure 8B:
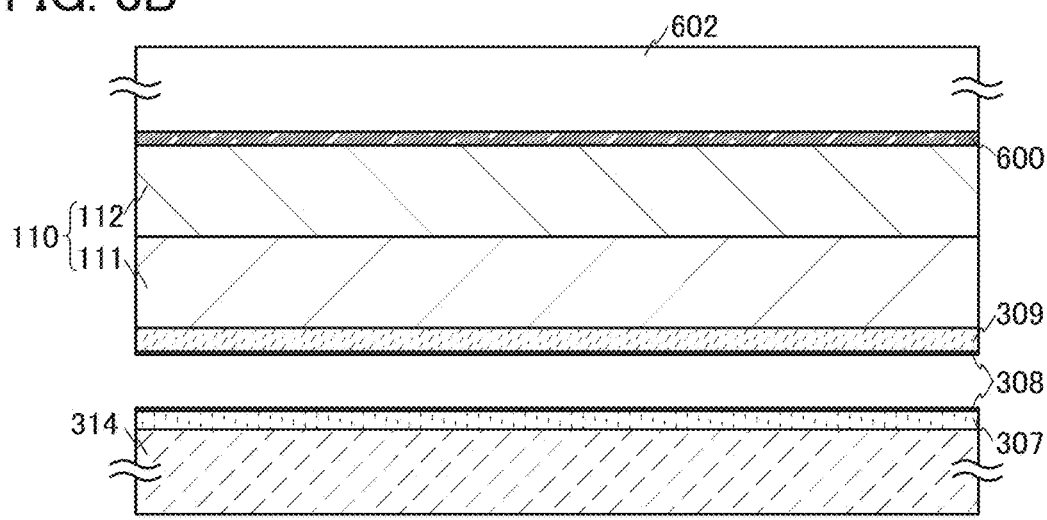
Figure 8C:
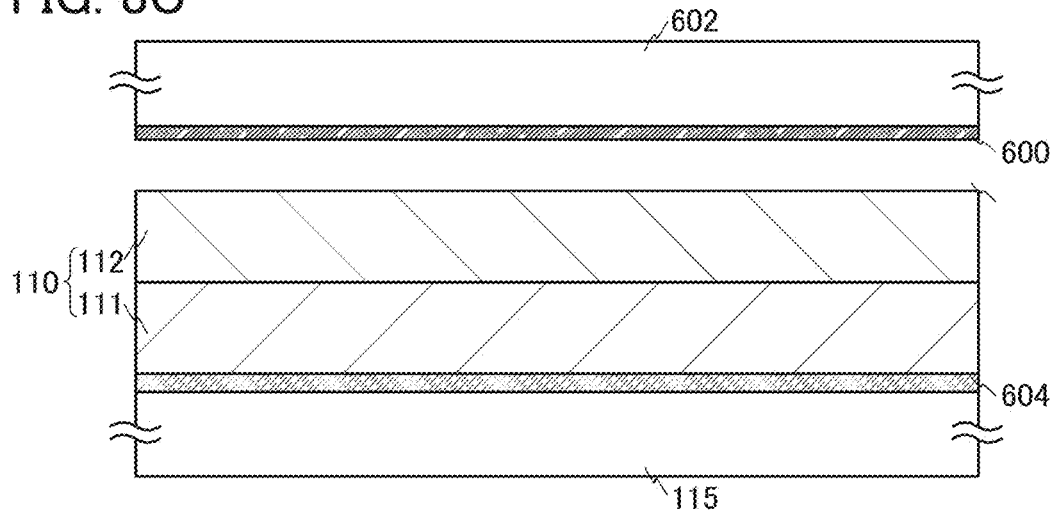

Next, a method in which the above-described circuit layer 110 is formed over a flexible substrate to manufacture the signal processing unit 100 is described using FIGS. 8A to 8C. Note that in FIGS. 8A to 8C, the detailed structure of the elements included in the first layer 111 and the second layer 112 is not shown to avoid complication.

First, with use of a temporary fixing material 600, a second temporary fixing substrate 602 is bonded onto the circuit layer 110 formed as described above over the first temporary fixing substrate 314 with the separation layer 310 interposed therebetween (see FIG. 8A).

As the temporary fixing material 600, a material which can separate the second temporary fixing substrate 602 from the circuit layer 110 as necessary, such as a material which is soluble to water or an organic solvent or which can be plasticized by ultraviolet light irradiation, is used.

The temporary fixing material 600 is preferably formed to be thin and have a uniform thickness using any of coating machines such as a spin coater, a slit coater, a gravure coater, and a roll coater, or any of printing machines such as a flexographic printing machine, an offset printing machine, a gravure printing machine, a screen printing machine, and an inkjet machine.

As the second temporary fixing substrate 602, a tape whose adhesion of a surface can be arbitrarily decreased, such as a UV separation tape and a thermal separation tape, can be used. Alternatively, a glass substrate, a quartz substrate, a sapphire substrate, a ceramic substrate, a metal substrate, a plastic substrate, or the like may be used. Note that in the case where the tape whose adhesion of a surface can be arbitrarily decreased is used, the temporary fixing material 600 is not necessarily required additionally. In the case where a plastic substrate is used, a plastic substrate having heat resistance high enough to withstand the temperature of a process performed later is preferably used.

Note that there is no particular limitation on the method of bonding the second temporary fixing substrate 602 to the circuit layer 110. When a flexible material such as the tape is used as the second temporary fixing substrate 602, a device which can perform bonding using a roller (also referred to as a roll laminator) may be used, for example, so that the circuit layer 110 and the second temporary fixing substrate 602 can be stably bonded to each other without the formation of air bubbles and the like therebetween.

In this embodiment, an adhesive which is cured by ultraviolet light irradiation and is soluble to water even after curing (also referred to as a water-soluble adhesive or the like) is used as the temporary fixing material 600, and is applied to a surface of the circuit layer 110 with a spin coating apparatus to form its thin layer, and curing treatment is performed. After that, a UV separation tape as the second temporary fixing substrate 602 is bonded onto to the temporary fixing material 600 with the use of a roll laminator.

Next, the circuit layer 110 is separated from the first temporary fixing substrate 314 and transferred to the second temporary fixing substrate 602 (see FIG. 8B).

When any of the layers included in the separation layer 310 is a metal oxide film (e.g., in this embodiment, the second separation layer 308 is a tungsten oxide film which is a metal oxide film), the metal oxide film is crystallized and embrittled by heat treatment performed at several times in the formation of the circuit layer 110. Hence, by application of a physical force (e.g., a force to separate the first temporary fixing substrate 314 from the second temporary fixing substrate 602), the circuit layer 110 can be easily transferred from the first temporary fixing substrate 314 to the second temporary fixing substrate 602 with the separation layer 310 used as an interface.

In FIG. 8B, part of the separation layer (part of the second separation layer 308 or the oxide film 309) remains in contact with the circuit layer 110. Part of or the whole of the separation layer remaining in contact with the circuit layer 110 may be removed by dry etching treatment, wet etching treatment, or chemical mechanical polishing treatment. Note that the part of the separation layer remaining on the circuit layer 110 may be construed as being included in the circuit layer 110.

Next, after the base substrate 115 is bonded to the circuit layer 110 using a bond material 604, the temporary fixing material 600 and the second temporary fixing substrate 602 are separated from the base substrate 115 (see FIG. 8C).

As the bond material 604, any of a variety of curable adhesives, for example, a photo-curable adhesive such as a UV curable adhesive, a reactive curable adhesive, a thermosetting adhesive, and an anaerobic adhesive can be used. The bond material 604 can be formed to be thin and have a uniform thickness using any of coating machines such as a spin coater, a slit coater, a gravure coater, and a roll coater, or any of printing machines such as a flexographic printing machine, an offset printing machine, a gravure printing machine, a screen printing machine, and an inkjet machine.

As the base substrate 115, a flexible substrate can be used. For example, an organic resin substrate (which can be referred to as an organic resin thin film in consideration of its flexibility), or a metal substrate (which can be referred to as a metal thin film in consideration of its flexibility) is used. Accordingly, the driver circuit can be flexibly deformed along a curved surface or an applied stress and thus hardly causes a breakdown or a peeling due to a shock or application of a stress in bending or twisting. Note that, when flexibility is not required, the substrate explained for the first temporary fixing substrate 314 can be used as the base substrate 115.

As the organic resin substrate, for example, a substrate including, as components, one or more kinds of resins selected from a poly(ethylene terephthalate) (PET) resin, a poly(ether sulfone) (PES) resin, a poly(ethylene naphthalate) (PEN) resin, a poly(vinyl alcohol) (PVA) resin, a polycarbonate (PC) resin, a nylon resin, an acrylic resin, a polyacrylonitrile resin; a polyetheretherketone (PEEK) resin, a polystyrene (PS) resin, a polysulfone (PSF) resin, a polyetherimide (PEI) resin, a polyarylate (PAR) resin, a poly(butylene terephthalate) (PBT) rein, a polyimide (PI) resin, a polyamide (PA) resin, a poly(amide imide) (PAI) resin, a polyisobutylene (PIB) resin, a chlorinated polyether (CP) resin, a melamine (MF) resin, an epoxy (EP) resin, a poly(vinylidene chloride) (PVdC) resin, a polypropylene (PP) resin, a polyacetal (POM) resin, a fluorine resin, a phenol (PF) resin, a furan resin (FF), an unsaturated polyester (FRP) resin, a cellulose acetate (CA) resin, a urea (UF) resin, a xylene (XR) resin, a poly(diallyl phthalate) (DAP) resin, a poly(vinyl acetate) (PVAc) resin, a polyethylene (PE) resin, and an ABS resin can be used. Further, a material in which a glass fiber, an aramid fiber, a carbon fiber, or the like impregnated with any of the above resins (also referred to as a prepreg or the like) can also be used.

As the above metal substrate, for example, aluminum (Al), titanium (Ti), nickel (Ni), chromium (Cr), molybdenum (Mo), tantalum (Ta), berylium (Be), zirconium (Zr), gold (Au), silver (Ag), copper (Cu), zinc (Zn), iron (Fe), lead (Pb), or tin (Sn), or a substrate including an alloy containing any of these elements can be used.

Note that, before bonding to the circuit layer 110, the base substrate 115 is preferably subjected to fluid-jet cleaning, ultrasonic cleaning, plasma cleaning, UV cleaning, ozone cleaning, or the like so that dust and organic components attaching to the base substrate 115 are removed.

Further, before bonding to the circuit layer 110, heat treatment may be performed on the base substrate 115. By the heat treatment, moisture and impurities attaching to the base substrate 115 can be removed. Further, by the heat treatment under a reduced pressure, moisture and impurities can be removed more efficiently.

Note that as for the cleaning method and the heat treatment, any one of the above cleaning methods and the heat treatment may be selected or two or more of the heat treatment and the cleaning methods may be performed in combination. For example, after fluid-jet cleaning is performed to remove dust attaching to the base substrate 115, ozone cleaning is performed to remove organic components, and then heat treatment is performed lastly to remove moisture attaching to and moisture absorbed in the base substrate 115 when the fluid-jet cleaning is performed. In such a manner, dust, organic components and moisture the base substrate 115 can be effectively removed.

In this embodiment, a film formed by impregnation of an aramid fiber with a polyimide resin is used as the base substrate 115 and a thin thermosetting adhesive is provided on a surface of the film using a screen printing machine to form the bond material 604. Then, the base substrate 115 and the circuit layer 110 are bonded to each other and subjected to hardening treatment.

Through the above-described process, the signal processing unit 100 in which the circuit layer 110 including the first layer 111 including the transistor including a single crystal semiconductor film as an active layer and the second layer 112 including the OS transistor r is provided over the base substrate 115 and which is illustrated in FIG. 1A, is formed (see FIG. 8C).

In the signal processing unit 100, the OS transistors are used for the latch circuits in the circuit layer 110. Since the off-state current of the OS transistors is extremely low, power consumption in the latch circuits can be reduced particularly in the case where the same signal is successively input to the latch circuits. A component other than the latch circuits which are included in the circuit layer 110 includes the transistor including a single crystal semiconductor film as an active layer, which ensures the high-speed driving performance of the circuit layer 110. Since the circuit layer 110 is formed over the flexible substrate, the signal processing unit 100 is a driver circuit that achieves high-speed driving performance and low power consumption and hardly causes a breakdown or a peeling due to a shock or application of a stress in bending and twisting.

Embodiment 2

In this embodiment, a method to manufacture the signal processing unit 100, which is different from the method in Embodiment 1, is described.

Figure 24A:
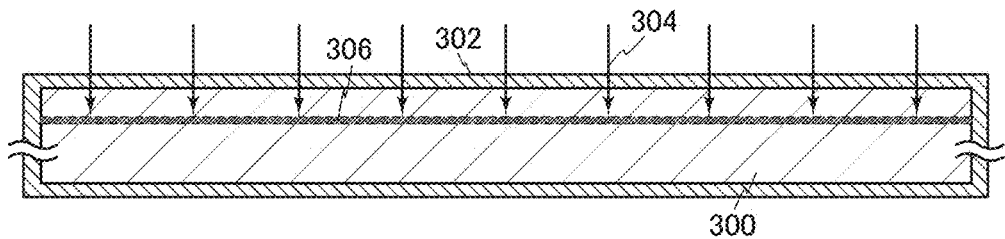
FIGS. 24A to 24D illustrate a method of manufacturing a signal processing unit.

First, as in Embodiment 1, after the insulating film 302 is formed over a surface of the semiconductor substrate 300, the ion irradiation treatment 304 is performed from one side of the semiconductor substrate 300, so that the embrittled region 306 is formed in the semiconductor substrate 300 (see FIG. 24A).

Figure 24B:
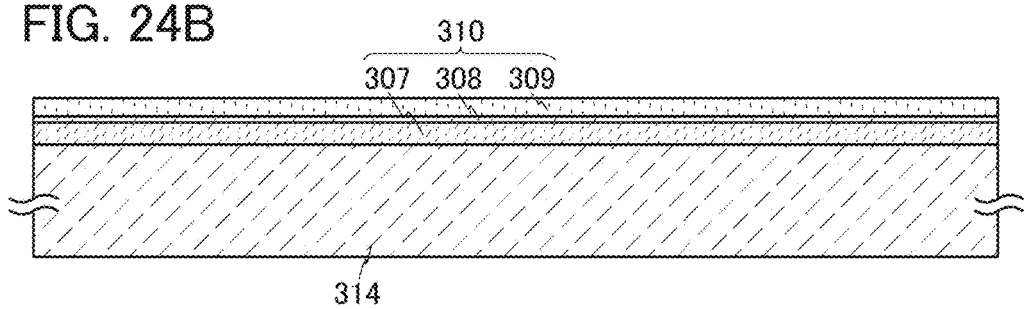

Next, the separation layer 310 is formed over the surface of the first temporary fixing substrate 314. Note that the separation layer 310 is a stacked layer structure including the first separation layer 307, the second separation layer 308, and the oxide film 309 in FIG. 24B but is not limited to this structure as long as the structure is mentioned for the separation layer 310 in Embodiment 1.

Figure 24C:
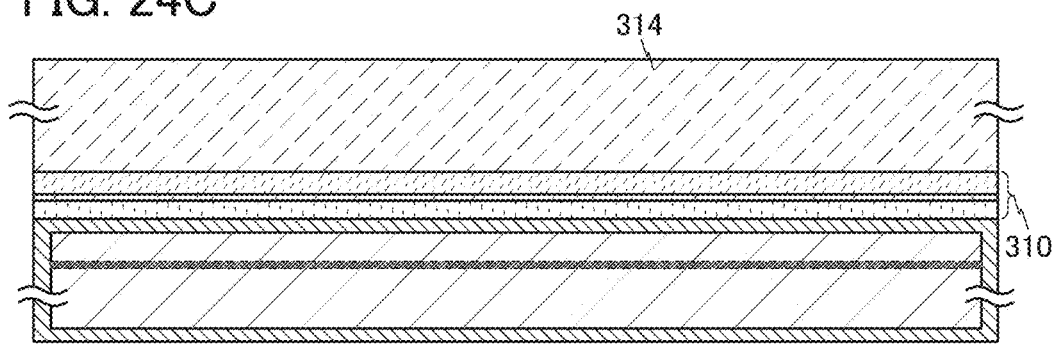

Next, the first temporary fixing substrate 314 whose surface is provided with the separation layer 310 is bonded to the side of the semiconductor substrate 300 (side on which the ion irradiation treatment is performed) so that the side of the semiconductor substrate 300 is in contact with the separation layer 310 of the first temporary fixing substrate 314 (see FIG. 24C).

Note that the adhesion between the semiconductor substrate 300 and the first temporary fixing substrate 314 tends to be stronger as the flatness of the surfaces of the insulating film 302 and the separation layer 310 becomes higher. Therefore, before the semiconductor substrate 300 and the first temporary fixing substrate 314 are bonded to each other, one or both of the insulating film 302 and the separation layer 310 is preferably subjected to planarization treatment. For the planarization treatment, refer to the planarization treatment described in Embodiment 1.

Next, as in Embodiment 1, after the semiconductor substrate 300 is subjected to heat treatment, the semiconductor substrate 300 is separated from the first temporary fixing substrate 314.

Figure 24D:
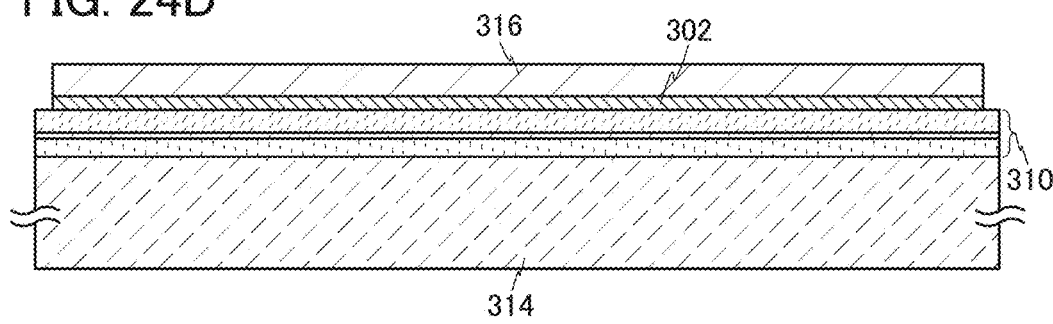

By the above-described process, the semiconductor thin film 316 separated from the semiconductor substrate 300 can be transferred onto the first temporary fixing substrate 314 with the insulating film 302 and the separation layer 310 interposed therebetween (see FIG. 24D).

The stacking order of the layers in the separation layer 310 formed over the first temporary fixing substrate 314 described in this embodiment is opposite to that in the separation layer 310 described in Embodiment 1 (in Embodiment 1, the first separation layer 307, the second separation layer 308, and the oxide film 309 are formed in this order over the first temporary fixing substrate 314, while, in this embodiment, the oxide film 309, the second separation layer 308, and the first separation layer 307 are stacked in this order over the first temporary fixing substrate 314). However, the signal processing unit 100 can be manufactured with either structure, and the separation layer having either structure is referred to as the separation layer 310.

For the subsequent steps in the manufacturing process of the signal processing unit 100, refer to FIG. 3D, FIGS. 4A to 4D, FIGS. 5A and 5B, FIGS. 6A and 6B, and FIG. 7 and the description with reference to these drawings in Embodiment 1.

By using the manufacturing method described in this embodiment, formation of the insulating film 302 on the surface of the semiconductor substrate 300, formation of the embrittled region 306 in the semiconductor substrate 300, and formation of the separation layer 310 over the first temporary fixing substrate 314 can be performed at the same time with different apparatuses, which can shorten the time for manufacturing the signal processing unit 100.

Embodiment 3

In this embodiment, examples of a structure and a manufacturing method of a display device including the signal processing unit described in the above embodiments is described with reference to FIGS. 9A to 9C and FIGS. 10A to 10D.

<Structure Example of Display Device>

Figure 9A:
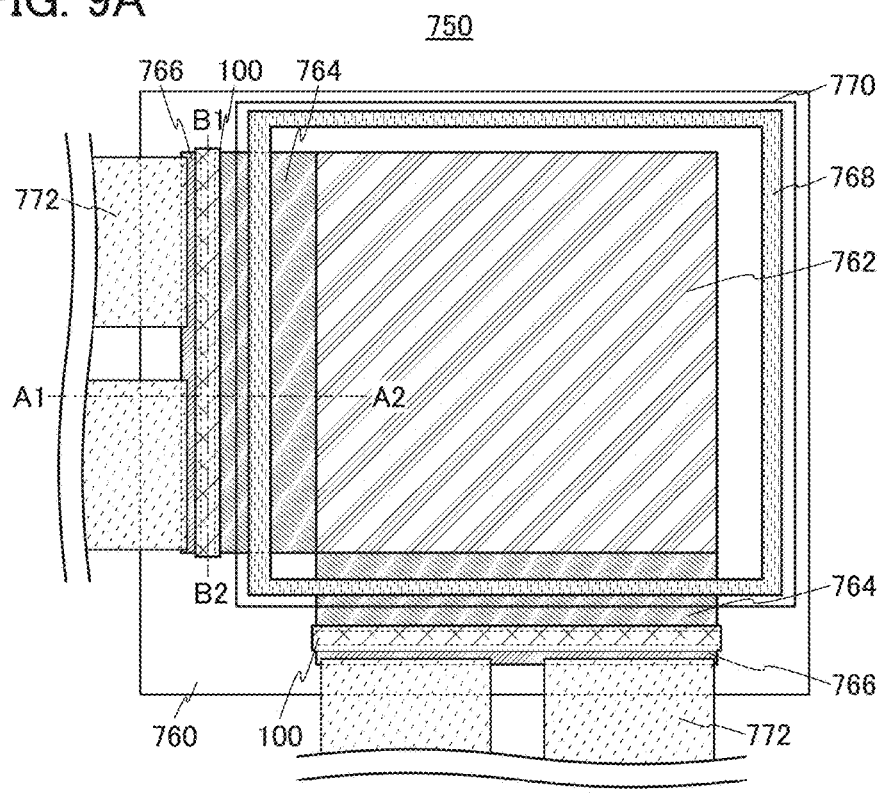
FIGS. 9A to 9C illustrate a configuration of a display device.
Figure 9B:
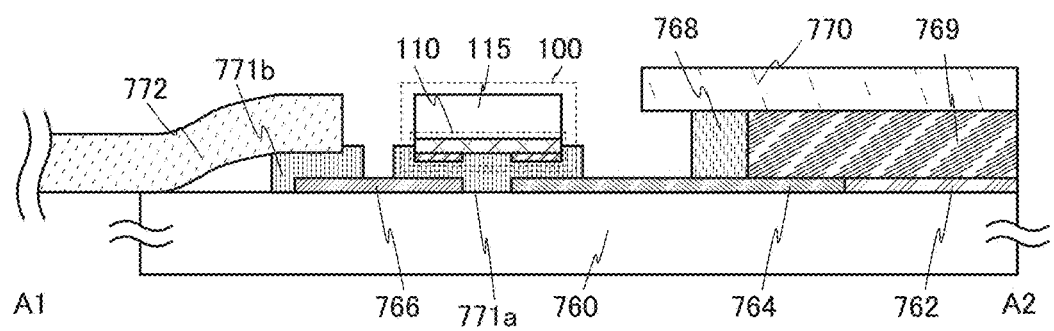
Figure 9C:
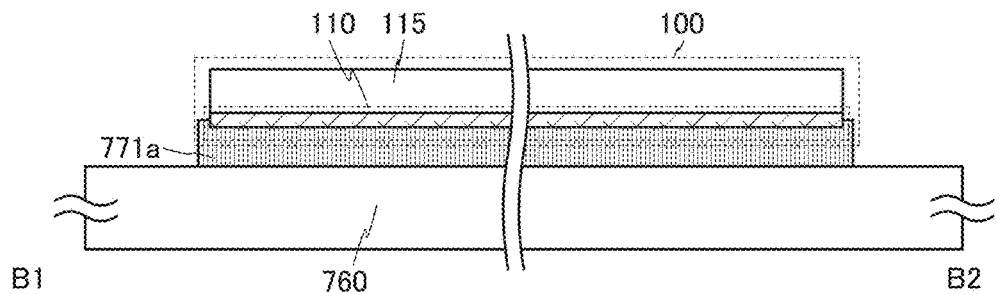

FIG. 9A shows a top view of an example of the display device of this embodiment. FIG. 9B illustrates a section along the alternate long and short dash line A1-A2 in FIG. 9A. FIG. 9C illustrates a section along the alternate long and short dash line B1-B2 in FIG. 9A.

As illustrated in FIGS. 9A to 9C, a display device 750 described in this embodiment includes, over a substrate 760, a pixel portion 762 including a thin film transistor and a pixel electrode, a counter substrate 770 bonded to the substrate with a sealing material 768, and a display element layer 769, which includes a liquid crystal element, an EL element, or the like and is provided in a space enclosed by the substrate 760, the counter substrate 770, and the sealing material 768. Note that although the display element layer 769 is provided in the whole space enclosed by the substrate 760, the counter substrate 770, and the sealing material 768 in FIG. 9A, a space may be present between the display element layer 769 and the counter substrate 770 or a material that can suppress entrance of moisture from the outside (e.g., a drying agent) may be provided in a space between the display element layer 769 and the counter substrate 770. In FIG. 9A, for easier understanding of the structure under the counter substrate 770, hatching for indicating the counter substrate 770 is not illustrated.

A lead terminal 764 for inputting an image signal and a power supply voltage is provided over the substrate 760 and electrically connected to the circuit layer 110 in the signal processing unit 100 through a conductive material 771a.

A flexible printed wiring 772 (flexible printed circuit: FPC) for supplying a power supply voltage to the pixel portion 762 is electrically connected to a connection terminal 766 provided over the substrate 760 through the conductive material 771b. The connection terminal 766 is electrically connected to the circuit layer included in the signal processing unit 100 through the conductive material 771a.

Thus, in the display device 750 illustrated in FIGS. 9A to 9C, the signal processing unit 100 functions as a scan line driver circuit or a signal line driver circuit of the pixel portion 762, and an electric power voltage is supplied from the flexible printed wiring 772 to the pixel portion 762 through the lead terminal 764, the connection terminal 766, and the conductive materials 771a and 771b.

Although the power supply voltage supplied through the flexible printed wiring 772 is supplied to the signal processing unit 100 and then to the pixel portion 762 in this embodiment, the power supply voltage may be supplied to the pixel portion 762 and then to the signal processing unit 100 or may be supplied to the signal processing unit 100 and the pixel portion 762 in parallel.

<Method of Manufacturing Display Device>

Next, an example of a manufacturing process of the display device 750 illustrated in FIGS. 9A to 9C is described using FIGS. 10A to 10D.

Figure 10A:
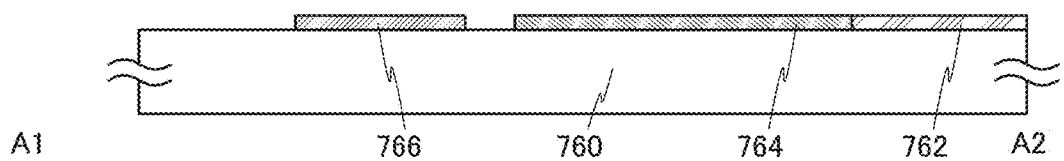
FIGS. 10A to 10D illustrate a method of manufacturing a display device.

First, the pixel portion 762, the lead terminal 764, and the connection terminal 766 are formed over the substrate 760 (see FIG. 10A).

For the substrate 760, any of the materials that can be used for the first temporary fixing substrate 314 and the base substrate 115 described in Embodiment 1 can be used. Since the signal processing unit 100 may have flexibility as described in Embodiment 1, it is possible to provide a structure where not only the signal processing unit 100 but also the substrate 760 including the pixel portion 762 can be deformed in accordance with an applied stress, which enables a display device with flexibility as a whole and a high added value.

On the other hand, even when a material with low flexibility, such as silicon or glass is used for the substrate 760, the use of a flexible base substrate 115 allows the signal processing unit 100 to be thin and lightweight, which contributes to a reduction in the thickness or weight of the display device 750.

As the structure, material, formation method of the pixel portion 762, a known technique of a pixel portion including a thin film transistor and a pixel electrode can be used without particular limitation.

A known technique can be employed to form the lead terminal 764 and the connection terminal 766. However, in consideration of time or cost required for the manufacture of the display device, the lead terminal 764 and the connection terminal 766 are preferably formed at the same time as the pixel portion 762 with the use of the material and formation method used in the manufacturing process of the pixel portion 762.

Figure 10B:
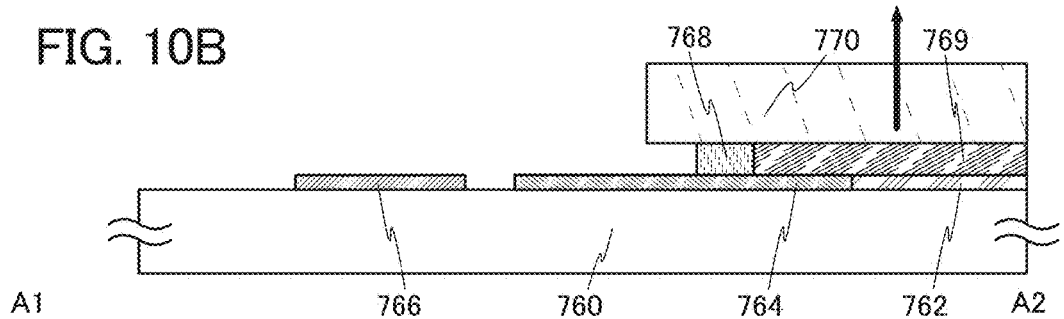

Next, while the display element layer 769 is formed over the pixel portion 762, the counter substrate 770 is bonded to the substrate 760 with the sealing material 768 provided on an outer side than the display element layer 769 (at the edge portion of the substrate) (see FIG. 10B).

As the sealing material 768, any of a variety of curable adhesives, for example, a photo-curable adhesive such as a UV curable adhesive, a reactive curable adhesive, a thermosetting adhesive, and an anaerobic adhesive can be used. The sealing material 768 can be formed with such a material using any of printing machines such as a flexographic printing machine, an offset printing machine, a gravure printing machine, a screen printing machine, an inkjet machine, and a dispensing machine. Note that the sealing material 768 may include a spacer material.

In the display element layer 769, a liquid crystal element or an electroluminescent (EL) element is provided by a known technique. For example, in the case where the display device 750 is a liquid crystal display device, over the pixel electrode included in the pixel portion 762, an alignment film, a liquid crystal material, an electrode and a color filter which face the pixel electrode with the liquid crystal material interposed therebetween, and the like are provided. In the case where the display device 750 is an EL display device, over the pixel electrode included in the pixel portion, an EL layer including an organic compound or an inorganic compound having a light-emitting property, electrodes which face the pixel electrode with the EL layer interposed therebetween, and the like are provided. In addition, in the case of a liquid crystal display device, a backlight or a polarizing plate may be provided as necessary.

For the counter substrate 770, any of the materials that can be used for the first temporary fixing substrate 314 and the base substrate 115 described in Embodiment 1 can be used. Therefore, a flexible substrate can be used for the counter substrate 770. However, in the case where the display device 750 emits light upward (in the arrow direction in FIG. 10B), for the counter substrate 770, it is necessary to use a material that transmits visible light (e.g., light at a wavelength from 350 nm to 700 nm) (specifically, the property of transmitting 50% or more of light, 70% or more of light).

Figure 10C:
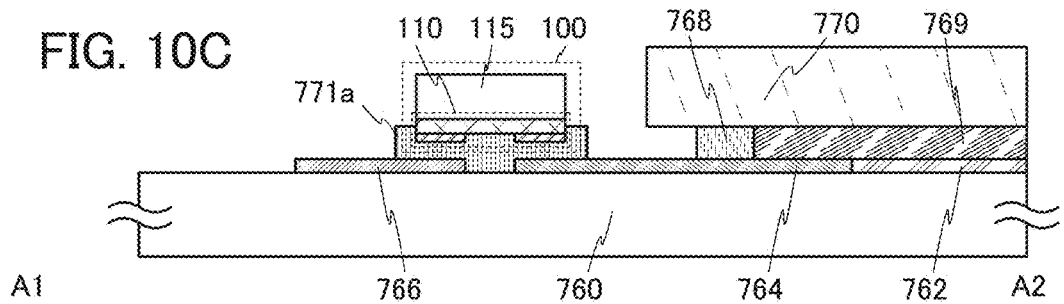

Next, using the conductive material 771a, the signal processing unit 100 in which the circuit layer 110 is provided over the base substrate 115 is provided (mounted) over the substrate 760 so that the circuit layer 110 faces the substrate 760 (see FIG. 10C). Consequently, the circuit layer 110 is electrically connected to the lead terminal 764 and to the connection terminal 766 through the conductive material 771a.

As the conductive material 771a, an anisotropic conductive paste (ACP), an anisotropic conductive film (ACF), or the like can be used and, by pressure bonding, the circuit layer 110 can be electrically connected to the lead terminal 764 and to the connection terminal 766. Alternatively, a conductive adhesive such as a silver paste, a copper paste, or a carbon paste may be used. Alternatively, a solder material which can melt at a temperature less than or equal to the glass transition temperature of the base substrate 115 or the substrate 760 may be used.

Figure 10D:
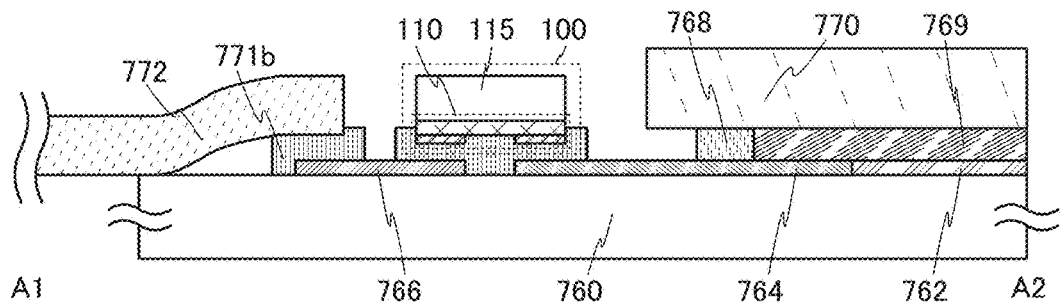

Next, the flexible printed wiring 772 is electrically connected to the connection terminal 766 with the use of the conductive material 771b (see FIG. 10D).

The treatment for mounting the signal processing unit 100 and the treatment for bonding the flexible printed wiring 772 are different processes in the above example. However, when the height of the signal processing unit 100 and the height of the flexible printed wiring 772 are about the same as illustrated in FIG. 10D, the treatment for mounting the signal processing unit 100 and the treatment for bonding the flexible printed wiring 772 may be performed in the same process.

Through the above-described process, the display device 750 illustrated in FIGS. 9A and 9B is completed. In the display device 750, the pixel portion 762 provided over the substrate 760 is electrically connected through the lead terminal 764 to the signal processing unit 100 described in Embodiment 1. The signal processing unit 100 achieves high-speed driving performance and low power consumption and hardly causes a breakdown or a peeling due to a shock or application of a stress in bending or twisting. The signal processing unit 100 functions as a scan line driver circuit or a signal line driver circuit of the pixel portion 762. Thus, a display device that achieves high-speed driving performance and low power consumption can be provided.

When a material having flexibility is used for the substrate 760 and the base substrate 115, not only the signal processing unit 100 but also the substrate 760 can be deformed in accordance with an applied stress, which enables a display device with flexibility as a whole and a high added value.

On the other hand, even when a material with low flexibility, such as glass, is used for the substrate 760, the use of the flexible base substrate 115 contributes to reduction in the thickness or weight of the display device 750.

Embodiment 4

In this embodiment, a structure and a feature of a display device which is partly different from the display device 750 described in Embodiment 3 are described. Note that although a manufacturing method is basically similar to that in Embodiment 3, part of the method which is different from that in Embodiment 3 is as appropriate described.

<Structure Example and Feature of Display Device>

Figure 11A:
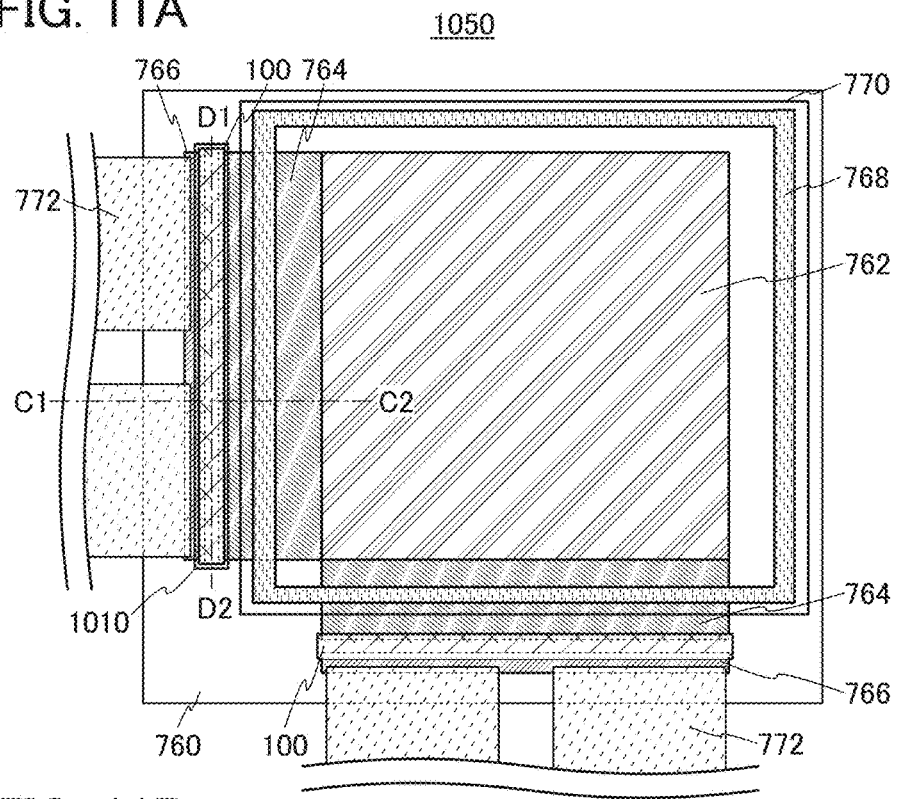
FIGS. 11A to 11C illustrate a method of manufacturing a display device.
Figure 11B:
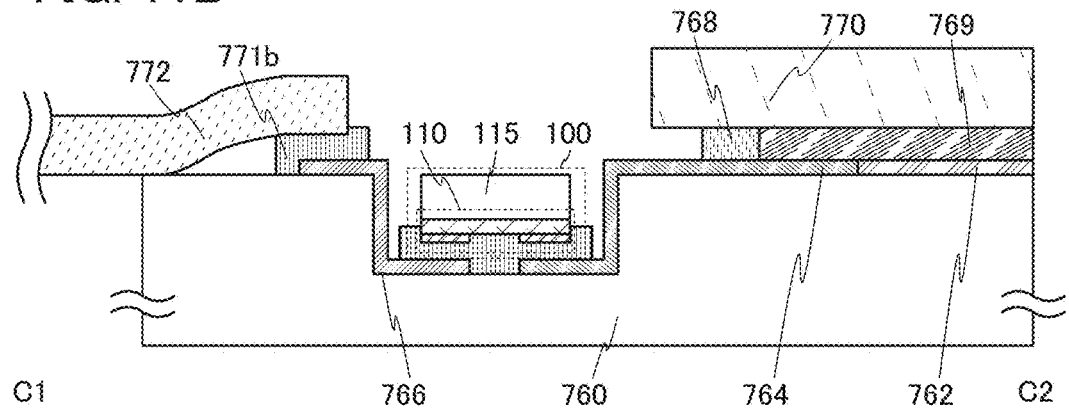
Figure 11C:
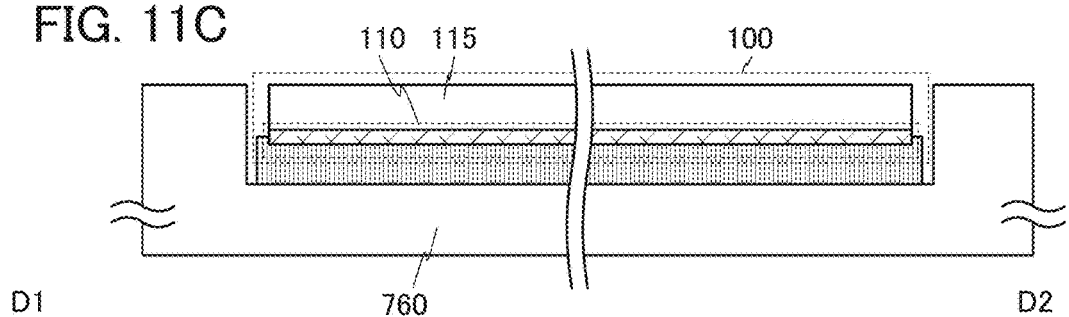

A structure of a display device which is different from that in Embodiment 3 is described below using FIGS. 11A to 11C. FIG. 11A is a top view of the display device, FIG. 11B is a cross-sectional view taken along the alternate long and short dash line C1-C2 in FIG. 11A, and FIG. 11C is a cross-sectional view taken along the alternate long and short dash line D1-D2 in FIG. 11A. Note that FIG. 11A is the same as FIG. 9A but is given here for easier understanding of positional relationship of the components in FIG. 11B.

A display device 1050 illustrated in FIGS. 11A and 11B has the same components as the display device illustrated in FIGS. 9A and 9B but is different from the display device of Embodiment 1 in that the signal processing unit 100 is provided in a depressed portion 1010 provided in the substrate 760, and the circuit layer 110 is electrically connected to the pixel portion 762 in the depressed portion 1010. Preferably, the surface of the substrate 760 (also referred to as a side where the pixel portion 762 is formed) is aligned or substantially aligned with the bottom surface of the base substrate 115 (also referred to as a side where the circuit layer 110 is not formed), as illustrated in FIG. 11B.

The depressed portion 1010 can be formed by, for example, processing the substrate 760 using any of a variety of cutting machines or laser irradiation. Alternatively, the depressed portion 1010 may be obtained with a stacked layer structure of the substrate 760, as illustrated in FIG. 12.

Figure 12:
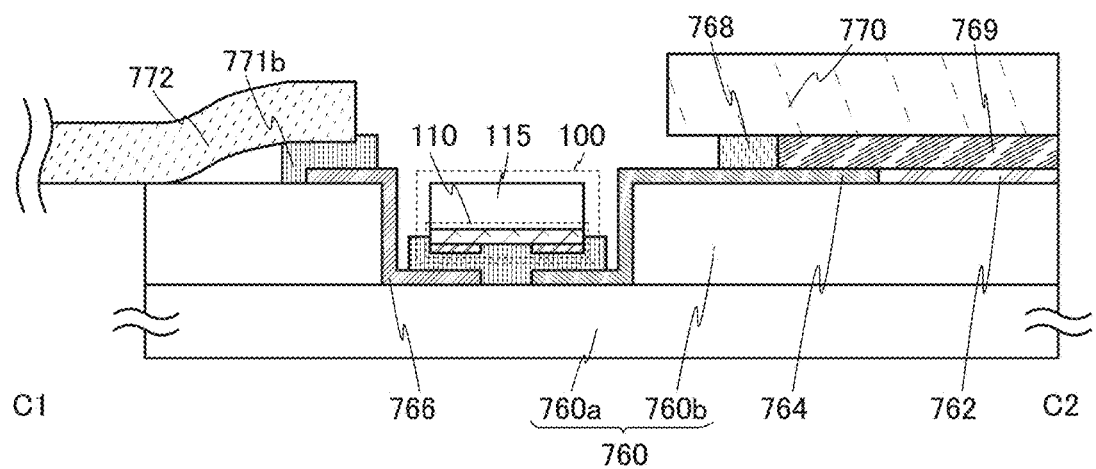
FIG. 12 illustrates a method of manufacturing a display device.

Although FIG. 12 illustrates a two-layer structure of a substrate 760a and a substrate 760b, there is no limitation on the number of the layers. The substrate 760a and the substrate 760b can be formed with any of the materials that can be used for the substrate 760, and the materials of the substrate 760a and the substrate 760b may be the same as or different from each other.

In the display device 750 described in Embodiment 3, the total thickness of the signal processing unit 100 and the substrate 760 in a portion where the signal processing unit 100 is mounted and the thickness of the substrate 760 in a peripheral portion of the signal processing unit 100 differ by the thickness of the signal processing unit 100. Hence, for example, when the display device 750 is curved on the alternate long and short dash line A1-A2 as an axis, the difference in thickness causes a partial variation in the deformation state (also referred to as the degree of deformation) of the display device 750. This might locally apply a force to part of the display device 750 or the conductive material 771 or reduce display quality of the pixel portion 762, for example.

Further, when an external impact force is applied to the signal processing unit 100 (e.g., an object from above collides with the base substrate 115), the impact force easily concentrates on the signal processing unit 100 portion.

On the other hand, in the structure of the display device 1050 described in this embodiment, the difference in thickness is reduced compared with that in Embodiment 1, it is possible to solve the aforementioned problems.

The methods and structures described in this embodiment can be combined as appropriate with any of the methods and structures described in the other embodiments.

Embodiment 5

In this embodiment, a structure and a feature of a display device which is partly different from the display devices described in the above embodiments are described. Note that although a manufacturing method is basically similar to that in Embodiment 3, part of the method which is different from that in Embodiment 3 is as appropriate described.

<Structure Example and Feature of Display Device>

Figure 13A:
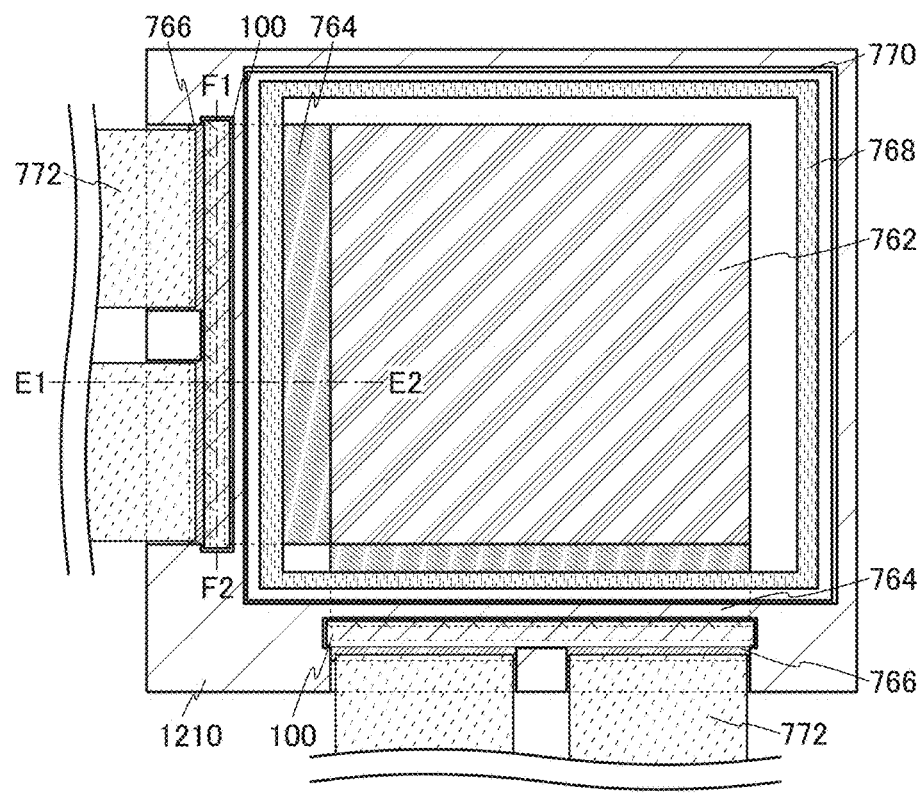
FIGS. 13A to 13C illustrate a method of manufacturing a display device.

A structure of a display device which is different from those in the above embodiments is described below using FIGS. 13A to 13C. FIG. 13A is a top view of the display device, FIG. 13B is a cross-sectional view taken along the alternate long and short dash line E1-E2 in FIG. 11A, and FIG. 13C is a cross-sectional view taken along the alternate long and short dash line F1-F2 in FIG. 13A.

Figure 13B:
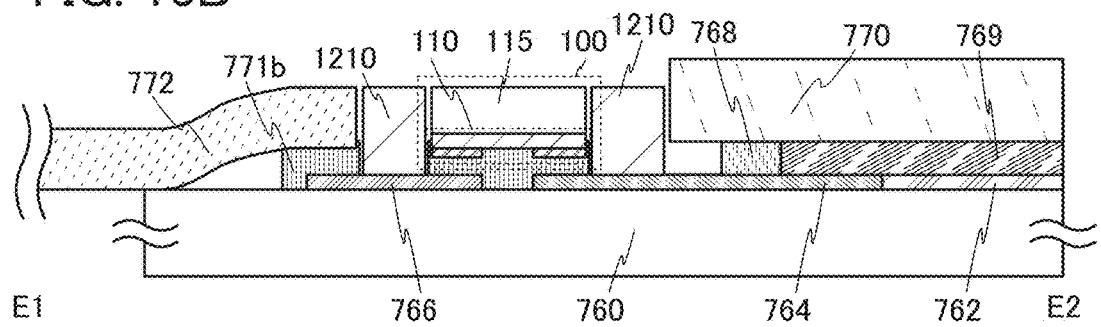
Figure 13C:
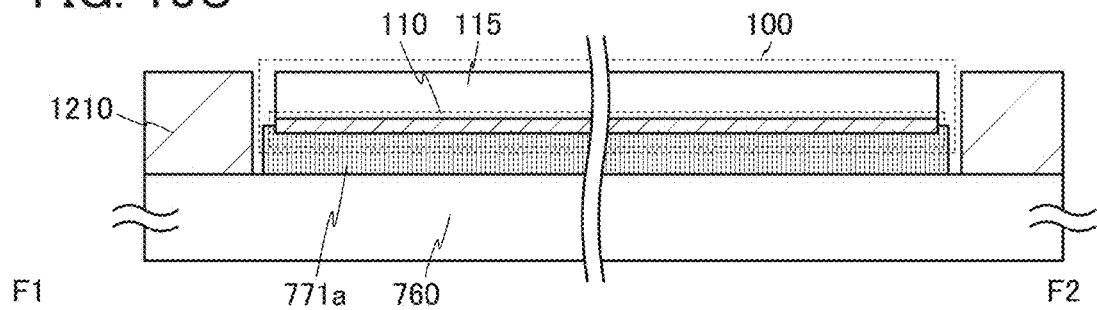

A display device 1250 illustrated in FIGS. 13A to 13C is different from the display devices in the above embodiments in that a protective substrate 1210 is provided on the periphery of the signal processing unit 100. Preferably, the surface of the protective substrate 1210 (also referred to as the side opposite to the side facing the substrate 760) is aligned or substantially aligned with the surface of the base substrate 115 (also referred to as a side where the circuit layer 110 is not formed), as illustrated in FIG. 13B.

As the protective substrate 1210, any of the flexible substrates that can be used for the first temporary fixing substrate 314 and the base substrate 115 can be used to be bonded to the substrate 760 using an adhesive material (e.g., an adhesive or an adhesive tape). When the substrate 760 is formed using a flexible substrate, the protective substrate 1210 is preferably formed using any of the materials that can be used for the base substrate 115.

In the case where the depressed portion 1010 is formed in the substrate 760 as in Embodiment 4, long time taken for the formation of the depressed portion 1010 or a reduction in the intensity of the substrate 760 is possible depending on the processing method. However, in the case where the protective substrate 1210 is provided in the peripheral portion of the signal processing unit 100 as in this embodiment, the protective substrate 1210 can be bonded to the substrate 760 in a short time.

The methods and structures described in this embodiment can be combined as appropriate with any of the methods and structures described in the other embodiments.

Embodiment 6

In this embodiment, a structure and a feature of a display device which is partly different from the display devices described in the above embodiments are described. Note that although a manufacturing method is basically similar to that in Embodiment 3, part of the method which is different from that in Embodiment 3 is as appropriate described.

<Structure Example and Feature of Display Device>

Figure 14A:
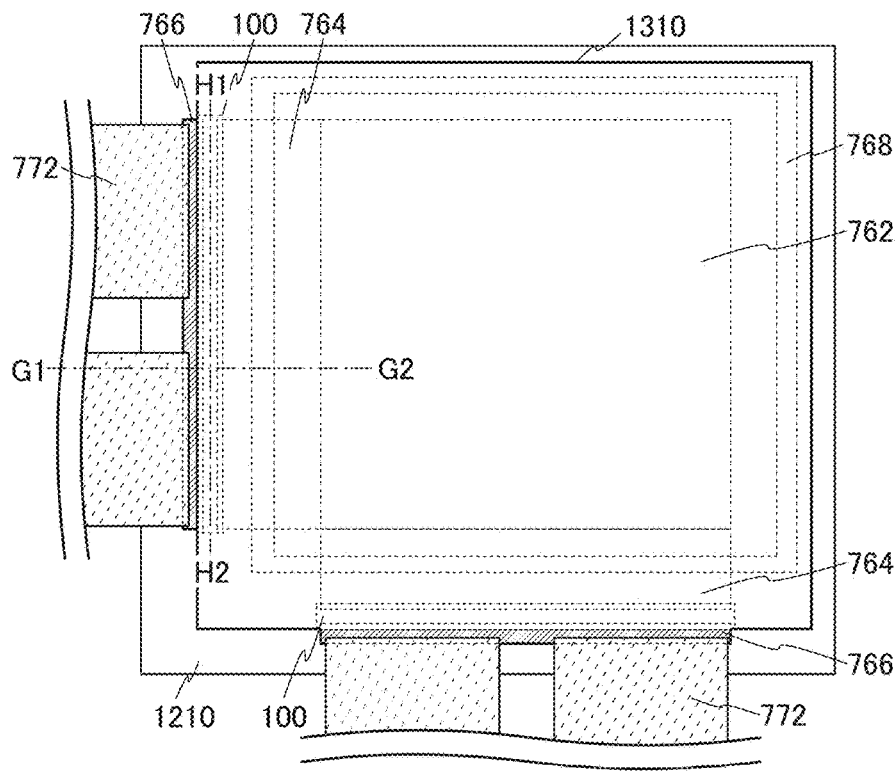
FIGS. 14A to 14C illustrate a method of manufacturing a display device.
Figure 14B:
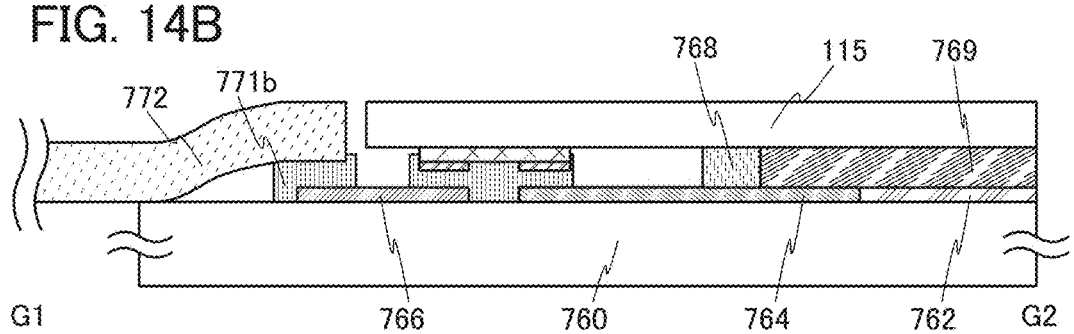
Figure 14C:
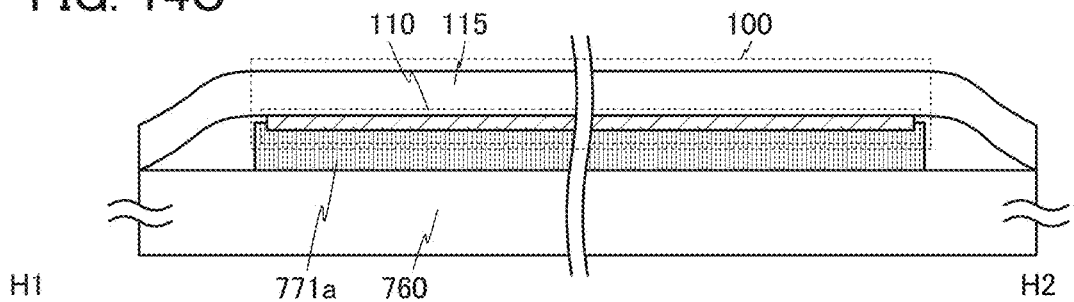

A structure of a display device which is different from those in the above embodiments is described using FIGS. 14A to 14C. FIG. 14A is a top view of the display device, FIG. 14B is a cross-sectional view taken along the alternate long and short dash line G1-G2 in FIG. 11A, and FIG. 14C is a cross-sectional view taken along the alternate long and short dash line H1-H2 in FIG. 14A.

A display device 1350 illustrated in FIGS. 14A to 14C is different from the display devices in the above embodiments in that the base substrate 115 used for the signal processing unit 100 also serves as the counter substrate 770.

Figure 15:
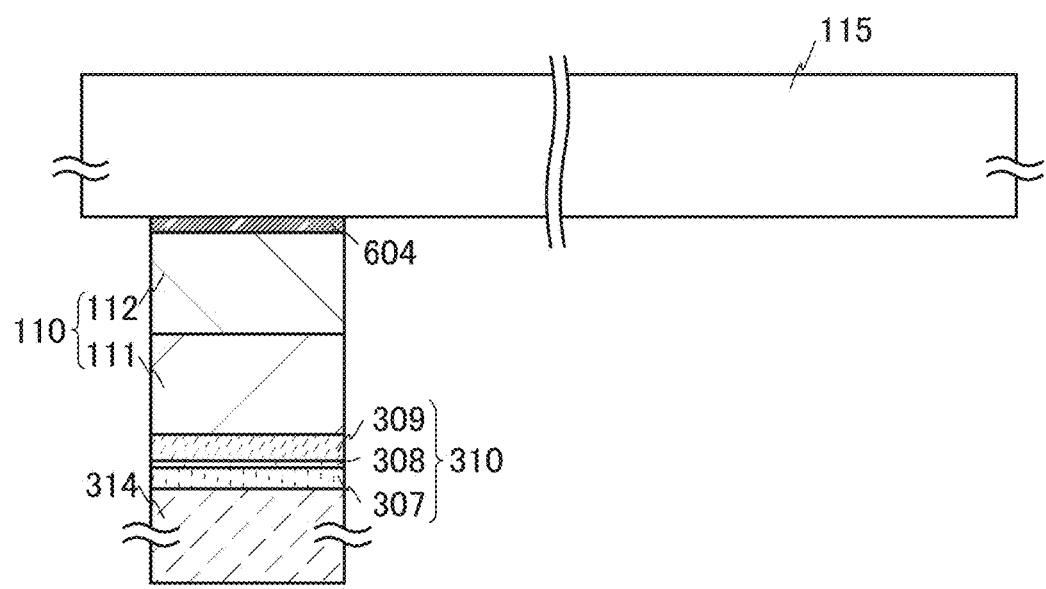
FIG. 15 illustrates a method of manufacturing a display device.

In order to allow the base substrate 115 to serve as the counter substrate 770, at the time of the bonding of the circuit layer 110 to the base substrate 115 described in Embodiment 1 referring to FIG. 8A, the base substrate 115 having a sufficiently larger area than the circuit layer 110 is bonded to the circuit layer 110 with the bond material 604 as illustrated in FIG. 15.

In this embodiment, the mounting of the signal processing unit 100 and the bonding of the counter substrate can be performed on the substrate 760 at the same time, so that the light-emitting device can be manufactured in a shorter time. Further, the height of the portion where the signal processing unit 100 is mounted can be the same or substantially the same as the height of the other portions (the periphery of the signal processing unit 100, the pixel portion 762, and the like), so that local application of a force to part of the display device 1350 or the conductive material 771, a reduction in display quality, concentration of an impact force, or the like can be suppressed.

Note that a depressed portion may be provided in part of the substrate 760 so that the signal processing unit 100 is mounted on the depressed portion, as described in Embodiment 4.

The methods and structures described in this embodiment can be combined as appropriate with any of the methods and structures described in the other embodiments.

Embodiment 7

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment will be described.

Figure 16A:
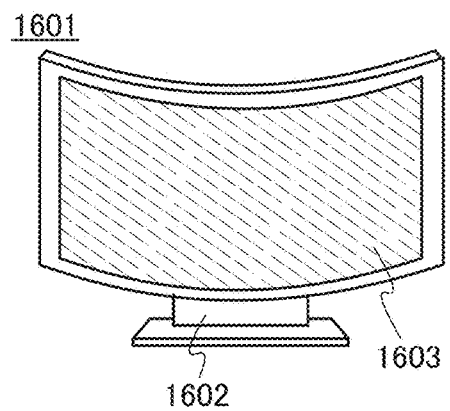
FIGS. 16A to 16F each illustrate a semiconductor device including a signal processing unit.

FIG. 16A illustrates a display. A display 1601 includes a supporting base 1602 and a display portion 1603. The display portion 1603 may be formed using a flexible substrate, which can realize a lightweight and thin display. Further, the display portion 1603 can be bent, and can be detached from the supporting base 1602 and the display can be mounted along a curved wall. A flexible display, which is one embodiment of the present invention, can be manufactured with the use of the semiconductor device described in the above embodiment for the display portion 1603. Thus, the flexible display can be provided on a curved portion as well as a flat surface; therefore, it can be used for various applications.

Figure 16B:
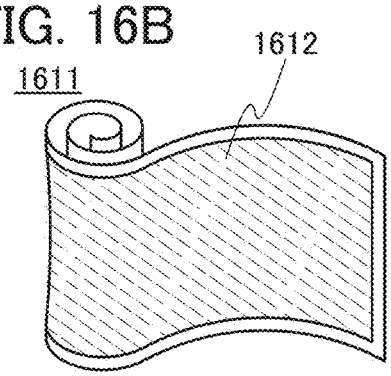

FIG. 16B illustrates a display capable of being wound. A display 1611 includes a display portion 1612. A thin and large-area display, which is one embodiment of the present invention, can be manufactured with the use of the semiconductor device described in the above embodiment for the display portion 1612. Since the display 1611 may be formed using a flexible substrate, the display 1611 can be carried by being bent or wound along with the display portion 1612 even in the case where the display 1611 is large.

Figure 16C:
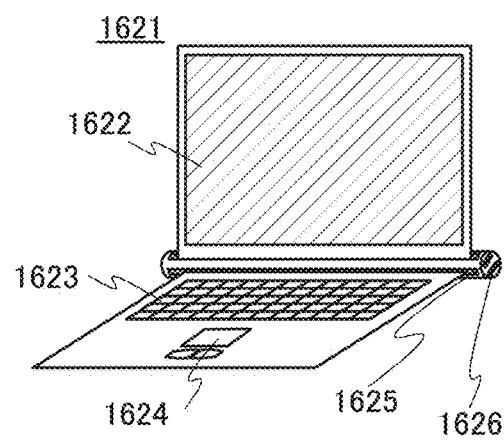

FIG. 16C illustrates a sheet-type computer. A computer 1621 includes a display portion 1622, a keyboard 1623, a touch pad 1624, an external connection port 1625, a power plug 1626, and the like. A thin or sheet-type computer can be manufactured, which is one embodiment of the present invention, with the use of the semiconductor device described in the above embodiment for the display portion 1622. The display portion 1622 may be formed using a flexible substrate, which can realize a lightweight and thin computer. Further, the display portion 1622 can be wound and stored in a main body when the main body of the computer 1621 is provided with a storage space. Furthermore, by also forming the keyboard 1623 to be flexible, the keyboard 1623 can be wound and stored in the storage space of the main body in a manner similar to that of the display portion 1622 when it is not used, which is convenient for carrying around.

Figure 16D:
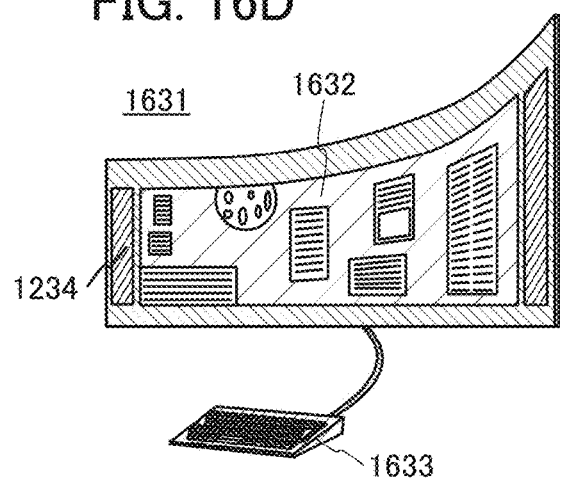

FIG. 16D illustrates a display device having a 20 to 100-inch large-sized display portion. A display device 1631 includes a keyboard 1633 which is an operation portion, a display portion 1632, a speaker 1634, and the like. Since the display portion 1632 may be formed using a flexible substrate, the display device 1631 can be carried by being bent or wound with the keyboard 1633 detached. Further, the keyboard 1633 and the display portion 1632 can be connected wirelessly. For example, the display device 1631 can be mounted along a curved wall and can be operated with the keyboard 1633 wirelessly.

In the example in FIG. 16D, the semiconductor device described in the above embodiment is used for the display portion 1632. Thus, a thin and large-area display device can be manufactured, which is one embodiment of the present invention.

Figure 16E:
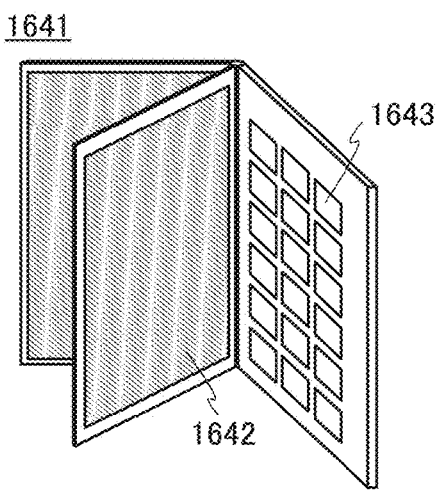

FIG. 16E shows an electronic book. An electronic book 1641 includes a display portion 1642, an operating key 1643, and the like. In addition, a modem may be incorporated in the electronic book 1641. The display portion 1642 may be formed using a flexible substrate and can be bent or wound. Therefore, the electronic book can also be carried without occupying a space. Further, the display portion 1642 can display a moving image as well as a still image such as a character.

In the example in FIG. 16E, the semiconductor device described in the above embodiment is used for the display portion 1642. Thus, a thin electronic book can be manufactured, which is one embodiment of the present invention.

Figure 16F:
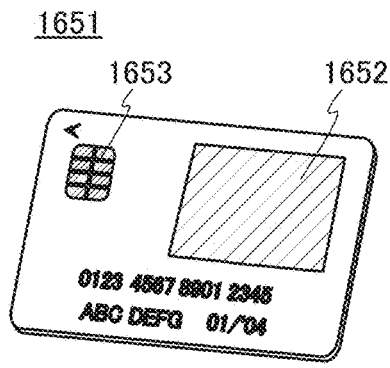

FIG. 16F illustrates an IC card. An IC card 1651 includes a display portion 1652, a connection terminal 1653, and the like. Since the display portion 1652 may be formed using a flexible substrate to have a lightweight and thin sheet-like shape, it can be attached onto a card surface. When the IC card can receive data without contact, information obtained from outside can be displayed on the display portion 1652.

In the example in FIG. 16F, the semiconductor device described in the above embodiment is used for the display portion 1652. Thus, a thin IC card can be manufactured, which is one embodiment of the present invention.

When a semiconductor device according to one embodiment of the present invention is used for an electronic device, even in the case where external force such as that caused in bending is applied to the electronic device, embrittlement of an element such as a transistor can be suppressed; thus, yield and reliability of the semiconductor device can be increased.

As described above, the application range of the present invention is so wide that the present invention can be applied to electronic devices and information displaying means in a wide variety of fields.

This embodiment can be combined with any of the other embodiments as appropriate.

This application is based on Japanese Patent Application serial No. 2012-074335 filed with the Japan Patent Office on Mar. 28, 2012, the entire contents of which are hereby incorporated by reference.

What is claimed is:

1. A semiconductor device comprising:
a first layer comprising a transistor including an oxide semiconductor layer;
a second layer over the first layer, the second layer comprising:
a first p-chnnel transistor including a first silicon semiconductor layer; and
a second p-channel transistor including a second silicon semiconductor layer;
a shift register circuit comprising the first p-channel transistor;
a switching circuit comprising the second p-channel transistor; and
a latch circuit comprising the transistor including the oxide semiconductor layer.

2. The semiconductor device according to claim 1, wherein the first silicon semiconductor layer is a single crystal silicon semiconductor layer.

3. The semiconductor device according to claim 1, wherein the transistor including the oxide semiconductor layer overlaps with the first p-channel transistor including the first silicon semiconductor layer.

4. The semiconductor device according to claim 1, wherein the latch circuit further comprises a capacitor, and
wherein one of electrodes of the capacitor is electrically connected to one of a source and a drain of the transistor including the oxide semiconductor layer.

5. The semiconductor device according to claim 1, wherein the second layer comprises an n-channel transistor including a silicon semiconductor layer.

6. A display device comprising the semiconductor device according to claim 3.

7. A display device comprising:
a substrate;
a pixel portion over the substrate, the pixel portion including a thin layer transistor and a pixel electrode;
a display element layer over the pixel portion;
a counter substrate over the display element layer; and
a signal processing unit electrically connected to the pixel portion,
wherein the signal processing unit comprises:
a first layer comprising a transistor including an oxide semiconductor layer;
a second layer over the first layer, the second layer comprising:
a first p-channel transistor including a first silicon semiconductor layer; and
a second p-channel transistor including a second silicon semiconductor layer;
a shift register circuit comprising the first p-channel transistor;
a switching circuit comprising the second p-channel transistor; and
a latch circuit comprising the transistor including the oxide semiconductor layer.

8. The display device according to claim 7, wherein the first silicon semiconductor layer is a single crystal silicon semiconductor layer.

9. The display device according to claim 7, wherein the transistor including the oxide semiconductor layer overlaps with the first p-channel transistor including the first silicon semiconductor layer.

10. The display device according to claim 7, wherein the latch circuit further comprises a capacitor, and
wherein one of electrodes of the capacitor is electrically connected to one of a source and a drain of the transistor including the oxide semiconductor layer.

11. The display device according to claim 7, wherein the second layer comprises an n-channel transistor including a silicon semiconductor layer.

12. A semiconductor device comprising:
a first layer comprising a circuit including a p-channel transistor including a silicon semiconductor layer; and
a second layer over the first layer, the second layer comprising a latch circuit including a first transistor including an oxide semiconductor layer.

13. The semiconductor device according to claim 12, wherein the latch circuit further comprises a second transistor,
wherein one of a source and a drain of the first transistor is electrically connected to one of a source and a drain of the second transistor.

14. The semiconductor device according to claim 12, wherein the latch circuit further comprises a first capacitor,
wherein one of a source and a drain of the first transistor is electrically connected to one of electrodes of the first capacitor.

15. The semiconductor device according to claim 13, wherein the latch circuit further comprises a first capacitor,
wherein the one of the source and the drain of the first transistor is electrically connected to one of electrodes of the first capacitor.

16. The semiconductor device according to claim 15, wherein the latch circuit further comprises a second capacitor,
wherein the other of the source and the drain of the second transistor is electrically connected to one of electrodes of the second capacitor.

17. The semiconductor device according to claim 12, wherein the first layer comprises an n-channel transistor including a silicon semiconductor layer.

18. A display device comprising the semiconductor device according to claim 12.

* * * * *

UNITED STATES PATENT AND TRADEMARK OFFICE
CERTIFICATE OF CORRECTION

PATENT NO. : 9,812,217 B2
APPLICATION NO. : 15/091762
DATED : November 7, 2017
INVENTOR(S) : Shunpei Yamazaki et al.

Page 1 of 1

It is certified that error appears in the above-identified patent and that said Letters Patent is hereby corrected as shown below:

In the Claims

Column 47, Line 17, Claim 1, "p chnnel" should read --p-channel--

Column 47, Line 45, Claim 6, "claim 3." should read --claim 1.--

Signed and Sealed this
Nineteenth Day of June, 2018

Andrei Iancu
*Director of the United States Patent and Trademark Office*